United States Patent
Hatakeyama et al.

(10) Patent No.: US 12,510,824 B2
(45) Date of Patent: Dec. 30, 2025

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

(71) Applicant: FUJIFILM Corporation, Tokyo (JP)

(72) Inventors: Naoya Hatakeyama, Haibara-gun (JP); Yasunori Yonekuta, Haibara-gun (JP); Takamitsu Tomiga, Haibara-gun (JP); Kohei Higashi, Haibara-gun (JP); Fumihiro Yoshino, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 687 days.

(21) Appl. No.: 17/581,177

(22) Filed: Jan. 21, 2022

(65) Prior Publication Data

US 2022/0146937 A1   May 12, 2022

Related U.S. Application Data

(63) Continuation of application No. PCT/JP2020/030653, filed on Aug. 12, 2020.

(30) Foreign Application Priority Data

Aug. 29, 2019 (JP) .................... 2019-157420
Dec. 26, 2019 (JP) .................... 2019-237512

(51) Int. Cl.
G03F 7/039   (2006.01)
G03F 7/004   (2006.01)
G03F 7/038   (2006.01)

(52) U.S. Cl.
CPC .......... *G03F 7/0392* (2013.01); *G03F 7/0045* (2013.01); *G03F 7/0382* (2013.01)

(58) Field of Classification Search
CPC .................................................. G03F 7/0045
See application file for complete search history.

(56) References Cited

U.S. PATENT DOCUMENTS

| | | | |
|---|---|---|---|
| 7,977,027 B2 | 7/2011 | Takeda et al. | |
| 8,389,201 B2* | 3/2013 | Tanaka | G03F 7/0395 430/311 |
| 8,592,133 B2* | 11/2013 | Watanabe | G03F 7/0045 430/311 |
| 2008/0096128 A1* | 4/2008 | Takeda | G03F 7/0392 430/296 |
| 2010/0291484 A1* | 11/2010 | Tanaka | G03F 7/0045 430/287.1 |
| 2011/0171579 A1* | 7/2011 | Domon | G03F 7/0045 430/285.1 |
| 2013/0209922 A1* | 8/2013 | Masunaga | G03F 7/0382 430/5 |
| 2015/0048051 A1 | 2/2015 | Katsura et al. | |
| 2018/0267404 A1* | 9/2018 | Kaneko | C09D 125/18 |

FOREIGN PATENT DOCUMENTS

| | | |
|---|---|---|
| EP | 2146245 A2 | 1/2010 |
| EP | 2270596 A2 | 1/2011 |
| JP | 2008-102383 A | 5/2008 |
| JP | 2015-057638 A | 3/2015 |
| KR | 10-2008-0035985 A | 4/2008 |
| KR | 10-2010-0007794 A | 1/2010 |
| KR | 10-2011-0002442 A | 1/2011 |
| TW | 1375862 B | 11/2012 |
| TW | 1467331 B | 1/2015 |
| WO | 2016/163187 A1 | 10/2016 |
| WO | WO-2017115629 A1 * | 7/2017 ............ C08F 12/22 |

OTHER PUBLICATIONS

International Preliminary Report on Patentability dated Mar. 1, 2022 in International Application No. PCT/JP2020/030653.
Written Opinion of the International Searching Authority dated Oct. 13, 2020 in International Application No. PCT/JP2020/030653.
International Search Report dated Oct. 13, 2020 in International Application No. PCT/JP2020/030653.
Extended European Search Report dated Sep. 12, 2022 in Application No. 20857315.4.
Office Action issued on May 2, 2024 by the Taiwanese Patent Office in corresponding TW Patent Application No. 109125995.
Office Action issued on Dec. 8, 2023 by the Korean Patent Office in corresponding KR Patent Application No. 10-2022-7004697.
Communication issued on Apr. 15, 2024 by the China National Intellectual Property Administration for Chinese Patent Application No. 202080054129.4.
Office Action issued on May 16, 2024 by the Israel Patent Office in corresponding Israeli Patent Application No. 290560.
Office Action issued Feb. 5, 2025 by the Taiwanese Patent Office in Taiwanese Patent Application No. 109125995.

* cited by examiner

*Primary Examiner* — Mark F. Huff
*Assistant Examiner* — Anna Malloy
(74) *Attorney, Agent, or Firm* — Sughrue Mion, PLLC

(57) ABSTRACT

An actinic ray-sensitive or radiation-sensitive resin composition contains (A) a resin having a polarity that increases by an action of an acid, (B) a photoacid generator, (P) an amine oxide, and (D) an acid diffusion control agent provided that acid diffusion control agents corresponding to the amine oxide are excluded, in which a content of the amine oxide (P) is from 0.01 ppm to 1,000 ppm with respect to a total mass of the actinic ray-sensitive or radiation-sensitive resin composition, and a mass ratio of the acid diffusion control agent (D) to the amine oxide (P) is more than 1 and 10,000 or less.

9 Claims, No Drawings

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2020/030653 filed on Aug. 12, 2020, which claims priority under 35 U.S.C § 119(a) to Japanese Patent Application No. 2019-157420 filed on Aug. 29, 2019, and Japanese Patent Application No. 2019-237512 filed on Dec. 26, 2019. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, an actinic ray-sensitive or radiation-sensitive film, a pattern forming method, and a method for manufacturing an electronic device.

2. Description of the Related Art

Since the advent of a resist for a KrF excimer laser (248 nm), a pattern forming method utilizing chemical amplification has been used in order to compensate for sensitivity reduction due to light absorption. For example, in a positive-tone chemical amplification method, first, a photoacid generator included in the exposed area decomposes upon irradiation with light to generate an acid. Then, in a post-exposure bake (PEB) process and the like, an alkali-insoluble group included in a photosensitive composition is changed into an alkali-soluble group by the catalytic action of an acid thus generated. Thereafter, development is performed using, for example, an alkali solution. As a result, the exposed area is removed to obtain a desired pattern.

In the method, as an alkali developer, various types of alkali developers have been proposed. For example, as the alkali developer, a 2.38%-by-mass aqueous alkali developer of tetramethylammonium hydroxide (aqueous TMAH solution) has been generally used.

Miniaturization of a semiconductor device has lead to a progress in shortening the wavelength of an exposure light source and increasing the numerical aperture (higher NA) of a projection lens, and an exposure machine using an ArF excimer laser having a wavelength of 193 nm as the light source is currently developed. Examples of a technique to further increase the resolving power include a method in which a space between a projection lens and a sample is filled with a high-refractive-index liquid (hereinafter sometimes referred to as an "immersion liquid") (that is, a liquid immersion method).

As a resist composition in the related art, various types of resist compositions are known, and for example, a resist material containing one kind or two or more kinds of compounds having an amine oxide structure as a basic component is described in JP2008-102383A.

In addition, a photoresist composition containing a polymer having a structural unit including an acid-dissociative group that is dissociated by the action of an acid, a radiation-sensitive acid generator, and a solvent is described in JP2015-57638A.

SUMMARY OF THE INVENTION

Development of a three-dimensional structure device that aims to increase the capacity of a memory by laminating cells is in progress. Along with an increase in the number of the laminated cells, it is necessary to form a resist film having a higher film thickness than those in the related art, form a resist pattern, and perform processing such as etching.

Along with an increase in the film thickness of a resist, the peeling of the resist film from a substrate in a processing process was more apparent. In addition, along with an increase in the film thickness, there occurred a problem in that an influence of the absorbance of a resist film on an exposure wavelength was more remarkable, leading to easy reduction in the sensitivity.

By the way, a resist film formed on a substrate (a resist pattern formed by exposure and development is also included herein) is often placed in a dry state (for example, a step in a vacuum state) in steps up to formation of the resist pattern and the subsequent steps. Further, the present inventors have recently conducted studies, and as a result, they have found that the adhesiveness between a resist film and a substrate may be reduced by performing various steps before and after forming a resist pattern, and this phenomenon remarkably occurs, in particular, in a case where the resist film is placed in a dry state. In view of such the phenomenon related to the adhesiveness between the resist film and the substrate, it is conceivable, for example, to change the composition of the resist composition to a composition that can improve the initial adhesiveness, but it was not easy to improve the adhesiveness between the resist film and the substrate while not impairing basic performance such as sensitivity.

Therefore, an object of the present invention is to provide an actinic ray-sensitive or radiation-sensitive resin composition capable of forming an actinic ray-sensitive or radiation-sensitive film having an excellent adhesiveness (in particular, adhesiveness in a dry state) to a substrate while suppressing a sensitivity reduction.

Another object of the present invention is to provide an actinic ray-sensitive or radiation-sensitive film, a pattern forming method, and a method for manufacturing an electronic device, each using the actinic ray-sensitive or radiation-sensitive resin composition.

Units for accomplishing the objects include the following aspects.

[1] An actinic ray-sensitive or radiation-sensitive resin composition comprising:
(A) a resin having a polarity that increases by an action of an acid;
(B) a photoacid generator;
(P) an amine oxide; and
(D) an acid diffusion control agent provided that acid diffusion control agents corresponding to the amine oxide are excluded,
in which a content of the amine oxide (P) is from 0.01 ppm to 1,000 ppm with respect to a total mass of the actinic ray-sensitive or radiation-sensitive resin composition, and
a mass ratio of the acid diffusion control agent (D) to the amine oxide (P), represented by the following expression, is more than 1 and 10,000 or less, Mass ratio=(Content of acid diffusion control agent ($D$))/(Content of amine oxide($P$)).

[2] The actinic ray-sensitive or radiation-sensitive resin composition as described in [1],
   in which the amine oxide (P) is a compound represented by General Formula (1).

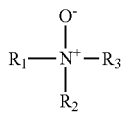

(In the formula, $R_1$, $R_2$, and $R_3$ are each independently a hydrogen atom, an alkyl group, a cycloalkyl group, an aryl group, an alkenyl group, or an aralkyl group. In addition, any two of $R_1$, $R_2$, or $R_3$ may be bonded to each other to form a ring structure.)

[3] The actinic ray-sensitive or radiation-sensitive resin composition as described in [1],
   in which the amine oxide is a compound represented by General Formula (2).

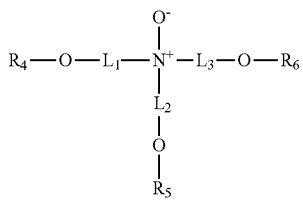

(In the formula, $R_4$, $R_5$, and $R_6$ are each independently a hydrogen atom, an alkyl group, a cycloalkyl group, an aryl group, an alkenyl group, or an aralkyl group. $L_1$, $L_2$, and $L_3$ each independently represent a divalent linking group.)

[4] The actinic ray-sensitive or radiation-sensitive resin composition as described in [1],
   in which the amine oxide is a compound represented by General Formula (3).

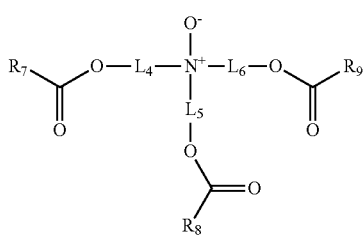

(In the formula, $R_7$, $R_8$, and $R_9$ are each independently a hydrogen atom, an alkyl group, a cycloalkyl group, an aryl group, an alkenyl group, or an aralkyl group. $L_4$, $L_5$, and $L_6$ each independently represent a divalent linking group.)

[5] The actinic ray-sensitive or radiation-sensitive resin composition as described in [1],
   in which the amine oxide is a compound represented by General Formula (4).

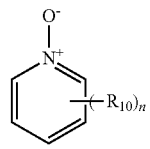

(In the formula, $R_{10}$ is a hydrogen atom, an alkyl group, a cycloalkyl group, an aryl group, an alkenyl group, or a carboxyl group. n represents an integer of 0 to 5. In a case where n represents an integer of 2 or more, a plurality of $R_{10}$'s may be the same as or different from each other.)

[6] The actinic ray-sensitive or radiation-sensitive resin composition as described in [1],
   in which the amine oxide is a compound represented by General Formula (5).

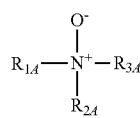

(In the formula, $R_{1A}$, $R_{2A}$, and $R_{3A}$ are each independently an organic group having a heteroatom at a terminal or chain and having 6 or less carbon atoms. In addition, any two of $R_{1A}$, $R_{2A}$, or $R_{3A}$ may be bonded to each other to form a ring structure.)

[7] The actinic ray-sensitive or radiation-sensitive resin composition as described in [1],
   in which the amine oxide is a compound represented by General Formula (6).

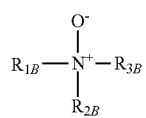

(In the formula, $R_{1B}$, $R_{2B}$, and $R_{3B}$ are each independently an organic group provided that an unsubstituted alkyl group having 6 or more carbon atoms is excluded, and any two of $R_{1B}$, $R_{2B}$, or $R_{3B}$ may be bonded to each other to form a ring structure).

[8] The actinic ray-sensitive or radiation-sensitive resin composition as described in any one of [1] to [7],
   in which the content of the amine oxide is from 0.01 ppm to 100 ppm with respect to the total mass of the actinic ray-sensitive or radiation-sensitive resin composition.

[9] The actinic ray-sensitive or radiation-sensitive resin composition as described in any one of [1] to [8],
   in which the content of the amine oxide is from 0.01 ppm to 10 ppm with respect to the total mass of the actinic ray-sensitive or radiation-sensitive resin composition.

[10] The actinic ray-sensitive or radiation-sensitive resin composition as described in any one of [1] to [9],
   in which a concentration of solid contents of the composition is 10% by mass or more.

[11] The actinic ray-sensitive or radiation-sensitive resin composition as described in any one of [1] to [10],
   in which the acid diffusion control agent (D) is an amine compound, and the amine oxide (P) is an amine oxide obtained by oxidization of a nitrogen atom in an amine moiety of the acid diffusion control agent (D).

[12] The actinic ray-sensitive or radiation-sensitive resin composition as described in any one of [1] to [11], further comprising (H) a surfactant.

[13] An actinic ray-sensitive or radiation-sensitive film formed from the actinic ray-sensitive or radiation-sensitive resin composition as described in any one of [1] to [12].

[14] A pattern forming method comprising:
a step of exposing the actinic ray-sensitive or radiation-sensitive film as described in [13]; and
a step of developing the exposed actinic ray-sensitive or radiation-sensitive film, using a developer.

[15] A method for manufacturing an electronic device, comprising the pattern forming method as described in [14].

According to the embodiment of the present invention, it is possible to provide an actinic ray-sensitive or radiation-sensitive resin composition capable of forming an actinic ray-sensitive or radiation-sensitive film having an excellent adhesiveness (in particular, adhesiveness in a dry state) to a substrate while suppressing a sensitivity reduction.

According to the embodiment of the present invention, it is also possible to provide an actinic ray-sensitive or radiation-sensitive film, a pattern forming method, and a method for manufacturing an electronic device, each using the actinic ray-sensitive or radiation-sensitive resin composition.

DESCRIPTION OF THE PREFERRED EMBODIMENTS

Hereinafter, the contents of the present invention will be described in detail.

Description of configuration requirements described below may be made on the basis of representative embodiments of the present invention in some cases, but the present invention is not limited to such embodiments.

In notations for a group (atomic group) in the present specification, in a case where the group is notated without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Moreover, the types of substituents, the positions of the substituents, and the number of the substituents in a case of referring to an expression of "which may have a substituent" in the present specification are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; and a combination thereof.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation unless otherwise specified.

Unless otherwise specified, "exposure" in the present specification encompasses not only exposure by a bright line spectrum of a mercury lamp, far ultraviolet rays typified by an excimer laser, extreme ultraviolet rays (EUV rays), X-rays, or the like, but also exposure by particle beams such as electron beams and ion beams.

In the present specification, a numerical range expressed using "to" is used in a definition of a range that includes the preceding and succeeding numerical values of "to" as the lower limit value and the upper limit value, respectively.

In the present specification, (meth)acrylate represents acrylate and methacrylate, and (meth)acryl represents acryl and methacryl.

In the present specification, the weight-average molecular weight (Mw), the number-average molecular weight (Mn), and the dispersity (also referred to as a molecular weight distribution) (Mw/Mn) of resin components are each defined as a value converted in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In the present specification, in a case where a plurality of substances corresponding to each component are present in a composition, the amount of each component in the composition is a total amount of the plurality of the corresponding substances which are present in the composition unless otherwise specified.

In the present specification, a "step" includes not only an independent step but also even a step which is not clearly distinguished from other steps as long as an intended purpose of the step is accomplished.

In the present specification, a "total solid content" refers to the total mass of components excluding a solvent from the total composition of a composition. In addition, a "solid content" is a component excluding the solvent as mentioned above, and may be either a solid or a liquid at 25° C., for example.

In the present specification, "% by mass" and "% by weight" have the same definition, and "part by mass" and "part by weight" also have the same definition.

In addition, in the present specification, a combination of two or more preferred aspects is a more preferable aspect.

(Actinic Ray-Sensitive or Radiation-Sensitive Resin Composition)

The actinic ray-sensitive or radiation-sensitive resin composition according to an embodiment of the present invention (hereinafter also simply referred to as a "composition") includes:
(A) a resin having a polarity that increases by an action of an acid,
(B) a photoacid generator,
(P) an amine oxide, and
(D) an acid diffusion control agent provided that acid diffusion control agents corresponding to the amine oxide are excluded,
in which a content of the amine oxide (P) is from 0.01 ppm to 1,000 ppm with respect to a total mass of the actinic ray-sensitive or radiation-sensitive resin composition, and
a mass ratio of the acid diffusion control agent (D) to the amine oxide (P), represented by the following formula, is more than 1 and 10,000 or less.

Mass ratio=(Content of acid diffusion control agent (D))/(Content of amine oxide(P))

By adopting the configuration, the present invention can achieve an excellent adhesiveness (in particular, an adhesiveness in a dry state) to a substrate while suppressing a sensitivity reduction.

A reason therefor is not clear, but is presumed as follows.

First, the present inventors have found that an excellent adhesiveness to a substrate is obtained by incorporating the amine oxide into the actinic ray-sensitive or radiation-sensitive resin composition at a content of 0.01 ppm or more with respect to the total mass of the actinic ray-sensitive or radiation-sensitive resin composition, in particular, in a dry state as described above. Although an exact reason therefor is not clear, it is presumed to be as follows: the amine oxide included in the composition interacts with a highly polar group (for example, an ester group) in a resin which can be included in the actinic ray-sensitive or radiation-sensitive resin composition, and a highly polar group (for example, a hydroxyl group) which can be included in the substrate, and thus, the adhesiveness between the actinic ray-sensitive or radiation-sensitive film and the substrate is improved.

Furthermore, it is considered that by incorporating the amine oxide at a content of 1,000 ppm or less with respect to the total mass of the actinic ray-sensitive or radiation-sensitive resin composition, the light transmission of the actinic ray-sensitive or radiation-sensitive film upon exposure is sufficiently secured, and as a result, the sensitivity reduction was suppressed.

In addition, it is considered that by incorporating an acid diffusion control agent provided that acid diffusion control agents corresponding to the amine oxide are excluded into the actinic ray-sensitive or radiation-sensitive resin composition, the excessive diffusion of an acid generated in the unexposed area of the actinic ray-sensitive or radiation-sensitive film into the unexposed area can be suppressed. It is considered that the above effect makes it possible to suppress the sensitivity reduction, and thus, to more reliably form a resist pattern having a desired shape.

Furthermore, it is presumed that by setting a mass ratio of the acid diffusion control agent provided that acid diffusion control agents corresponding to the amine oxide are excluded to the amine oxide (specifically (Acid diffusion control agent provided that acid diffusion control agents corresponding to the amine oxide are excluded)/(Content of amine oxide)) to more than 1 and 10,000 or less, it is possible to achieve a good balance between expression of the adhesiveness between the actinic ray-sensitive or radiation-sensitive film and the substrate by the amine oxide and the suppression of the sensitivity reduction, and thus, the sensitivity reduction is suppressed and the adhesiveness between the actinic ray-sensitive or radiation-sensitive film and the substrate is improved.

The actinic ray-sensitive or radiation-sensitive resin composition according to the embodiment of the present invention is preferably a so-called resist composition, and may be either a positive-tone resist composition or a negative-tone resist composition. In addition, the composition may be either a resist composition for alkali development or a resist composition for organic solvent development.

It is preferable that the composition of the embodiment of the present invention is typically a chemically amplified resist composition.

Hereinafter, details of each component included in the actinic ray-sensitive or radiation-sensitive resin composition (also simply referred to as a "composition") according to the embodiment of the present invention will be described.

<Amine Oxide (P)>

The composition of the embodiment of the present invention contains an amine oxide (hereinafter also referred to as an "amine oxide (P)").

The amine oxide (P) is not particularly limited, but is a compound having a structure represented by $N^+$—$O^-$. The structure represented by $N^+$—$O^-$ has the same definition as a structure represented by N→O.

The amine oxide (P) is preferably a compound represented by General Formula (1).

(1)

In the formula, $R_1$, $R_2$, and $R_3$ are each independently a hydrogen atom, an alkyl group, a cycloalkyl group, an aryl group, an alkenyl group, or an aralkyl group.

In addition, any two of $R_1$, $R_2$, or $R_3$ may be bonded to each other to form a ring structure.

The alkyl group is not particularly limited, but may be linear or branched, and preferred examples thereof include an alkyl group having 1 to 20 carbon atoms.

The alkyl group may have a substituent.

The alkyl group having a substituent is not particularly limited, but examples thereof include a hydroxyalkyl group (preferably having 2 to 10 carbon atoms), an alkoxyalkyl group (preferably having 2 to 10 carbon atoms), a cycloalkyloxyalkyl group (preferably having 4 to 10 carbon atoms), an acyloxyalkyl group (preferably having 2 to 10 carbon atoms), an alkylthioalkyl group (preferably having 2 to 10 carbon atoms), a cycloalkylthioalkyl group (preferably 4 to 10 carbon atoms), and a cyanoalkyl group (preferably having 2 to 10 carbon atoms).

Specific examples of the hydroxyalkyl group include a hydroxymethyl group, a hydroxyethyl group, and a hydroxypropyl group.

Specific examples of the alkoxyalkyl group include a methoxymethyl group, an ethoxymethyl group, a propoxymethyl group, an isopropoxymethyl group, a butoxymethyl group, an isobutoxymethyl group, a t-butoxymethyl group, a t-amyloxymethyl group, and a methoxyethyl group.

Specific examples of the cycloalkyloxyalkyl group include a cyclohexyloxymethyl group and a cyclopentyloxymethyl group.

Specific examples of the acyloxyalkyl group include a formyloxymethyl group, an acetoxymethyl group, a propionyloxymethyl group, a butyryloxymethyl group, a pivaloyloxymethyl group, a cyclohexanecarbonyloxymethyl group, a decanoyloxymethyl group, and an undecanoyloxyethyl group.

Specific examples of the alkylthioalkyl group include a methylthiomethyl group, an ethylthiomethyl group, a propylthiomethyl group, an isopropylthiomethyl group, a butylthiomethyl group, an isobutylthiomethyl group, a t-butylthiomethyl group, a t-amylthiomethyl group, and a decylthiomethyl group.

Specific examples of the cycloalkylthioalkyl group include a cyclohexylthiomethyl group.

The cycloalkyl group may be a monocycle or a polycycle, and is not particularly limited, but is preferably a cycloalkyl group having 3 to 20 carbon atoms. Specific examples of the cycloalkyl group include a cyclopentyl group, a cyclohexyl group, and a decahydronaphthalenyl group.

The cycloalkyl group may have a substituent. The substituent is not particularly limited, and examples thereof include the above-mentioned substituent T.

The aryl group is not particularly limited, but is preferably an aryl group having 6 to 20 carbon atoms, and specific examples thereof include a phenyl group, a naphthyl group, an anthryl group, a phenanthryl group, a pyrenyl group, a naphthacenyl group, and a fluorenyl group.

The aryl group may have a substituent. The substituent is not particularly limited, and examples thereof include the above-mentioned substituent T.

The alkenyl group is not particularly limited, but is preferably an alkenyl group having 2 to 20 carbon atoms, and specific examples thereof include a vinyl group, an allyl group, a butenyl group, and a pentenyl group.

The alkenyl group may have a substituent. The substituent is not particularly limited, and examples thereof include the above-mentioned substituent T.

The aralkyl group is not particularly limited, but is preferably an aralkyl group having 7 to 20 carbon atoms, and specific examples thereof include a benzyl group, a phenethyl group, a phenylpropyl group, a naphthylmethyl group, a naphthylethyl group, and an anthracenylmethyl group.

The aralkyl group may have a substituent. The substituent is not particularly limited, and examples thereof include the above-mentioned substituent T.

In addition, any two of $R_1$, $R_2$, or $R_3$ may be bonded to each other to form a ring structure, and the ring structure thus formed may include a heteroatom such as an oxygen atom as a ring member.

In addition, the amine oxide (P) is preferably a compound represented by General Formula (2).

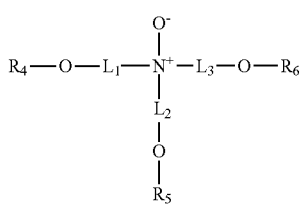

(2)

In the formula, $R_4$, $R_5$, and $R_6$ are each independently a hydrogen atom, an alkyl group, a cycloalkyl group, an aryl group, an alkenyl group, or an aralkyl group. $L_1$, $L_2$, and $L_3$ each independently represent a divalent linking group.

The alkyl group as $R_4$, $R_5$, or $R_6$ is the same as the alkyl group described above as $R_1$, $R_2$, or $R_3$.

The cycloalkyl group as $R_4$, $R_5$, or $R_6$ is the same as the cycloalkyl group described above as $R_1$, $R_2$, or $R_3$.

The aryl group as $R_4$, $R_5$, or $R_6$ is the same as the aryl group described above as $R_1$, $R_2$, or $R_3$.

The alkenyl group as $R_4$, $R_5$, or $R_6$ is the same as the alkenyl group described above as $R_1$, $R_2$, or $R_3$.

The aralkyl group as $R_4$, $R_5$, or $R_6$ is the same as the aralkyl group described above as $R_1$, $R_2$, or $R_3$.

The divalent linking group as $L_1$, $L_2$, or $L_3$ is not particularly limited, but is preferably an alkylene group (preferably having 1 to 10 carbon atoms).

$L_1$, $L_2$, or $L_3$ may further have a substituent.

In addition, the amine oxide (P) is preferably a compound represented by General Formula (3).

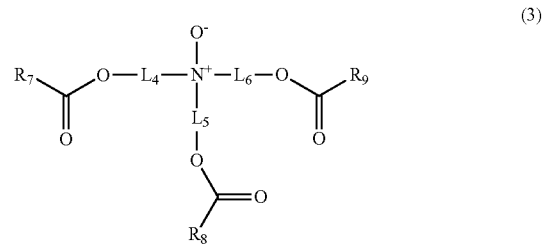

(3)

In the formula, $R_7$, $R_8$, and $R_9$ are each independently a hydrogen atom, an alkyl group, a cycloalkyl group, an aryl group, an alkenyl group, or an aralkyl group. $L_4$, $L_5$, and $L_6$ each independently represent a divalent linking group.

The alkyl group as $R_7$, $R_8$, or $R_9$ is the same as the alkyl group described above as $R_1$, $R_2$, or $R_3$.

The cycloalkyl group as $R_7$, $R_8$, or $R_9$ is the same as the cycloalkyl group described above as $R_1$, $R_2$, or $R_3$.

The aryl group as $R_7$, $R_8$, or $R_9$ is the same as the aryl group described above as $R_1$, $R_2$, or $R_3$.

The alkenyl group as $R_7$, $R_8$, or $R_9$ is the same as the alkenyl group described above as $R_1$, $R_2$, or $R_3$.

The aralkyl group as $R_7$, $R_8$, or $R_9$ is the same as the aralkyl group described above as $R_1$, $R_2$, or $R_3$.

The divalent linking group as $L_4$, $L_5$, or $L_6$ is not particularly limited, but is preferably an alkylene group (preferably having 1 to 10 carbon atoms).

$L_4$, $L_5$, or $L_6$ may further have a substituent.

In addition, the amine oxide (P) is preferably a compound represented by General Formula (4).

(4)

In the formula, $R_{10}$ is a hydrogen atom, an alkyl group, a cycloalkyl group, an aryl group, an alkenyl group, or a carboxyl group. n represents an integer of 0 to 5. In a case where n represents an integer of 2 or more, a plurality of $R_{10}$'s may be the same as or different from each other.

The alkyl group as $R_{10}$ is the same as the alkyl group described above as $R_1$, $R_2$, or $R_3$.

The cycloalkyl group as $R_{10}$ is the same as the cycloalkyl group described above as $R_1$, $R_2$, or $R_3$.

The aryl group as $R_{10}$ is the same as the aryl group described above as $R_1$, $R_2$, or $R_3$.

The alkenyl group as $R_{10}$ is the same as the alkenyl group described above as $R_1$, $R_2$, or $R_3$.

$R_{10}$ is preferably a hydrogen atom, an alkyl group, or a carboxyl group. n is preferably 0 to 4, and more preferably 0 to 2.

In addition, the amine oxide (P) is preferably a compound represented by General Formula (5).

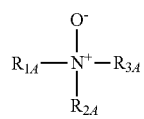

(5)

In the formula, $R_{1A}$, $R_{2A}$, and $R_{3A}$ are each independently an organic group having a heteroatom at a terminal or chain and having 6 or less carbon atoms. In addition, any two of $R_{1A}$, $R_{2A}$, or $R_{3A}$ may be bonded to each other to form a ring structure.

The organic group is not particularly limited, and examples thereof include an alkyl group, a cycloalkyl group, and an alkenyl group.

The alkyl group is not particularly limited, but may be linear or branched, and preferred examples thereof include an alkyl group having 1 to 6 carbon atoms.

The alkyl group may have a substituent, but has 6 or less carbon atoms as an organic group.

The cycloalkyl group is a monocycle and is not particularly limited, but is preferably a cycloalkyl group having 3 to 6 carbon atoms. Specific examples of the cycloalkyl group include a cyclopentyl group and a cyclohexyl group.

The cycloalkyl group may have a substituent, but has 6 or less carbon atoms as an organic group.

The alkenyl group is not particularly limited, but is preferably an alkenyl group having 2 to 6 carbon atoms, and specific examples thereof include a vinyl group and an allyl group.

The alkenyl group may have a substituent, but has 6 or less carbon atoms as an organic group.

In addition, any two of $R_{1A}$, $R_{2A}$, or $R_{3A}$ may be bonded to each other to form a ring structure, and the ring structure thus formed may include a heteroatom such as an oxygen atom as a ring member.

In addition, the amine oxide (P) is preferably a compound represented by General Formula (6).

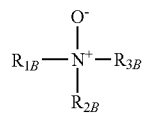

(6)

In the formula, $R_{1B}$, $R_{2B}$, and $R_{3B}$ each independently represent an organic group provided that an unsubstituted alkyl group having 6 or more carbon atoms is excluded. In addition, any two of $R_{1B}$, $R_{2B}$, or $R_{3B}$ may be bonded to each other to form a ring structure.

The organic group is not particularly limited, but examples thereof include an alkyl group, a cycloalkyl group, an aryl group, an alkenyl group, or an aralkyl group.

The alkyl group is not particularly limited, but may be linear or branched, and preferred examples thereof include an alkyl group having 1 to 20 carbon atoms.

The alkyl group may have a substituent.

The alkyl group having a substituent is not particularly limited, but examples thereof include a hydroxyalkyl group (preferably having 2 to 10 carbon atoms), an alkoxyalkyl group (preferably having 2 to 10 carbon atoms), a cycloalkyloxyalkyl group (preferably having 4 to 10 carbon atoms), an acyloxyalkyl group (preferably having 2 to 10 carbon atoms), an alkylthioalkyl group (preferably having 2 to 10 carbon atoms), a cycloalkylthioalkyl group (preferably 4 to 10 carbon atoms), and a cyanoalkyl group (preferably having 2 to 10 carbon atoms).

Furthermore, the alkyl group is not an unsubstituted alkyl group having 6 or more carbon atoms.

The cycloalkyl group may be a monocycle or a polycycle, and is not particularly limited, but is preferably a cycloalkyl group having 3 to 20 carbon atoms. Specific examples of the cycloalkyl group include a cyclopentyl group, a cyclohexyl group, and a decahydronaphthalenyl group.

The cycloalkyl group may have a substituent. The substituent is not particularly limited, and examples thereof include the above-mentioned substituent T.

The aryl group is not particularly limited, but is preferably an aryl group having 6 to 20 carbon atoms, and specific examples thereof include a phenyl group, a naphthyl group, an anthryl group, a phenanthryl group, a pyrenyl group, a naphthacenyl group, and a fluorenyl group.

The aryl group may have a substituent. The substituent is not particularly limited, and examples thereof include the above-mentioned substituent T.

The alkenyl group is not particularly limited, but is preferably an alkenyl group having 2 to 20 carbon atoms, and specific examples thereof include a vinyl group, an allyl group, a butenyl group, and a pentenyl group.

The alkenyl group may have a substituent. The substituent is not particularly limited, and examples thereof include the above-mentioned substituent T.

The aralkyl group is not particularly limited, but is preferably an aralkyl group having 7 to 20 carbon atoms, and specific examples thereof include a benzyl group, a phenethyl group, a phenylpropyl group, a naphthylmethyl group, a naphthylethyl group, and an anthracenylmethyl group.

The aralkyl group may have a substituent. The substituent is not particularly limited, and examples thereof include the above-mentioned substituent T.

In addition, any two of $R_{1B}$, $R_{2B}$, or $R_{3B}$ may be bonded to each other to form a ring structure, and the ring structure thus formed may include a heteroatom such as an oxygen atom as a ring member.

It is preferable that the acid diffusion control agent (D) which will be described later is an amine compound and the amine oxide (P) is an amine oxide obtained by oxidization of a nitrogen atom in an amine moiety of the acid diffusion control agent (D) which will be described later.

For example, specifically, the acid diffusion control agent is a compound (D-4) which will be described later and the amine oxide (P) is a compound (AE-4) which will be described later.

Specific examples of the amine oxide (P) will be given below, but the present invention is not limited to these specific examples.
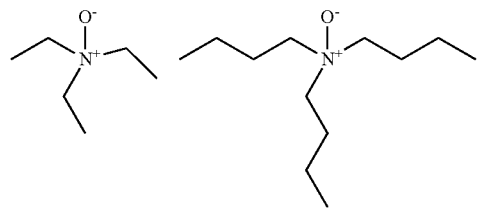
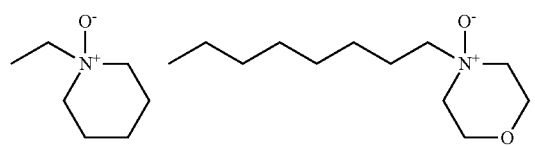
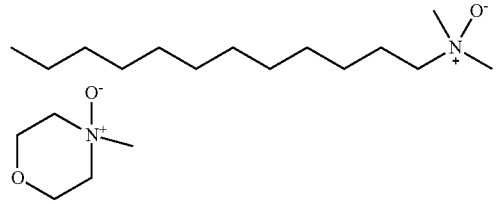
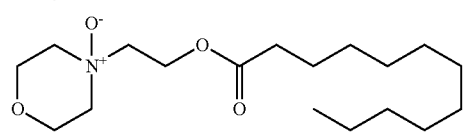
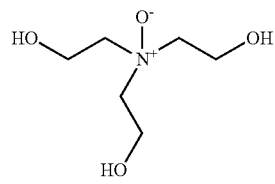
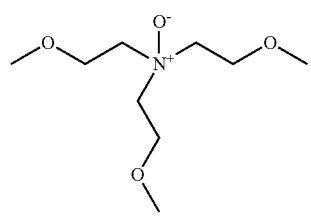
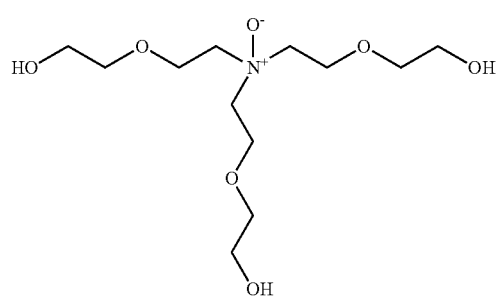
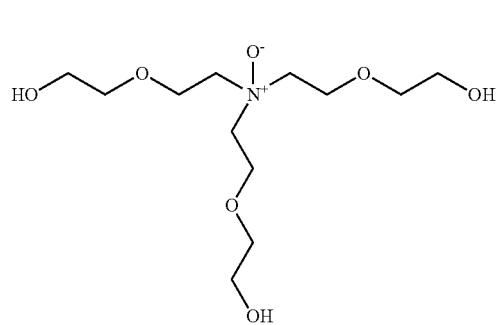
-continued
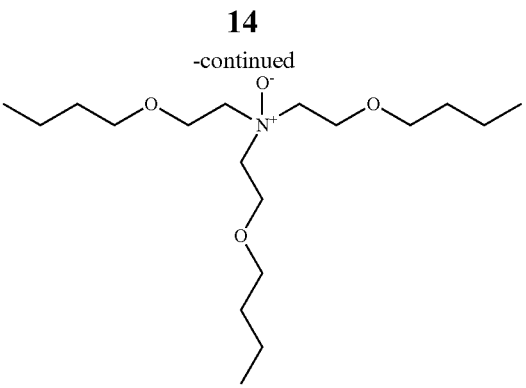
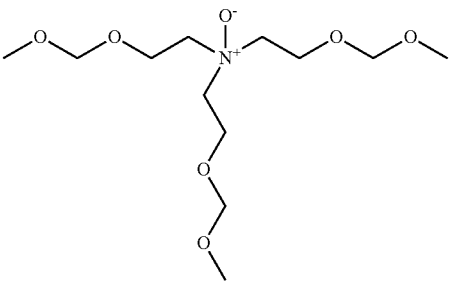
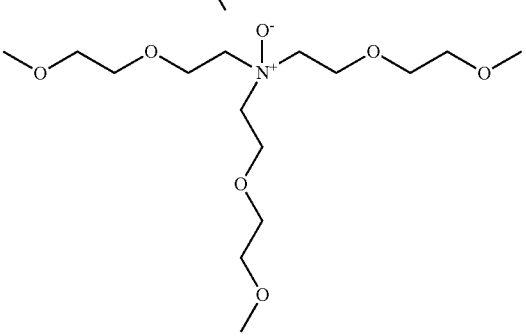
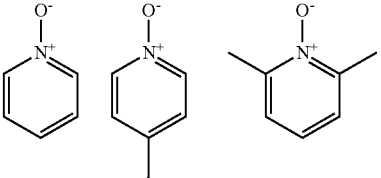
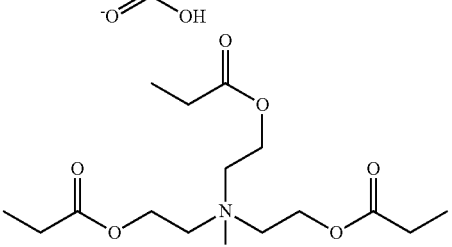
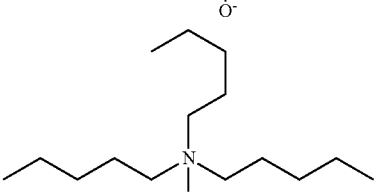
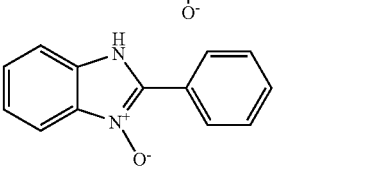

-continued

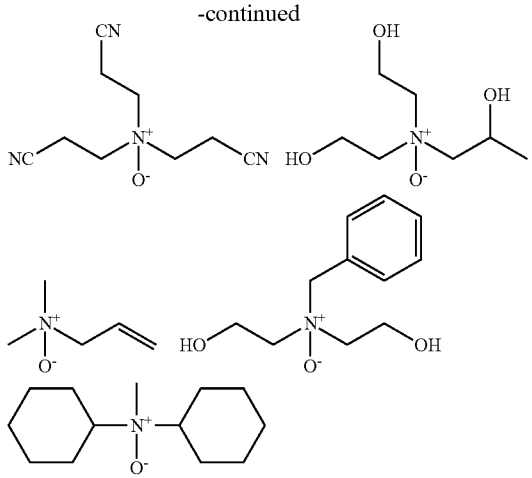

The amine oxide (P) may be used alone or in combination of two or more kinds thereof.

Two or more of the compound represented by General Formula (1), the compound represented by General Formula (2), the compound represented by General Formula (3), the compound represented by General Formula (4), the compound represented by General Formula (5), and the compound represented by General Formula (6) can be used in combination.

A content of the amine oxide (P) (in a case where the amine oxides (P) are present in a plural number, a total content thereof) is from 0.01 ppm to 1,000 ppm with respect to a total mass of the actinic ray-sensitive or radiation-sensitive resin composition.

In a case where the content of the amine oxide (P) (a total content thereof in a case where a plurality of the amine oxides (P) are present) is from 0.01 ppm to 1,000 ppm, the sensitivity reduction is suppressed, and an excellent adhesiveness between the actinic ray-sensitive or radiation-sensitive film and the substrate can be obtained.

In a case where the content of the amine oxide (P) (a total content thereof in a case where a plurality of the amine oxides (P) are present) is 0.01 ppm or more, the adhesiveness between the actinic ray-sensitive or radiation-sensitive film and the substrate is more effectively secured. In addition, in a case where the content of the amine oxide (P) (a total content thereof in a case where a plurality of the amine oxides (P) are present) is 1,000 ppm or less, the sensitivity reduction is more effectively suppressed.

The content of the amine oxide (P) (a total content thereof in a case where a plurality of the amine oxides (P) are present) is preferably from 0.01 ppm to 100 ppm, more preferably from 0.01 ppm to 10 ppm, and still more preferably from 0.01 ppm to 5 ppm with respect to the total mass of the actinic ray-sensitive or radiation-sensitive resin composition.

Moreover, a mass ratio of the acid diffusion control agent (D) to the amine oxide (P), represented by the following expression, is more than 1 and 10,000 or less, preferably 5 to 5,000, and more preferably 10 to 1,000.

Mass ratio=(Content of acid diffusion control agent (D))/(Content of amine oxide (P))

In a case where the mass ratio is more than 1 and 10,000 or less, it is possible to obtain an excellent adhesiveness between the actinic ray-sensitive or radiation-sensitive film and the substrate while suppressing a sensitivity reduction.

In a case where the mass ratio is 1 or less and more than 10,000, a sensitivity reduction cannot be suppressed and it is difficult to secure the adhesiveness between the actinic ray-sensitive or radiation-sensitive film and the substrate.

A method for adding a trace amount of the amine oxide (P) is not particularly limited, and examples thereof include the following methods.

By preparing a diluted solution of the amine oxide (P) in advance using a solvent used for preparing the resist composition, a trace amount of the amine oxide (P) can be accurately measured. In particular, in a case where the amount of the amine oxide (P) added is at a minute level, a solution diluted several times according to the content of the amine oxide (P) is prepared, and it is thus possible to adjust a desired amount of the amine oxide (P) to be present in the resist composition.

The content of the amine oxide (P) in the actinic ray-sensitive or radiation-sensitive resin composition of the embodiment of the present invention can be measured by, for example, the following method.

(Method for Quantifying Amine Oxide (P))

A resist composition including the amine oxide (P) is prepared and irradiated with ultrasonic waves for 3 minutes, using an ultrasonic device (Desktop ultrasonic cleaner (#5510), manufactured by Branson Ultrasonics Corporation). The obtained solution was analyzed with a liquid chromatograph device (Agilent 1100 HPLC G1311A, manufactured by Agilent Technologies, Inc.) of a UV detector (Agilent 1100 HPLC G1315B, manufactured by Agilent Technologies, Inc.) using a reverse phase column (Shim-pack CLC-ODS (M), manufactured by Shimadzu GLC Ltd.). The content of the amine oxide (P) is quantified by an absolute calibration curve method using a standard reagent of the amine oxide (P).

Furthermore, the standard reagent is an amine oxide (P) whose concentration is known and which is to be quantified.

A method for producing the amine oxide (P) is not particularly limited, but the amine oxide (P) can be produced by selecting an optimum method according to the structure of the compound. For example, an oxidation reaction using an oxidizing agent of a nitrogen-containing compound can be exemplified, but the present invention is not limited thereto.

<(A) Resin Having Polarity that Increases by Action of Acid>

The actinic ray-sensitive or radiation-sensitive resin composition according to the embodiment of the present invention contains a resin having a polarity that increases by the action of an acid (hereinafter also referred to as a "resin (A)"). It is preferable that the resin (A) is typically a resin whose polarity increases by the action of an acid to change a solubility in a developer.

The resin (resin (A)) having a polarity that increases by the action of an acid is preferably a resin obtained by polymerizing at least an ethylenically unsaturated compound.

The ethylenically unsaturated compound preferably has one to four ethylenically unsaturated bonds, and more preferably has one ethylenically unsaturated bond. Further, the ethylenically unsaturated compound is preferably a monomer of a monomeric substance.

In addition, the molecular weight of the ethylenically unsaturated compound is preferably 28 to 1,000, more preferably 50 to 800, and particularly preferably 100 to 600.

In addition, the resin having a polarity that increases by the action of an acid preferably has an acid-decomposable group, and is more preferably a resin having a constitutional unit having an acid-decomposable group.

In this case, in the pattern forming method of an embodiment of the present invention which will be described later, typically, in a case where an alkali developer is adopted as the developer, a positive-tone pattern is suitably formed, and in a case where an organic developer is adopted as the developer, a negative-tone pattern is suitably formed.

[Constitutional Unit Having Acid-Decomposable Group]

The resin (A) preferably has a constitutional unit (also referred to as a "repeating unit") having an acid-decomposable group.

As the resin (A), a known resin can be appropriately used. For example, the known resins disclosed in paragraphs 0055 to 0191 of US2016/0274458A, paragraphs 0035 to 0085 of US2015/0004544A, or paragraphs 0045 to 0090 of US2016/0147150A can be suitably used as the resin (A).

The acid-decomposable group preferably has a structure in which a polar group is protected with a group (leaving group) that leaves through decomposition by the action of an acid.

Examples of the polar group include an acidic group (a group which dissociates in a 2.38%-by-mass aqueous tetramethylammonium hydroxide solution), such as a carboxyl group, a phenolic hydroxyl group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, and a sulfonic acid group.

The group which is preferable as the acid-decomposable group is a group in which a hydrogen atom is substituted with a group (leaving group) that leaves by the action of an acid. Examples of the group (leaving group) that leaves by the action of an acid include —C($R^{36}$)($R^{37}$)($R^{38}$), —C($R^{36}$)($R^{37}$)(O$R^{39}$), and —C($R^{O1}$)($R^{O2}$)(O$R^{39}$).

In the formulae, $R^{36}$ to $R^{39}$ each independently an alkyl group, a cycloalkyl group, an aryl group, an aralkyl group, or an alkenyl group. $R^{36}$ and $R^{37}$ may be bonded to each other to form a ring.

$R^{O1}$ and $R^{O2}$ each independently represent a hydrogen atom, an alkyl group, a cycloalkyl group, an aryl group, an aralkyl group, or an alkenyl group.

As the alkyl group as each of $R^{36}$ to $R^{39}$, $R^{O1}$, and $R^{O2}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group as each of $R^{36}$ to $R^{39}$, $R^{O1}$, and $R^{O2}$ may be either monocyclic or polycyclic. As the monocyclic group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic group, a cycloalkyl group having 6 to 20 carbon atoms is preferable, and examples thereof include an adamantyl group, a norbornyl group, an isobornyl group, a camphanyl group, a dicyclopentyl group, an α-pinene group, a tricyclodecanyl group, a tetracyclododecyl group, and an androstanyl group. Further, at least one carbon atom in the cycloalkyl group may be substituted with a heteroatom such as an oxygen atom.

The aryl group as each of $R^{36}$ to $R^{39}$, $R^{O1}$, and $R^{O2}$ is preferably an aryl group having 6 to 10 carbon atoms, and examples thereof include a phenyl group, a naphthyl group, and an anthryl group.

As the aralkyl group of each of $R^{36}$ to $R^{39}$, $R^{O1}$, and $R^{O2}$, an aralkyl group having 7 to 12 carbon atoms is preferable, and examples thereof include a benzyl group, a phenethyl group, and a naphthylmethyl group.

As the alkenyl group of each of $R^{36}$ to $R^{39}$, $R^{O1}$, and $R^{O2}$, an alkenyl group having 2 to 8 carbon atoms is preferable, and examples thereof include a vinyl group, an allyl group, a butenyl group, and a cyclohexenyl group.

The ring formed by the mutual bonding of $R^{36}$ and $R^{37}$ is preferably a (monocyclic or polycyclic)cycloalkyl group. As the cycloalkyl group, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the acid-decomposable group, a cumyl ester group, an enol ester group, an acetal group, a tertiary alkyl ester group, or the like is preferable, and the acetal group or the tertiary alkyl ester group is more preferable.

The resin (A) preferably has a constitutional unit represented by Formula AI as the constitutional unit having an acid-decomposable group.

Formula AI

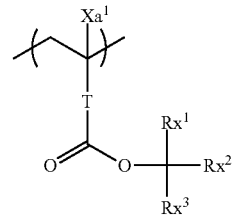

In Formula AI, $Xa^1$ represents a hydrogen atom, a halogen atom other than a fluorine atom, or a monovalent organic group, T represents a single bond or a divalent linking group, $Rx^1$ to $Rx^3$ each independently represent an alkyl group or a cycloalkyl group, and any two of $Rx^1$ to $Rx^3$ may or may not be bonded to each other to form a ring structure.

Examples of the divalent linking group of T include an alkylene group, an arylene group, —COO-Rt-, and —O-Rt-. In the formula, Rt represents an alkylene group, a cycloalkylene group or an arylene group, and T is preferably a single bond or —COO-Rt-. Rt is preferably a chain alkylene group having 1 to 5 carbon atoms, and more preferably —CH$_2$—, —(CH$_2$)$_2$—, or —(CH$_2$)$_3$—. T is more preferably a single bond.

$Xa^1$ is preferably a hydrogen atom or an alkyl group.

The alkyl group of $Xa^1$ may have a substituent, and examples of the substituent include a hydroxyl group and a halogen atom other than a fluorine atom.

The alkyl group of $Xa^1$ preferably has 1 to 4 carbon atoms, and examples thereof include a methyl group, an ethyl group, a propyl group, and a hydroxymethyl group. The alkyl group of $Xa^1$ is preferably a methyl group.

The alkyl group of each of $Rx^1$, $Rx^2$, and $Rx^3$ may be linear or branched, and preferred examples thereof include a methyl group, an ethyl group, an n-propyl group, an isopropyl group, an n-butyl group, an isobutyl group, and a t-butyl group. The alkyl group preferably has 1 to 10 carbon atoms, more preferably has 1 to 5 carbon atoms, and still more preferably has 1 to 3 carbon atoms. In the alkyl groups of each of $Rx^1$, $Rx^2$, and $Rx^3$, a part of carbon-carbon bonds may be a double bond.

As the cycloalkyl group of each of $Rx^1$, $Rx^2$, and $Rx^3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As a ring structure formed by the bonding of two of $Rx^1$, $Rx^2$, and $Rx^3$, a monocyclic cycloalkane ring such as a cyclopentyl ring, a cyclohexyl ring, a cycloheptyl ring, and a cyclooctane ring, or a polycyclic cycloalkyl ring such as a norbornane ring, a tetracyclodecane ring, a tetracyclododecane ring, and an adamantane ring is preferable. The cyclopentyl ring, the cyclohexyl ring, or the adamantane ring is more preferable. As the ring structure formed by the bonding of two of $Rx^1$, $Rx^2$, and $Rx^3$, the structures shown below are also preferable.

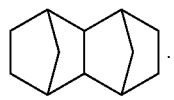 [SMILES: C1CC2CC1C1C3CCC(C3)C21]

Specific examples of a monomer corresponding to the constitutional unit represented by Formula AI are shown below, but the present invention is not limited to these specific examples. The following specific examples correspond to a case where $Xa^1$ in Formula AI is a methyl group, but $Xa^1$ can be optionally substituted with a hydrogen atom, a halogen atom other than a fluorine atom, or a monovalent organic group.

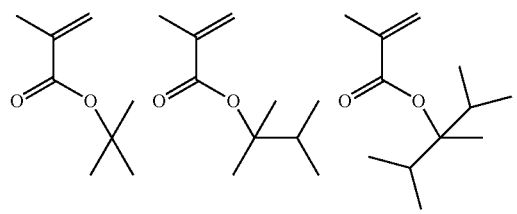

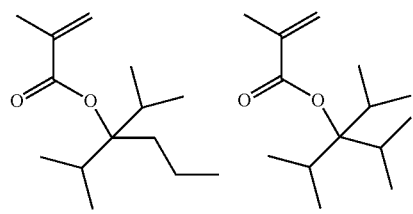

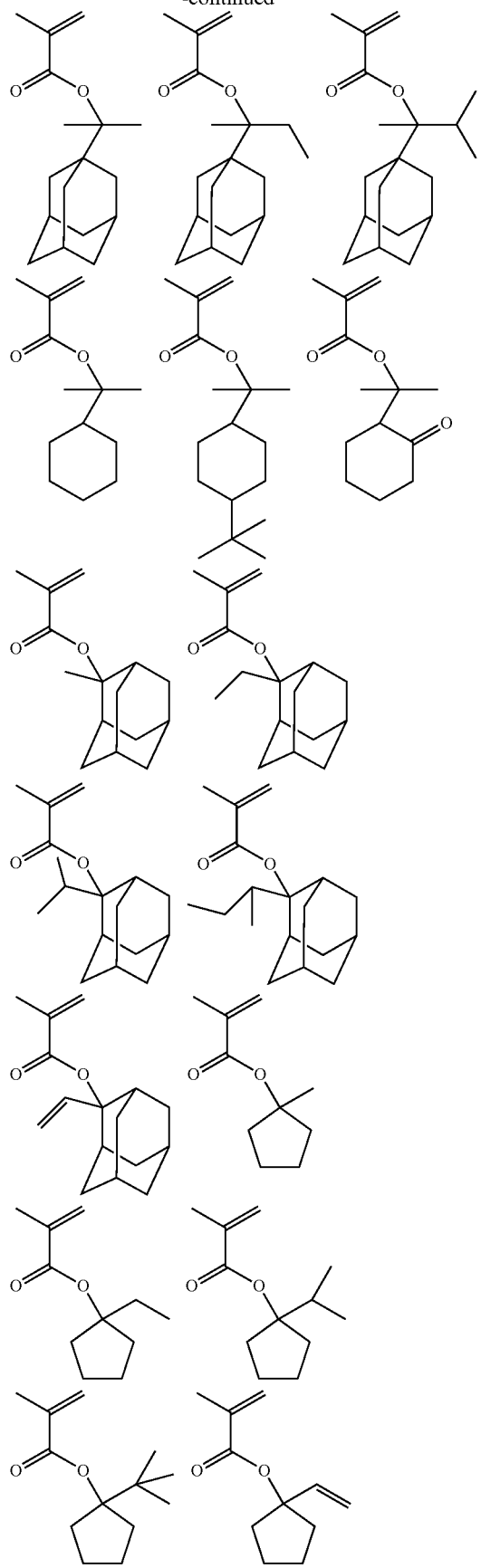

-continued

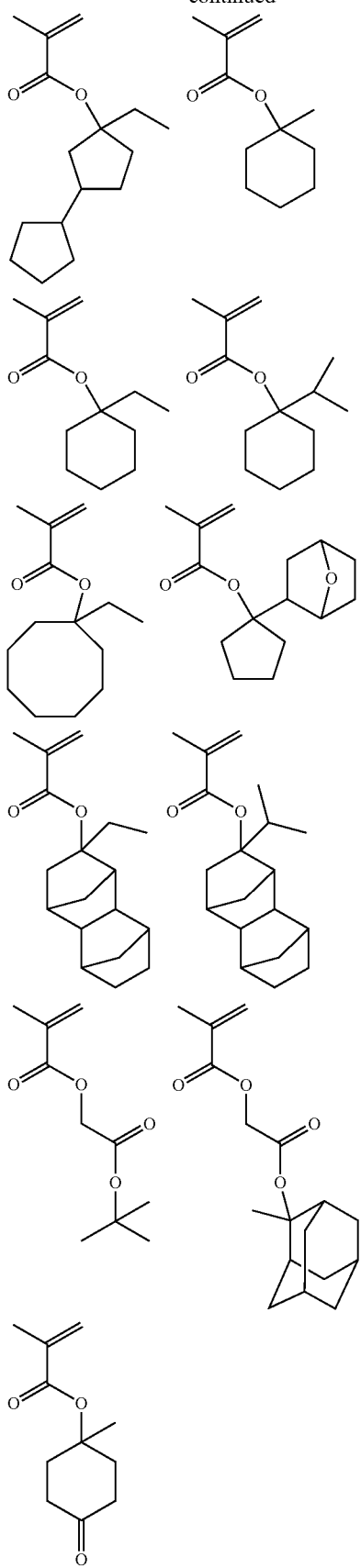

It is also preferable that the resin (A) has the constitutional unit described in paragraphs 0336 to 0369 of US2016/0070167A as the constitutional unit having an acid-decomposable group.

Moreover, the resin (A) may have a constitutional unit including a group that generates an alcoholic hydroxyl group through decomposition by the action of an acid, described in paragraphs 0363 and 0364 of US2016/0070167A, as the constitutional unit having an acid-decomposable group.

In addition, the resin (A) preferably has a repeating unit having a structure (acid-decomposable group) in which a phenolic hydroxyl group is protected with a leaving group that leaves through decomposition by the action of an acid as the repeating unit having an acid-decomposable group. Furthermore, in the present specification, the phenolic hydroxyl group is a group obtained by substituting a hydrogen atom of an aromatic hydrocarbon group with a hydroxyl group. The aromatic ring of the aromatic hydrocarbon group is a monocyclic or polycyclic aromatic ring, and examples thereof include a benzene ring and a naphthalene ring.

Examples of the leaving group that leaves through decomposition by the action of an acid include groups represented by Formulae (Y1) to (Y4).

—C($Rx_1$)($Rx_2$)($Rx_3$)  Formula (Y1):

—C(=O)OC($Rx_1$)($Rx_2$)($Rx_3$)  Formula (Y2):

—C($R_{36}$)($R_{37}$)(O$R_{38}$)  Formula (Y3):

—C(Rn)(H)(Ar)  Formula (Y4):

In Formulae (Y1) and (Y2), $Rx_1$ to $Rx_3$ each independently represent an (linear or branched)alkyl group or a (monocyclic or polycyclic)cycloalkyl group. It should be noted that in a case where all of $Rx_1$ to $Rx_3$ are (linear or branched)alkyl groups, it is preferable that at least two of $Rx_1$, $Rx_2$, or $Rx_3$ are methyl groups.

Among those, $Rx_1$ to $Rx_3$ are more preferably each independently a repeating unit which represents a linear or branched alkyl group, and $Rx_1$ to $Rx_3$ are still more preferably each independently a repeating unit which represents a linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. Among those, a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by each of Formulae (Y1) and Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. $R_{36}$ is preferably a hydrogen atom.

In Formula (Y4), Ar represents an aromatic hydrocarbon group. Rn represents an alkyl group, a cycloalkyl group, or an aryl group. Rn and Ar may be bonded to each other to form a non-aromatic ring. Ar is more preferably an aryl group.

The repeating unit having a structure (acid-decomposable group) in which a phenolic hydroxyl group is protected by a leaving group that leaves through decomposition by the action of an acid preferably has a structure in which a hydrogen atom in the phenolic hydroxyl group is protected by a group represented by any of Formulae (Y1) to (Y4).

As the repeating unit having a structure (acid-decomposable group) in which a phenolic hydroxyl group is protected with a leaving group that leaves through decomposition by the action of an acid, a repeating unit represented by General Formula (AII) is preferable.

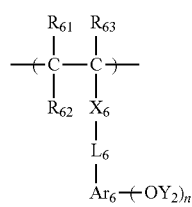

(AII)

In General Formula (AII), $R_{61}$, $R_{62}$, and $R_{63}$ each independently represent a hydrogen atom, an alkyl group, a cycloalkyl group, a halogen atom, a cyano group, or an alkoxycarbonyl group. It should be noted that $R_{62}$ may be bonded to $Ar_6$ to form a ring, in which case $R_{62}$ represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents an (n+1)-valent aromatic hydrocarbon group, and in a case of being bonded to $R_{62}$ to form a ring, $Ar_6$ represents an (n+2)-valent aromatic hydrocarbon group.

Y2's each independently represent a hydrogen atom or a group that leaves by the action of an acid in a case of n>2. It should be noted that at least one of Y2's represents a group that leaves by the action of an acid. The group that leaves by the action of an acid as Y2 is preferably any of Formulae (Y1) to (Y4).

n represents an integer of 1 to 4.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and these groups preferably have 8 or less carbon atoms.

Specific examples of the repeating unit represented by General Formula (AII) are shown below, but the present invention is not limited to these specific examples.

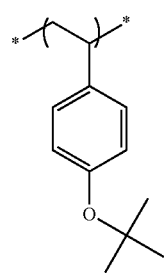

(VI-1)

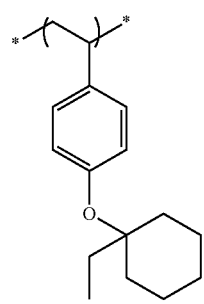

(VI-2)

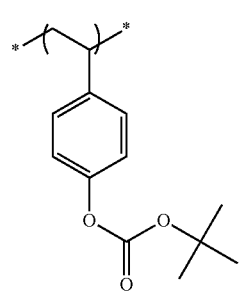

(VI-3)

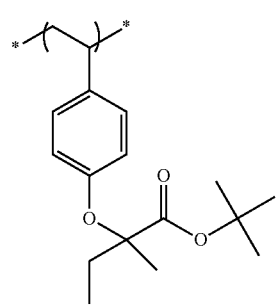

(VI-4)

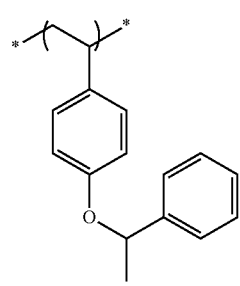

(VI-5)

-continued
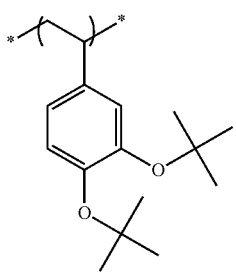
(VI-6)
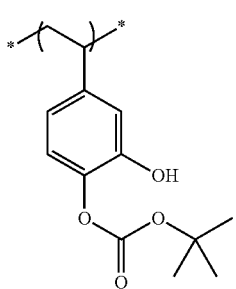
(VI-7)
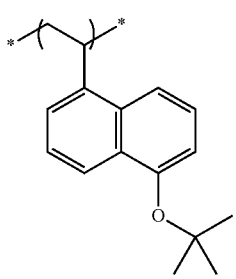
(VI-8)
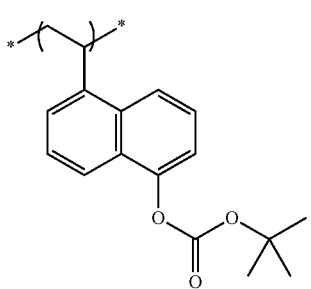
(VI-9)
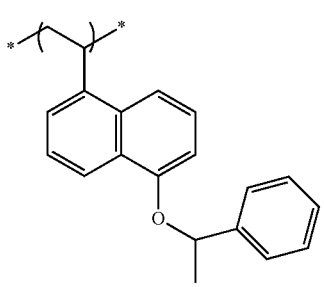
(VI-10)
-continued
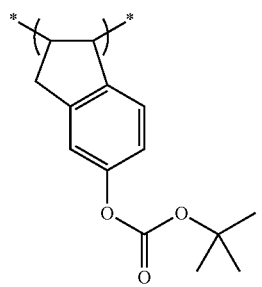
(VI-11)
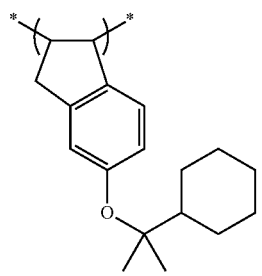
(VI-12)
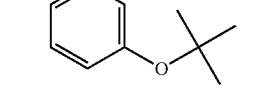
(VI-13)
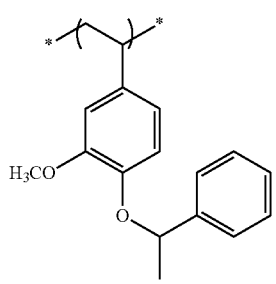
(VI-14)
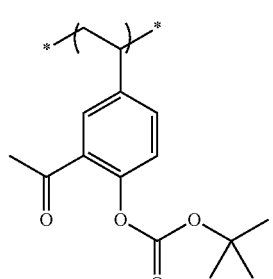
(VI-15)
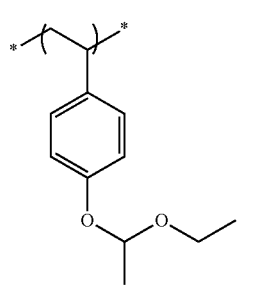
(VI-16)

(VI-17) 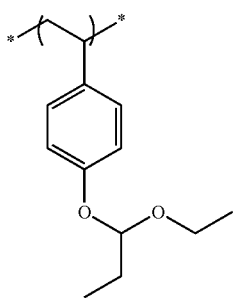
(VI-18) 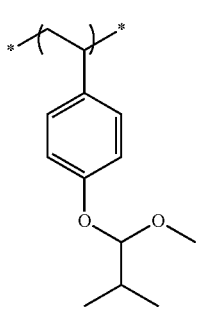
(VI-19) 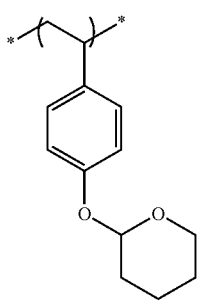
(VI-20) 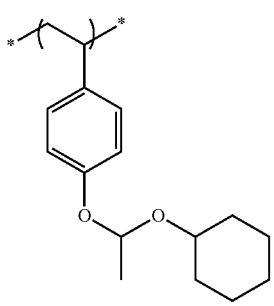
(VI-21) 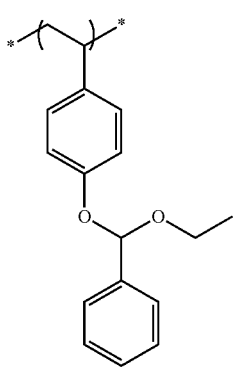
(VI-22) 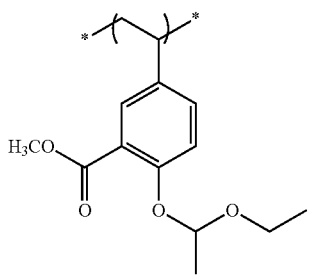
(VI-23) 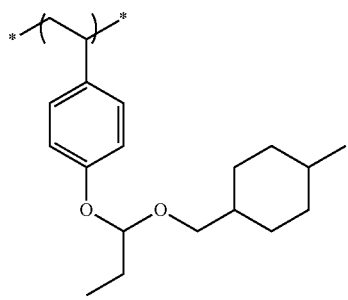
(VI-24) 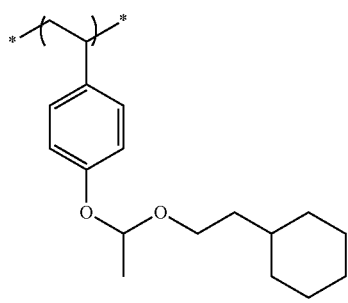
(VI-25) 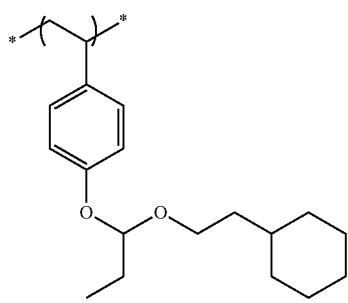
(VI-26) 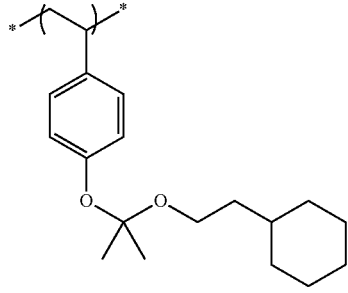

(VI-27)
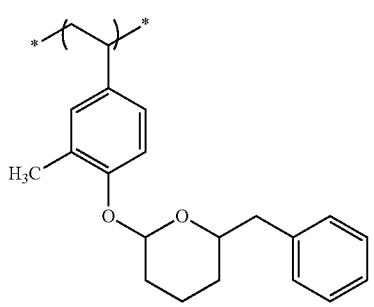
(VI-28)
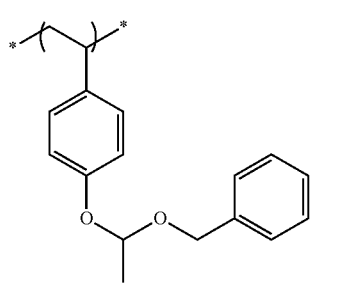
(VI-29)
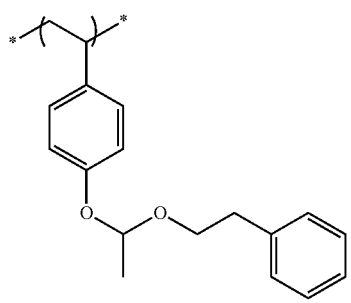
(VI-30)
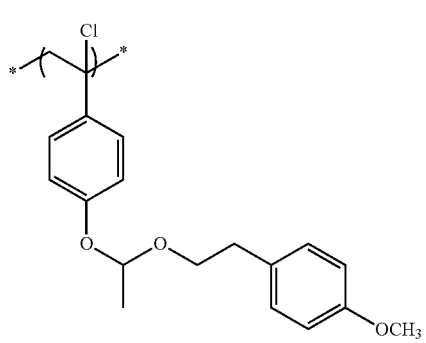
(VI-31)
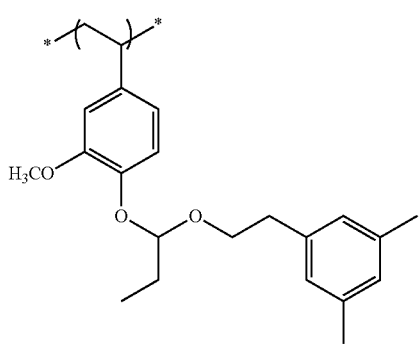
(VI-32)
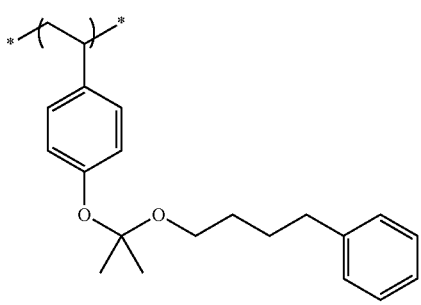
(VI-33)
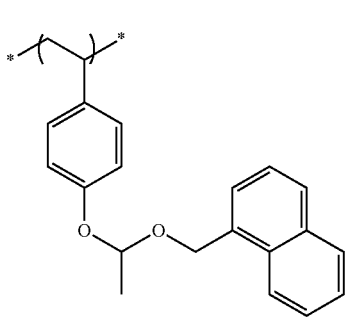
(VI-34)
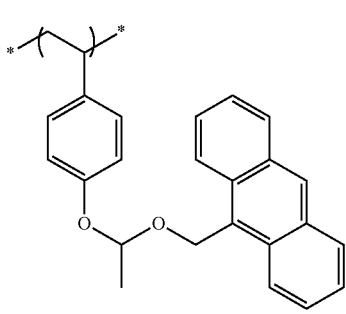
(VI-35)
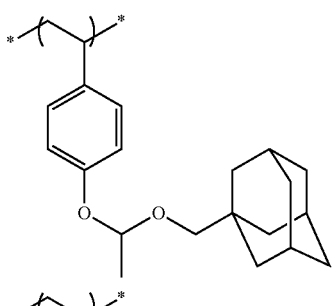
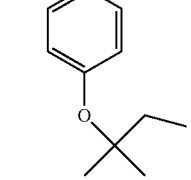

31
-continued
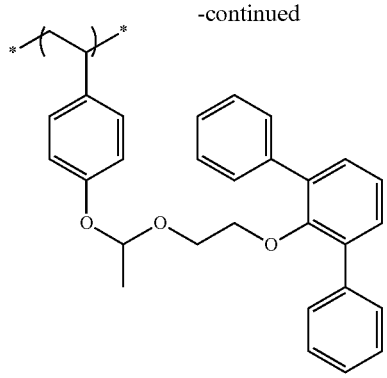
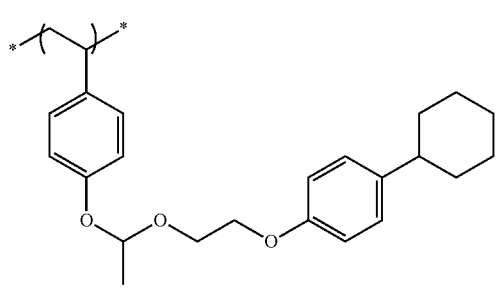
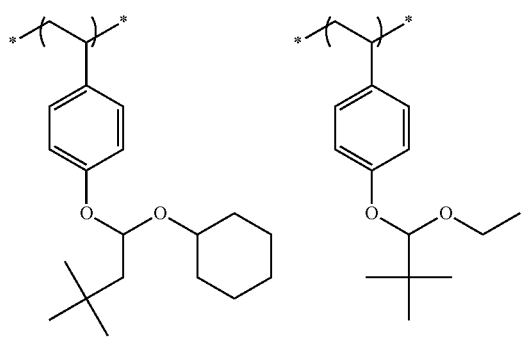
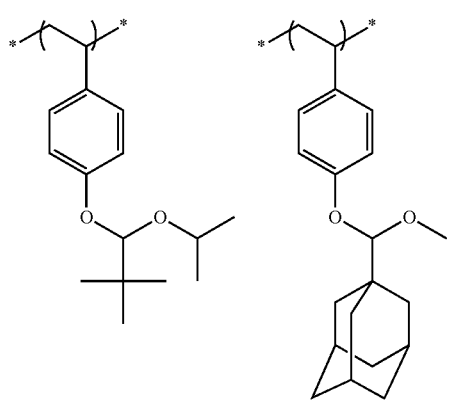
32
-continued
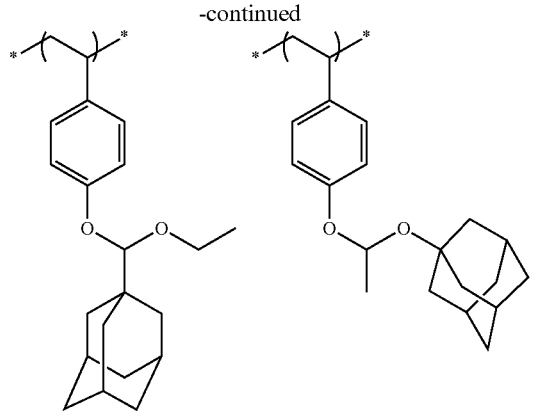
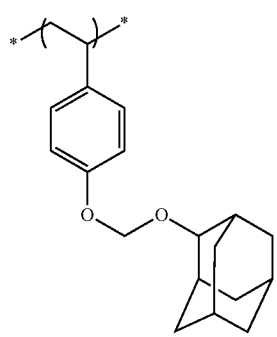
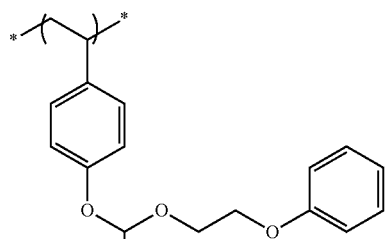
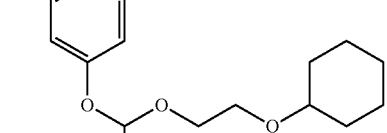

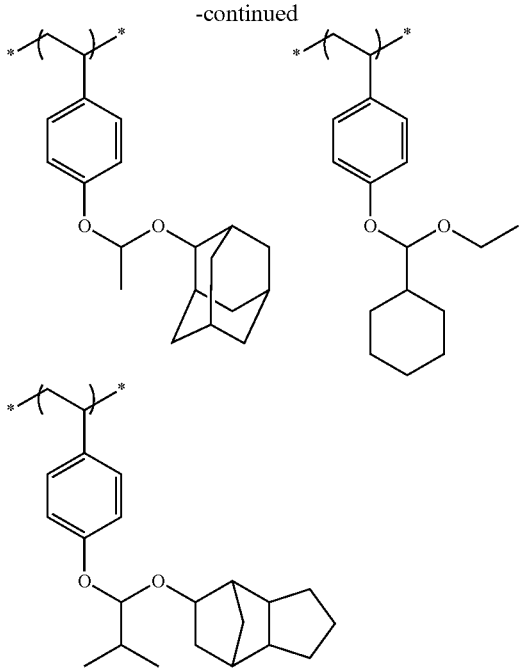

The resin (A) may include only one kind or two or more kinds of the constitutional units having an acid-decomposable group.

A content of the constitutional unit having an acid-decomposable group (the total amount of the constitutional units having an acid-decomposable group in a case where a plurality of the constitutional units having an acid-decomposable group are present) included in the resin (A) is preferably 5% by mole to 90% by mole, more preferably 10% by mole to 80% by mole, and still more preferably 15% by mole to 70% by mole with respect to all constitutional units of the resin (A).

In addition, in the present invention, in a case where the content of the "constitutional unit" is provided in terms of the molar ratio, the "constitutional unit" has the same definition as the "monomer unit". Further, in the present invention, the "monomer unit" may be modified after the polymerization by a polymer reaction or the like. The same applies to the following.

[Constitutional Unit Having at Least One Selected from Group Consisting of Lactone Structure, Sultone Structure, And Carbonate Structure]

The resin (A) preferably has a constitutional unit having at least one selected from the group consisting of a lactone structure, a sultone structure, and a carbonate structure.

As the lactone structure or the sultone structure, any one having a lactone structure or a sultone structure can be used, but the lactone structure or the sultone structure is preferably a 5- to 7-membered ring lactone structure or a 5- to 7-membered ring sultone structure, and more preferably a 5- to 7-membered ring lactone structure to which another ring structure is fused so as to form a bicyclo structure or a spiro structure, or a 5- to 7-membered ring sultone structure to which another ring structure is fused so as to form a bicyclo structure or a spiro structure. The resin (A) still more preferably has a constitutional unit having a lactone structure represented by any of Formulae LC1-1 to LC1-21 or a sultone structure represented by any of General Formulae SL1-1 to SL1-3. Further, a lactone structure or sultone structure may be bonded directly to the main chain. Preferred structures are LC1-1, LC1-4, LC1-5, LC1-8, LC1-16, LC1-21, and SL1-1.

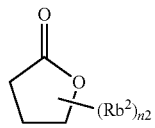

LC1-1

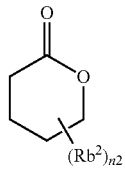

LC1-2

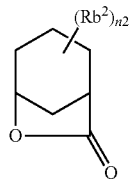

LC1-3

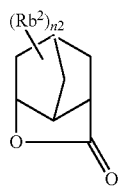

LC1-4

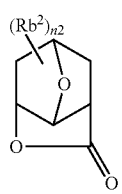

LC1-5

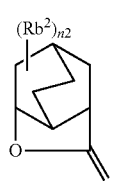

LC1-6

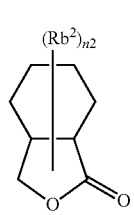

LC1-7

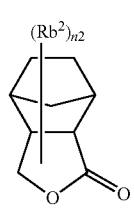

LC1-8

-continued

LC1-9 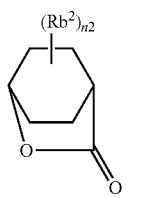

LC1-10 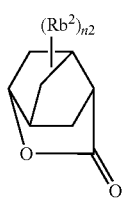

LC1-11 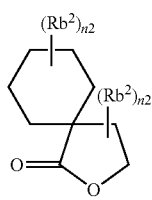

LC1-12 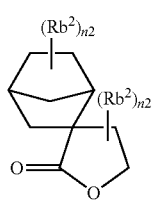

LC1-13 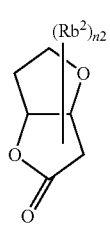

LC1-14 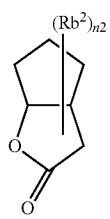

LC1-15 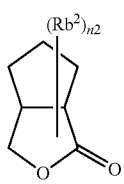

LC1-16 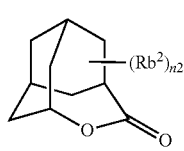

LC1-17 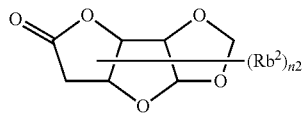

LC1-18 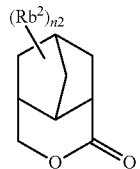

LC1-19 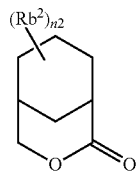

LC1-20 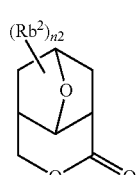

LC1-21 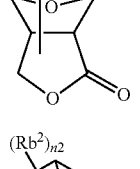

SL1-1 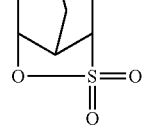

SL1-2

SL1-3 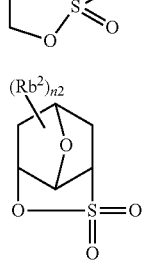

The lactone structural portion or the sultone structural portion may or may not have a substituent ($Rb^2$). Preferred examples of the substituent ($Rb^2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom other than a fluorine atom, a hydroxyl group, a cyano group, and an acid-decomposable group. More preferred examples thereof are an alkyl group having 1 to 4 carbon atoms, a cyano group, and an acid-decomposable group. n2 represents an integer of 0 to 4. In a case where n2 is 2 or more, the substituents ($Rb^2$) which are present in a plural number may be the same as or different from each other. In addition, the substituents ($Rb^2$) which are present in a plural number may be bonded to each other to form a ring.

The constitutional unit having a lactone structure or a sultone structure is preferably a constitutional unit represented by Formula III.

In addition, the resin having a constitutional unit having an acid-decomposable group preferably includes a constitutional unit represented by Formula III.

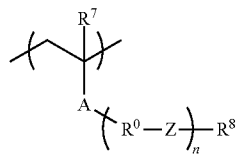

Formula III

In Formula III,

A represents an ester bond (a group represented by —COO—) or an amide bond (a group represented by —CONH—).

n is the number of repetitions of the structure represented by —$R^0$—Z—, represents an integer of 0 to 5, and is preferably 0 or 1, and more preferably 0. In a case where n is 0, —$R^0$—Z— is not present, A and $R^8$ are bound through a single bond.

$R^0$ represents an alkylene group, a cycloalkylene group, or a combination thereof. In a case where $R^0$'s are present in a plural number, $R^0$'s each independently represent an alkylene group, a cycloalkylene group, or a combination thereof.

Z represents a single bond, an ether bond, an ester bond, an amide bond, a urethane bond, or a urea bond. In a case where Z's are present in a plural number, Z's each independently represent a single bond, an ether bond, an ester bond, an amide bond, a urethane bond, or a urea bond.

$R^8$ represents a monovalent organic group having a lactone structure or sultone structure.

$R^7$ represents a hydrogen atom, a halogen atom other than a fluorine atom, or a monovalent organic group (preferably a methyl group).

The alkylene group or the cycloalkylene group of $R^0$ may have a substituent.

Z is preferably an ether bond or an ester bond, and more preferably an ester bond.

Specific examples of a monomer corresponding to the constitutional unit represented by Formula III and specific example of a monomer corresponding to the constitutional unit represented by Formula A-1, each of which will described later, are shown below, but the present invention is not limited to those specific examples. The following specific examples correspond to cases where $R^7$ in Formula III and $R_A^1$ in Formula A-1 are each a methyl group, but $R^7$ and $R_A^1$ can each be optionally substituted with a hydrogen atom, a halogen atom other than a fluorine atom, or a monovalent organic group.

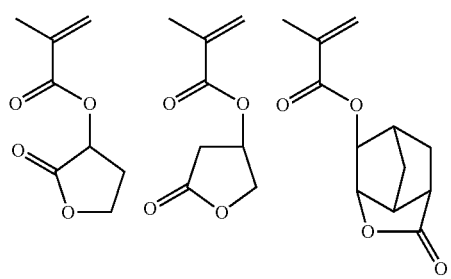

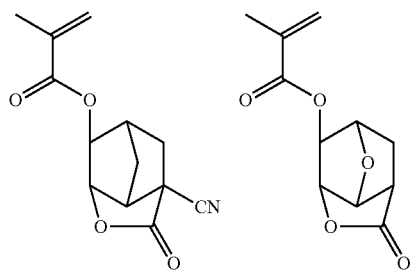

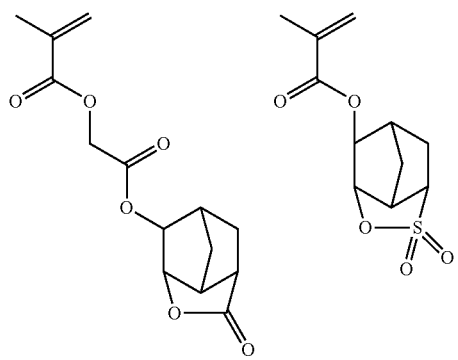

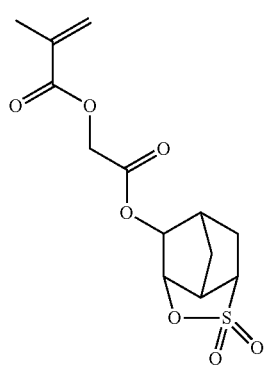

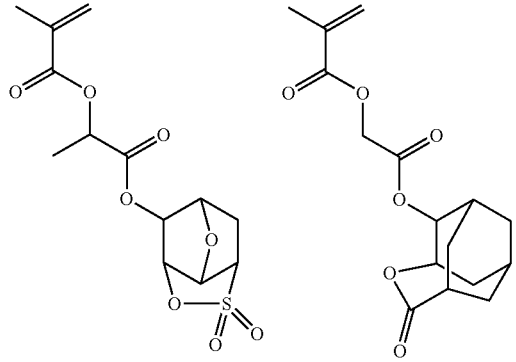

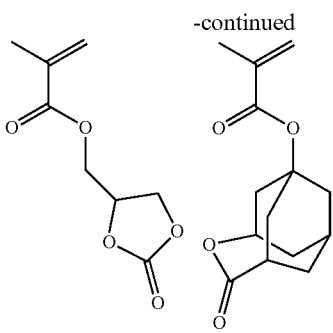
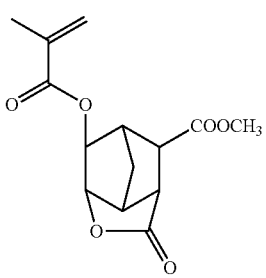
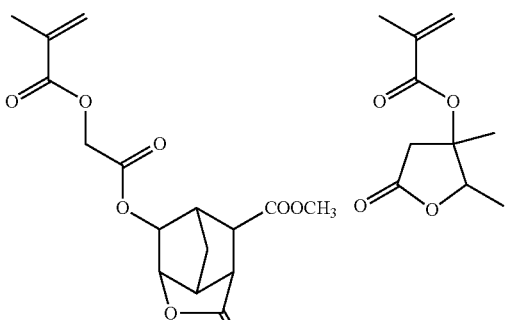
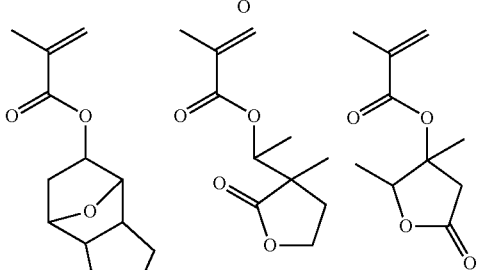
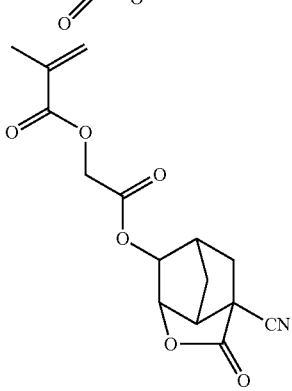

In addition to the monomers, monomers shown below are also suitably used as a raw material for the resin (A).

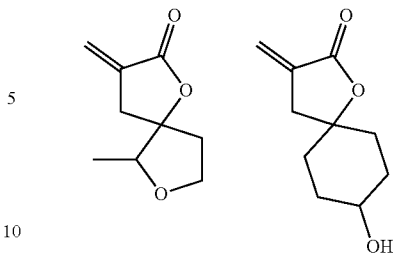

The resin (A) may have a constitutional unit having a carbonate structure. The carbonate structure is preferably a cyclic carbonate structure.

The constitutional unit having a cyclic carbonate structure is preferably a constitutional unit represented by Formula A-1.

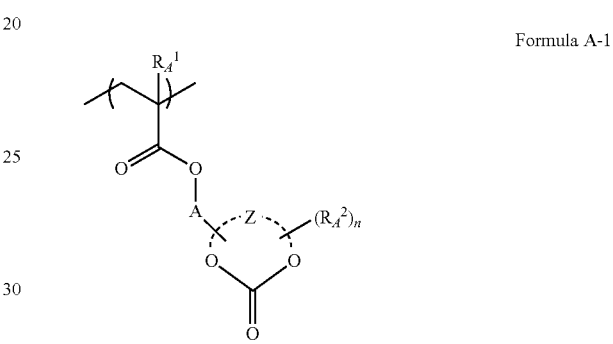

Formula A-1

In Formula A-1, $R_A^1$ represents a hydrogen atom, a halogen atom other than a fluorine atom, or a monovalent organic group (preferably a methyl group), n represents an integer of 0 or more, and $R_A^2$ represents a substituent. In a case where n is 2 or more, $R_A^2$'s each independently represent a substituent, A represents a single bond or a divalent linking group, and Z represents an atomic group which forms a monocyclic structure or a polycyclic structure together with a group represented by —O—C(=O)—O— in the formula.

The resin (A) preferably includes the constitutional unit described in paragraphs 0370 to 0414 of the specification of US2016/0070167A as a constitutional unit having at least one selected from the group consisting of a lactone structure, a sultone structure, and a carbonate structure.

The resin (A) preferably has at least two constitutional units (a) (hereinafter also referred to as "constitutional units (a)") having lactone structures.

The at least two lactone structures may be, for example, a structure in which at least two lactone structures are fused or may be a structure in which at least two lactone structures are linked through a single bond or a linking group.

The lactone structure contained in the constitutional unit (a) is not particularly limited, but is preferably a 5- to 7-membered ring lactone structure, and preferably the 5- to 7-membered ring lactone structure to which another ring structure is fused so as to form a bicyclo structure or a spiro structure.

Preferred examples of the lactone structure include a lactone structure represented by any of LC1-1 to LC1-21 as described above.

The constitutional unit (hereinafter also referred to as "constitutional unit (a)") having at least two lactone structures is preferably a constitutional unit represented by Formula L-1.

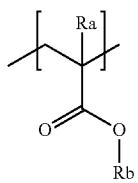

Formula L-1

In Formula L-1, Ra represents a hydrogen atom or an alkyl group, and Rb represents a partial structure having two or more lactone structures.

The alkyl group of Ra is preferably an alkyl group having 1 to 4 carbon atoms, more preferably a methyl group or an ethyl group, and particularly preferably the methyl group. The alkyl group of Ra may be substituted. Examples of the substituent include a halogen atom such as a fluorine atom, a chlorine atom, and a bromine atom, a mercapto group, a hydroxyl group, a methoxy group, an ethoxy group, an isopropoxy group, an alkoxy group such as a t-butoxy group and a benzyloxy group, an acetyl group, and an acetoxy group such as a propionyl group. Ra is preferably a hydrogen atom, a methyl group, a trifluoromethyl group, or a hydroxymethyl group.

Examples of the lactone structure contained in the Rb partial structure include the above-mentioned lactone structure.

The partial structure of Rb having two or more lactone structures is preferably, for example, a structure in which at least two lactone structures are linked through a single bond or a linking group, and a structure in which at least two lactone structures are fused.

The constitutional unit (a1) having a structure in which at least two lactone structures are fused and the constitutional unit (a2) having a structure in which at least two lactone structures are linked through a single bond or a linking group will each be described below.

—Constitutional Unit (a1) Having Structure in which at Least Two Lactone Structures are Fused—

The structure in which at least two lactone structures are fused is preferably a structure in which two or three lactone structures are fused, and is more preferably a structure in which two lactone structures are fused.

Examples of the constitutional unit (hereinafter also referred to as a "constitutional unit (a1)") having a structure in which at least two lactone structures are fused include a constitutional unit represented by Formula L-2.

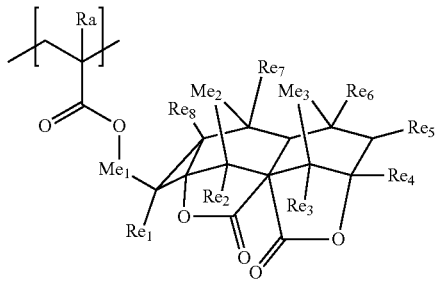

Formula L-2

In Formula L-2, Ra has the same definition as Ra in Formula L-1, Re1 to Res each independently represent a hydrogen atom or an alkyl group, $Me_1$ represents a single bond or a divalent linking group, and Me2 and Me3 each independently represent a divalent linking group.

The alkyl group of each of Rei to Res preferably has, for example, 5 or less carbon atoms, and more preferably has 1 carbon atom.

Examples of the alkyl group having 5 or less carbon atoms of each of Rei to Res include a methyl group, an ethyl group, an n-propyl group, an isopropyl group, an n-butyl group, an isobutyl group, a t-butyl group, an n-pentyl group, an isopentyl group, an s-pentyl group, and a t-pentyl group.

Among those, Rei to Res are each preferably a hydrogen atom.

Examples of the divalent linking group of $Me_1$ include an alkylene group, a cycloalkylene group, —O—, —CO—, —COO—, —OCO—, and a group in which two or more of these groups are combined.

The alkylene group of $Me_1$ preferably has, for example, 1 to 10 carbon atoms. Moreover, the alkylene group more preferably has 1 or 2 carbon atoms, and as the alkylene group having 1 or 2 carbon atoms, for example, a methylene group or an ethylene group is preferable.

The alkylene group of $Me_1$ may be linear or branched, and examples thereof include a methylene group, an ethane-1,1-diyl group, an ethane-1,2-diyl group, a propane-1,1-diyl group, a propane-1,3-diyl group, a propane-2,2-diyl group, a pentane-1,5-diyl group, and a hexane-1,6-diyl group.

The cycloalkylene group of $Me_1$ preferably has, for example, 5 to 10 carbon atoms, and more preferably has 5 or 6 carbon atoms.

Examples of the cycloalkylene group of $Me_1$ include a cyclopentylene group, a cyclohexylene group, a cycloheptylene group, a cyclooctylene group, and a cyclodecylene group.

The group in which two or more groups are combined as the divalent linking group of $Me_1$ is preferably, for example, a group in which an alkylene group and —COO— are combined or a group in which —OCO— and an alkylene group are combined. Further, the group in which two or more groups are combined is more preferably a group in which a methylene group and a —COO— group are combined or a group in which a —COO— group and a methylene group are combined.

Examples of the divalent linking group of Me2 and Me3 include an alkylene group and —O—. The divalent linking group of each of Me2 and Me3 is preferably a methylene group, an ethylene group, or —O—, and more preferably —O—.

The monomer corresponding to the constitutional unit (a1) can be synthesized by, for example, the method described in JP2015-160836A.

Specific examples of the constitutional unit (a1) will be shown below, but the present invention is not limited thereto. In each of the following formulae, $R_9$ represents a hydrogen atom, a methyl group, a trifluoromethyl group, or a hydroxymethyl group, and * represents a bonding position with another constitutional unit.

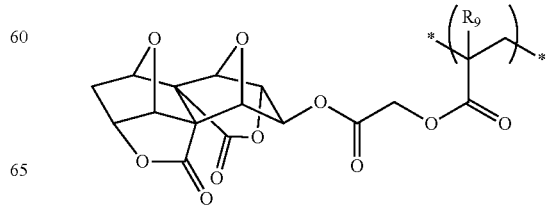

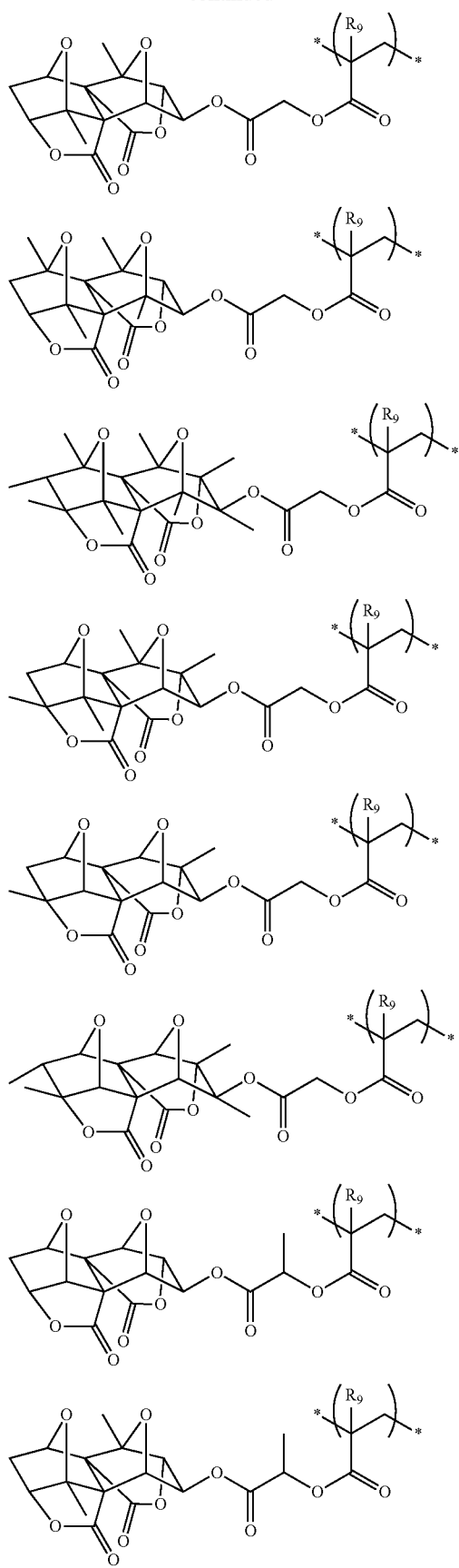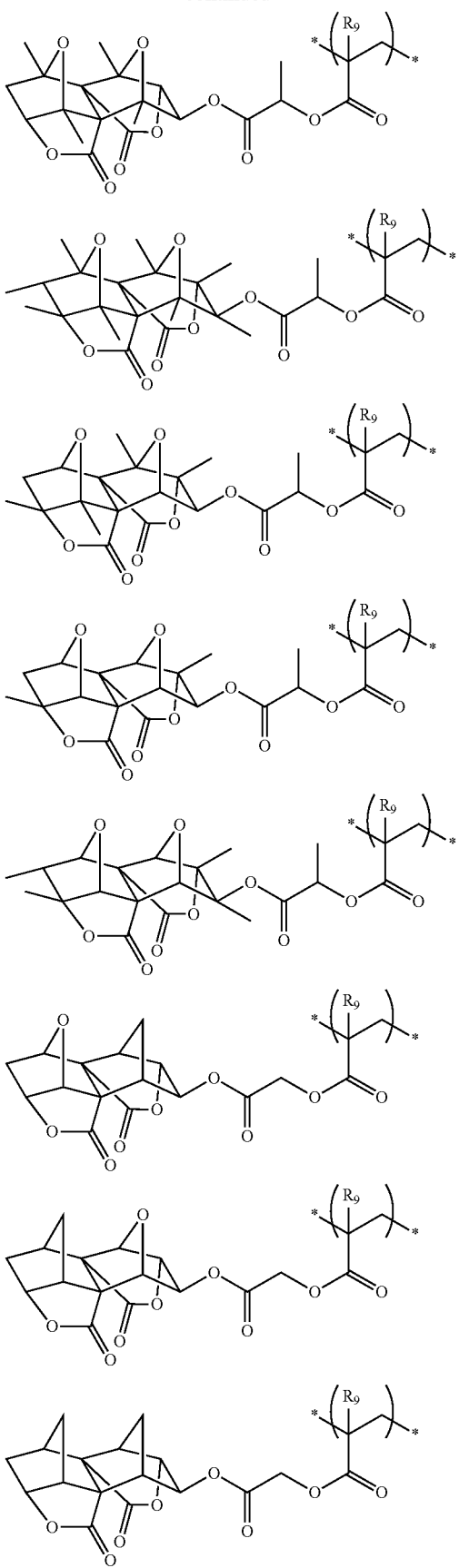

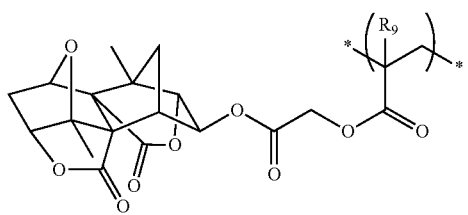
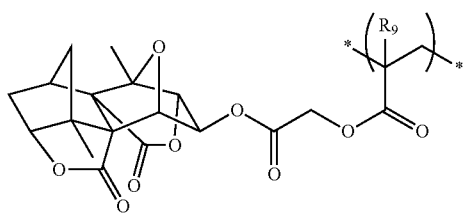
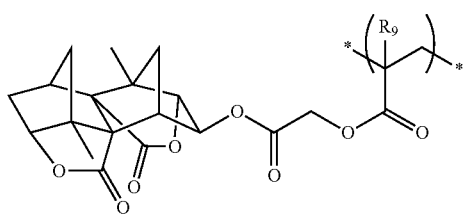
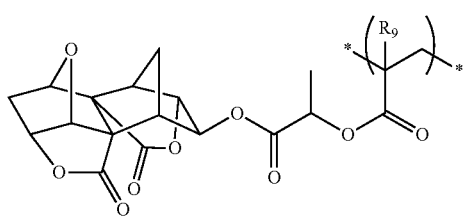
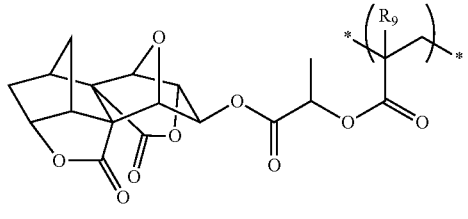
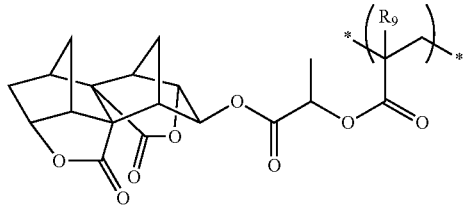
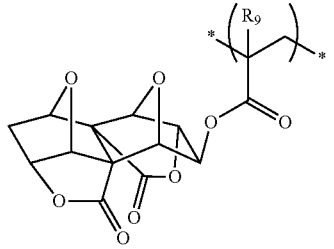
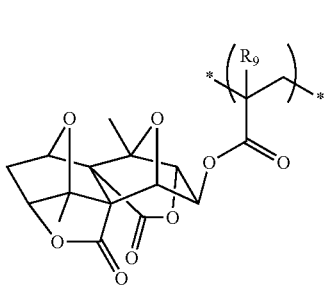
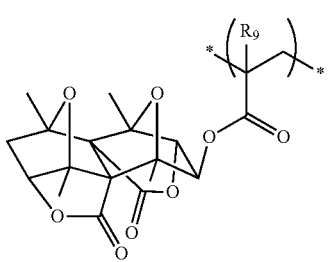
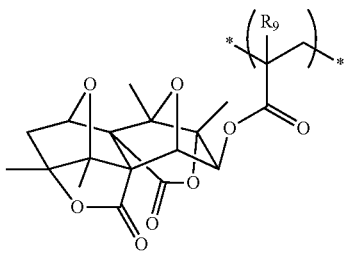
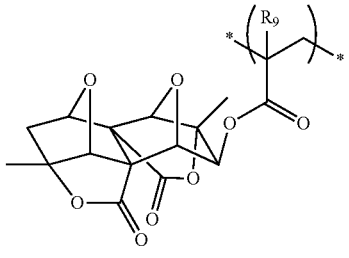
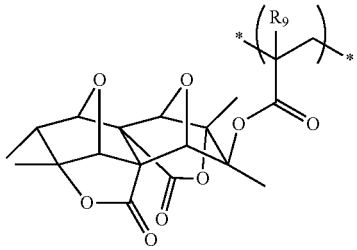
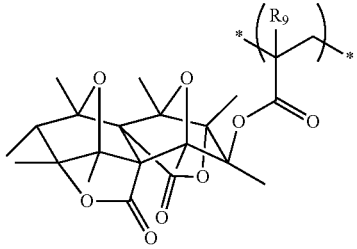

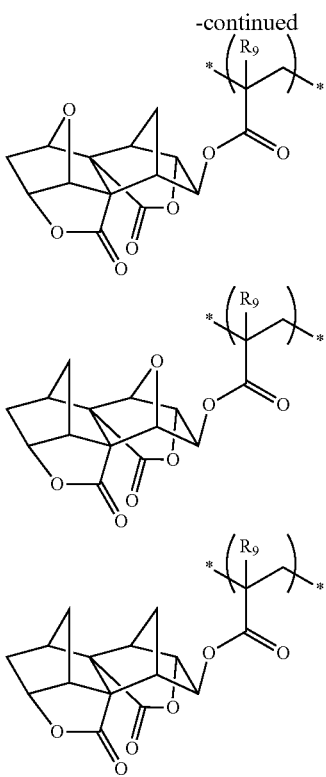

—Constitutional Unit (a2) Having Structure in which at Least Two Lactone Structures are Linked Through Single Bond or Linking Group—

The structure in which at least two lactone structures are linked through a single bond or a linking group is preferably a structure in which two to four lactone structures are linked through a single bond or a linking group, and more preferably a structure in which two lactone structures are linked through a single bond or a linking group.

Examples of the linking group include the same groups as those mentioned as the linking group of M2 in Formula L-3 which will be described later.

The constitutional unit (hereinafter also referred to as a "constitutional unit (a2)") having a structure in which two or more lactone structures are linked through a single bond or a linking group has, for example, a constitutional unit represented by Formula L-3.

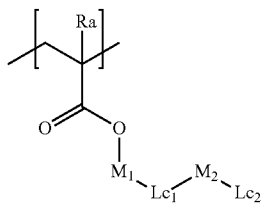

Formula L-3

In Formula L-3, Ra has the same definition as Ra in Formula L-1, $M_1$ and $M_2$ each independently represent a single bond or a linking group, and $Lc_1$ and $Lc_2$ each independently represent a group having a lactone structure.

Examples of the linking group of $M_1$ include an alkylene group, a cycloalkylene group, —O—, —CO—, —COO—, —OCO—, and a group in which two or more of these groups are combined.

The alkylene group of $M_1$ preferably has, for example, 1 to 10 carbon atoms.

The alkylene group for $M_1$ may be linear or branched and example thereof include a methylene group, an ethane-1,1-diyl group, an ethane-1,2-diyl group, a propane-1,1-diyl group, a propane-1,3-diyl group, a propane-2,2-diyl group, a pentane-1,5-diyl group, and a hexane-1,6-diyl group.

The cycloalkylene group of $M_1$ preferably has, for example, 5 to 10 carbon atoms.

Examples of the cycloalkylene group of $M_1$ include a cyclopentylene group, a cyclohexylene group, a cycloheptylene group, a cyclooctylene group, and a cyclodecylene group.

The group in which two or more groups are combined as the linking group of $M_1$ is preferably, for example, a group in which an alkylene group and —COO— are combined or a group in which —OCO— and an alkylene group are combined. Further, the group in which two or more groups are combined is more preferably a group in which a methylene group and a —COO— group are combined or a group in which a —COO— group and a methylene group are combined.

Examples of the linking group for $M_2$ include the same groups as those mentioned for the linking group for $M_1$.

The lactone structure contained in $Lc_1$ is, for example, preferably a 5- to 7-membered ring lactone structure, and preferably the 5- to 7-membered ring lactone structure to which another ring structure is fused in the form of forming a bicyclo structure or a spiro structure. The lactone structure is more preferably a lactone structure represented by any of LC1-1 to LC1-21. Still more preferred examples of the lactone structure include LC1-1, LC1-4, LC1-5, LC1-6, LC1-13, LC1-14, and LC1-17.

The lactone structure contained in $Lc_1$ may include a substituent. Examples of the substituent which may be included in the lactone structure contained in $Lc_1$ include the same substituent as the above-mentioned substituent ($Rb^2$) having a lactone structure.

Examples of the lactone structure contained in $Lc_2$ include the same structure as the lactone structure mentioned as the lactone structure contained in $Lc_1$.

The constitutional unit (a2) is preferably a constitutional unit represented by Formula L-4 as the constitutional unit represented by Formula L-3.

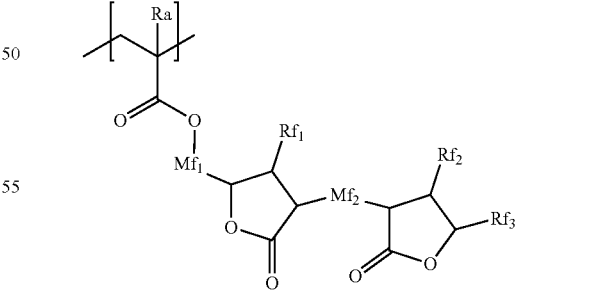

Formula L-4

In Formula L-4, Ra has the same definition as Ra in Formula L-1, $Mf_1$ and $Mf_2$ each independently represent a single bond or a linking group, and $Rf_1$, $Rf_2$, and $Rf_3$ each independently represent a hydrogen atom or an alkyl group, $Mf_1$ and $Rf_1$ may be bonded to each other to form a ring, and $Mf_2$ and each of $Rf_2$ or $Rf_3$ may be bonded to each other to form a ring.

The linking group for Mf$_1$ has the same definition as the linking group for M$_1$ in Formula L-3.

The linking group for Mf$_2$ has the same definition as the linking group for M$_2$ in Formula L-3.

Examples of the alkyl group of Rf$_1$ include an alkyl group having 1 to 4 carbon atoms. The alkyl group having 1 to 4 carbon atoms of Rf$_1$ is preferably a methyl group or an ethyl group, and more preferably the methyl group. The alkyl group of Rf$_1$ may have a substituent. Examples of the substituent which may be contained in the alkyl group of Rf$_1$ include a hydroxyl group, an alkoxy group such as a methoxy group and an ethoxy group, a cyano group, and a halogen atom such as a fluorine atom.

The alkyl group of each of Rf$_2$ and Rf$_3$ has the same definition as the alkyl group of Rf$_1$.

Mf$_1$ and Rf$_1$ may be bonded to each other to form a ring. Examples of the structure in which Mf$_1$ and Rf$_1$ are bonded to each other to form a ring include the lactone structure represented by LC1-13, LC1-14, or LC1-17 in the above-mentioned lactone structure. Mf$_2$ and each of Rf$_2$ or Rf$_3$ may be bonded to each other to form a ring.

Examples of the structure in which Mf$_2$ and Rf$_2$ are bonded to each other to form a ring include the above-mentioned lactone structure represented by LCT-7, LCT-8, or LC1-15 in the above-mentioned lactone structure.

Examples of the structure in which Mf$_2$ and Rf$_3$ are bonded to each other to form a ring include the above-mentioned lactone structure represented by any of LCT-3 to LCT-6 in the above-mentioned lactone structure.

Specific examples of the constitutional unit (a2) will be shown below, but the present invention is not limited thereto. * represents a bonding position with another constitutional unit.

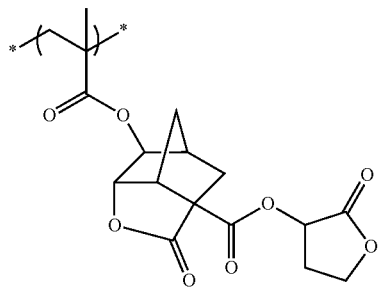

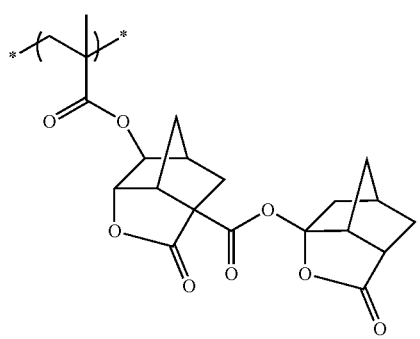

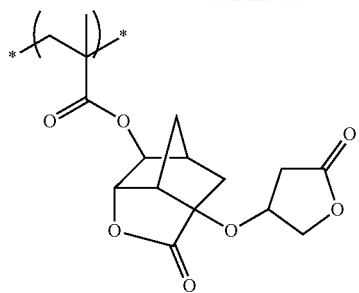

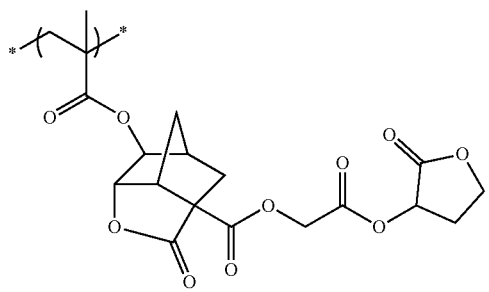

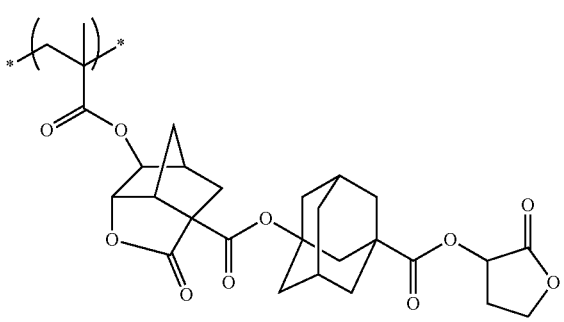

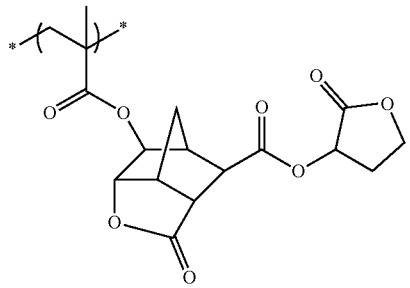

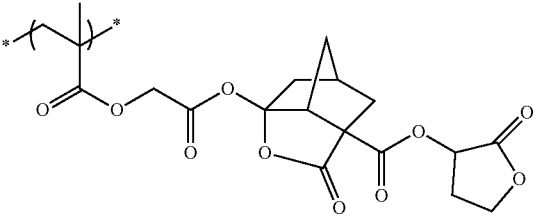

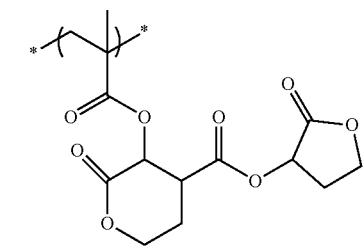

-continued

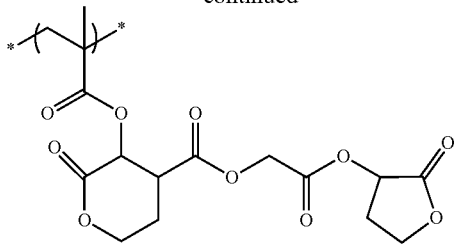

In the constitutional unit having at least two lactone structures, optical isomers are usually present, but any of the optical isomers may be used. In addition, one kind of optical isomers may be used alone or a plurality of kinds of optical isomers may be mixed and used. In a case where one optical isomer is mainly used, an optical purity (ee) thereof is preferably 90% or more, and more preferably 95% or more.

A content ratio of the constitutional units having at least two lactone structures is preferably 10% by mole to 60% by mole, more preferably 20% by mole to 50% by mole, and still more preferably 30% by mole to 50% by mole with respect to all constitutional units in the resin (A).

In order to enhance the effect in the present invention, it is possible to use two or more kinds of constitutional units having at least two lactone structures in combination. In a case where two or more kinds of repeating units having at least two lactone structures are contained, it is preferable that a total content ratio of the constitutional units having at least two lactone structures is within the range.

The resin (A) may include only one kind of a constitutional unit having at least one selected from the group consisting of a lactone structure, a sultone structure, and a carbonate structure, or two or more kinds of the constitutional units in combination may be used.

A content of the constitutional unit having at least one type selected from the group consisting of a lactone structure, a sultone structure, and a carbonate structure included in the resin (A) (in a case where the constitutional units having at least one selected from the group consisting of a lactone structure, a sultone structure, and a carbonate structure are present in a plural number, a total content thereof) is preferably 5% by mole to 70% by mole, more preferably 10% by mole to 65% by mole, and still more preferably 20% by mole to 60% by mole with respect to all constitutional units in the resin (A).

[Constitutional Unit Having Polar Group]

The resin (A) preferably has a constitutional unit having a polar group.

Examples of the polar group include a hydroxyl group, a cyano group, and a carboxyl group.

The constitutional unit having a polar group is preferably a constitutional unit having an alicyclic hydrocarbon structure substituted with a polar group. Further, it is preferable that the constitutional unit having a polar group has no acid-decomposable group. The alicyclic hydrocarbon structure in the alicyclic hydrocarbon structure substituted with a polar group is preferably an adamantyl group or a norbornyl group.

Specific examples of a monomer corresponding to the constitutional unit having a polar group are shown below, but the present invention is not limited to these specific examples. Further, the following specific examples are described as a methacrylic acid ester compound, but may be acrylic acid ester compounds.

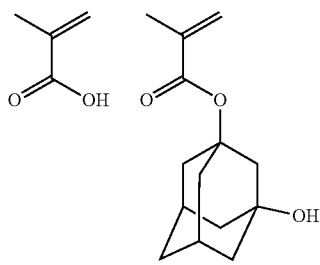

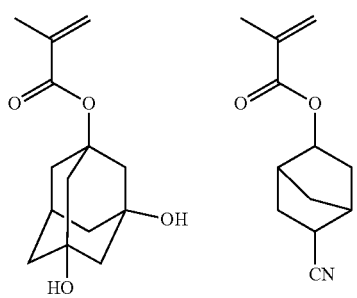

In addition, specific examples of the constitutional unit having a polar group include the constitutional units disclosed in paragraphs 0415 to 0433 of US2016/0070167A.

The resin (A) may include only one kind or a combination of two or more kinds of the constitutional unit having a polar group.

A content of the constitutional unit having a polar group is preferably 5% by mole to 40% by mole, more preferably 5% by mole to 30% by mole, and still more preferably 10% by mole to 25% by mole with respect to all constitutional units in the resin (A).

[Constitutional Unit Having Neither Acid-Decomposable Group Nor Polar Group]

The resin (A) can further have a constitutional unit having neither an acid-decomposable group nor a polar group. The constitutional unit having neither an acid-decomposable group nor a polar group preferably has an alicyclic hydrocarbon structure. Examples of the constitutional unit having neither an acid-decomposable group nor a polar group include the constitutional units described in paragraphs 0236 and 0237 of US2016/0026083A. Preferred examples of a monomer corresponding to the constitutional unit having neither an acid-decomposable group nor a polar group are shown below.

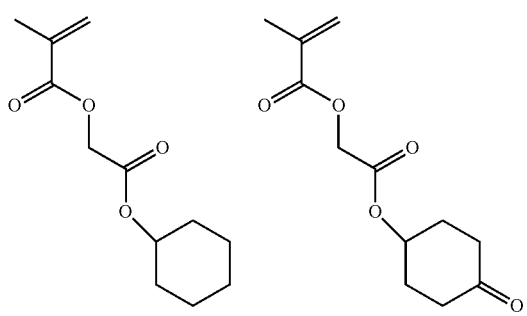

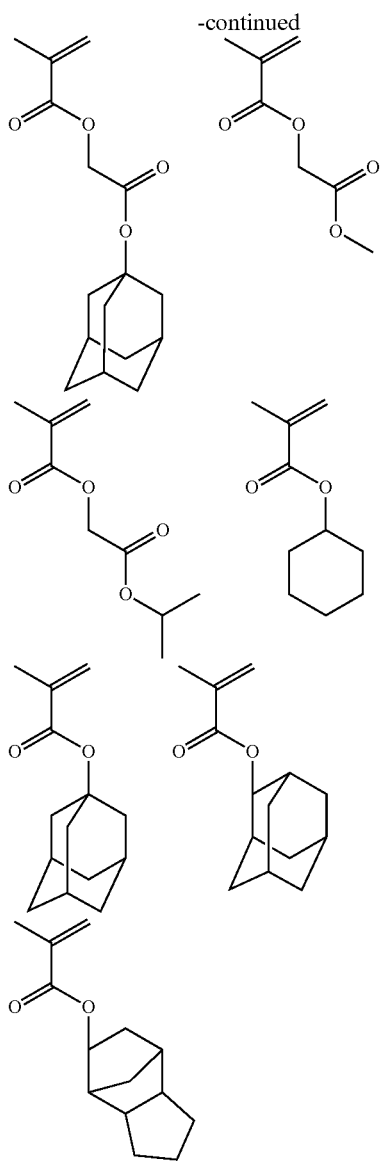

In addition, specific examples of the constitutional unit having neither an acid-decomposable group nor a polar group include the constitutional units disclosed in paragraph 0433 of US2016/0070167A.

The resin (A) may include only one kind of the constitutional units having neither an acid-decomposable group nor a polar group, or may include two or more kinds of such constitutional units in combination.

A content of the constitutional unit having neither an acid-decomposable group nor a polar group is preferably 5% to 40% by mole, more preferably 5% to 30% by mole, and still more preferably 5% to 25% by mole with respect to all constitutional units in the resin (A).

[Repeating Unit (a1)]

The resin (A) can further have the following repeating unit (a1).

The repeating unit (a1) is a repeating unit derived from a monomer (also referred to as a "monomer a1") in which a homopolymer formed therefrom has a glass transition temperature of 50° C. or lower.

In addition, the repeating unit (a1) is a non-acid-decomposable repeating unit. Therefore, the repeating unit (a1) does not have an acid-decomposable group.

(Method for Measuring Glass Transition Temperature of Homopolymer)

As the glass transition temperature of the homopolymer, in a case where there is a catalog value or a literature value thereof, the value is employed, and in a case where there is not such a value, the glass transition temperature can be measured by differential scanning calorimetry (DSC). The weight-average molecular weight (Mw) and the dispersity (Mw/Mn) of the homopolymer provided for measurement of Tg are set to 18,000 and 1.7, respectively. As the DSC apparatus, a thermal analysis DSC differential scanning calorimeter Q1000 Type manufactured by TA Instruments Japan Ltd. is used and a temperature raising rate is set to 10° C./min to perform the measurement.

Furthermore, the homopolymer provided for measurement for Tg may be synthesized with the corresponding monomer by a known method, and can be synthesized by, for example, a general dropwise polymerization method. An example of the measurement method is shown below.

54 parts by mass of propylene glycol monomethyl ether acetate (PGMEA) was heated at 80° C. under a nitrogen stream. While stirring the liquid, 125 parts by mass of a PGMEA solution including 21% by mass of a corresponding monomer and 0.35% by mass of 2,2'-dimethyl azobisisobutyrate was added dropwise thereto for 6 hours. After the completion of dropwise addition, the mixture is further stirred at 80° C. for 2 hours. The reaction solution is left to be cooled, then reprecipitated with a large amount of methanol/water (mass ratio of 9:1), and filtered, and the obtained solid is dried to obtain a homopolymer (Mw: 18,000, Mw/Mn: 1.7). The obtained homopolymer is provided for DSC measurement. The DSC apparatus and the temperature raising rate are as described above.

The monomer a1 is not particularly limited as long as a glass transition temperature (Tg) of a homopolymer formed therefrom is 50° C. or lower, and it is preferable that the Tg of the homopolymer formed from the monomer a1 is 30° C. or lower from the viewpoints of improving the resolution of a dot pattern and suppressing the roughness on a side wall of a resist pattern that may occur during etching. A lower limit of Tg of a homopolymer formed from the monomer a1 is not particularly limited, but is preferably −80° C. or higher, more preferably −70° C. or higher, still more preferably −60° C. or higher, and particularly preferably −50° C. or higher. It is preferable to set the lower limit of Tg of a homopolymer formed from the monomer a1 to the range since the fluidity of patterns during heating is suppressed and the verticality of dot patterns is further improved.

As the repeating unit (a1), a repeating unit that has a non-acid-decomposable alkyl group having 2 or more carbon atoms, which may include a heteroatom in a chain, is preferable from the viewpoint that a residual solvent can be more easily volatilized. In the present specification, an expression, "non-acid-decomposable", means that an acid generated by a photoacid generator has a property of not causing a leaving/decomposing reaction.

That is, more specific examples of the "non-acid-decomposable alkyl group" include an alkyl group that does not leave from the resin (A) by the action of an acid generated by a photoacid generator and an alkyl group that does not decompose by the action of an acid generated by a photoacid generator.

The non-acid-decomposable alkyl group may be either linear or branched.

Hereinafter, the repeating unit having a non-acid-decomposable alkyl group having 2 or more carbon atoms, which may include a heteroatom in a chain, will be described.

The non-acid-decomposable alkyl group having 2 or more carbon atoms, which may include a heteroatom in a chain, is not particularly limited, but examples thereof include an alkyl group having 2 to 20 carbon atoms and an alkyl group having 2 to 20 carbon atoms, which contains a heteroatom in a chain.

Examples of the alkyl group having 2 to 20 carbon atoms, which contains a heteroatom in a chain, include an alkyl group in which one or two or more of —CH$_2$-'s are substituted with —O—, —S—, —CO—, —NR$_6$—, or a divalent organic group formed by combination of two or more of these groups. R$_6$ represents a hydrogen atom or an alkyl group having 1 to 6 carbon atoms. Specific examples of the non-acid-decomposable alkyl group having 2 or more carbon atoms, which may include a heteroatom in a chain, include a methyl group, an ethyl group, a propyl group, a butyl group, a pentyl group, a hexyl group, a heptyl group, an octyl group, a nonyl group, a decyl group, a lauryl group, a stearyl group, an isobutyl group, a sec-butyl group, a 1-ethylpentyl group, a 2-ethylhexyl group, and a monovalent alkyl group in which one or two or more of —CH$_2$-'s are substituted with —O— or —O—CO—.

The number of carbon atoms of the non-acid-decomposable alkyl group having 2 or more carbon atoms, which may include a heteroatom in a chain, is preferably from 2 to 16, more preferably from 2 to 10, and still more preferably from 2 to 8. A lower limit of the number of carbon atoms of the non-acid-decomposable alkyl group having 2 or more carbon atoms is preferably 4 or more.

In addition, the non-acid-decomposable alkyl group having 2 or more carbon atoms may have a substituent (for example, the substituent T).

The repeating unit (a1) is preferably a repeating unit represented by General Formula (1-2).

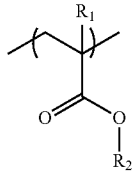

(1-2)

In General Formula (1-2), R$_1$ represents a hydrogen atom, a halogen atom, an alkyl group, or a cycloalkyl group. R$_2$ represents a non-acid-decomposable alkyl group having 2 or more carbon atoms, which may include a heteroatom in a chain.

The halogen atom represented by R$_1$ is not particularly limited, but examples thereof include a fluorine atom, a chlorine atom, a bromine atom, and an iodine atom.

The alkyl group represented by R$_1$ is not particularly limited, but examples thereof include an alkyl group having 1 to 10 carbon atoms, and specifically, a methyl group, an ethyl group, and a tert-butyl group. Among those, an alkyl group having 1 to 3 carbon atoms is preferable, and the methyl group is more preferable.

The cycloalkyl group represented by R$_1$ is not particularly limited, and examples thereof include a cycloalkyl group having 5 to 10 carbon atoms, and more specifically, a cyclohexyl group.

Among those, the hydrogen atom or the methyl group is preferable as R$_1$.

The definitions and the suitable aspects of the non-acid-decomposable alkyl group having 2 or more carbon atoms, which may include a heteroatom in a chain, represented by R$_2$, are as described above.

In addition, the repeating unit (a1) may be a repeating unit having a non-acid-decomposable alkyl group having a carboxyl group or a hydroxyl group, which may include a heteroatom in a chain, or a non-acid-decomposable cycloalkyl group having a carboxyl group or a hydroxyl group, which may include a heteroatom in a ring member, from the viewpoint that a residual solvent can be more easily volatilized.

Hereinafter, the repeating unit having a non-acid-decomposable alkyl group having a carboxyl group or a hydroxyl group, which may include a heteroatom in a chain, or a non-acid-decomposable cycloalkyl group having a carboxyl group or a hydroxyl group, which may include a heteroatom in a ring member, will be described.

The non-acid-decomposable alkyl group may be either linear or branched.

The number of carbon atoms of the non-acid-decomposable alkyl group is preferably 2 or more, and an upper limit of the number of carbon atoms of the non-acid-decomposable alkyl group is, for example, preferably 20 or less from the viewpoint that the Tg of the homopolymer is 50° C. or lower.

The non-acid-decomposable alkyl group which may include a heteroatom in a chain is not particularly limited, and examples thereof include an alkyl group having 2 to 20 carbon atoms and an alkyl group having 2 to 20 carbon atoms, which contains a heteroatom in a chain. In addition, at least one of the hydrogen atoms in the alkyl group is substituted with a carboxyl group or a hydroxyl group.

Examples of the alkyl group having 2 to 20 carbon atoms, which contains a heteroatom in a chain, include an alkyl group in which one or two or more of —CH$_2$-'s are substituted with —O—, —S—, —CO—, —NR$_6$—, or a divalent organic group formed by combination of two or more of these groups. R$_6$ represents a hydrogen atom or an alkyl group having 1 to 6 carbon atoms.

The number of carbon atoms of the non-acid-decomposable alkyl group which may include a heteroatom in a chain is preferably 2 to 16, more preferably 2 to 10, and still more preferably 2 to 8 from the viewpoint that the crack resistance is more excellent (cracks are hardly generated).

In addition, the non-acid-decomposable alkyl group may have a substituent (for example, the substituent T).

Specific examples of the repeating unit having a non-acid-decomposable alkyl group having a carboxyl group, which contains a heteroatom in a chain, include a repeating unit having the following structure.

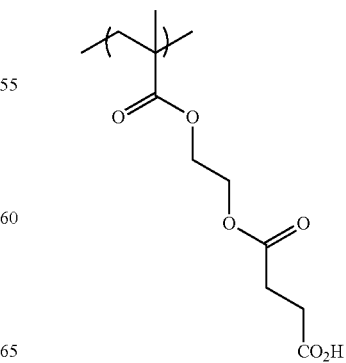

The number of carbon atoms of the non-acid-decomposable cycloalkyl group is preferably 5 or more, and an upper limit of the number of carbon atoms of the non-acid-decomposable cycloalkyl group is, for example, preferably 20 or less, more preferably 16 or less, and still more preferably 10 or less from the viewpoint that the Tg of the homopolymer is set to 50° C. or lower.

The non-acid-decomposable cycloalkyl group which may include a heteroatom in a ring member is not particularly limited, and examples thereof include a cycloalkyl group having 5 to 20 carbon atoms (more specifically, a cyclohexyl group), and a cycloalkyl group having 5 to 20 carbon atoms, which contains a heteroatom in a ring member. In addition, at least one of the hydrogen atoms in the cycloalkyl group is substituted with a carboxyl group or a hydroxyl group. Examples of the cycloalkyl group having 5 to 20 carbon atoms, which contains a heteroatom in a ring member, include a cycloalkyl group in which one or two or more of —$CH_2$-'s are substituted with —O—, —S—, —CO—, —$NR_6$—, or a divalent organic group formed by combination of two or more of these groups. $R_6$ represents a hydrogen atom or an alkyl group having 1 to 6 carbon atoms.

In addition, the non-acid-decomposable cycloalkyl group may have a substituent (for example, the substituent group T).

As the repeating unit having a non-acid-decomposable alkyl group having a carboxyl group or a hydroxyl group, which may include a heteroatom in a chain, or a non-acid-decomposable cycloalkyl group having a carboxyl group or a hydroxyl group, which may include a heteroatom in a ring member, a repeating unit represented by General Formula (1-3) is particularly preferable from the viewpoint that the effect of the present invention is more excellent.

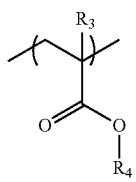

(1-3)

In General Formula (1-3), $R_3$ represents a halogen atom, a hydrogen atom, an alkyl group, or a cycloalkyl group. $R_4$ represents a non-acid-decomposable alkyl group having a carboxyl group or a hydroxyl group, which may include a heteroatom in a chain, or a non-acid-decomposable cycloalkyl group having a carboxyl group or a hydroxyl group, which may include a heteroatom in a ring member.

In General Formula (1-3), $R_3$ has the same definition as $R_1$ described above and a preferred aspect thereof is also the same.

The definition and the suitable aspect of the non-acid-decomposable alkyl group having a carboxyl group or a hydroxyl group, which may include a heteroatom in a chain, or the non-acid-decomposable cycloalkyl group having a carboxyl group or a hydroxyl group, which may include a heteroatom in a ring member, each represented by $R_4$, is as described above.

Among those, as $R_4$, the non-acid-decomposable cycloalkyl group having a carboxyl group or a hydroxyl group, which may include a heteroatom in a ring member, is preferable. Examples of this aspect include a repeating unit having the following structure.

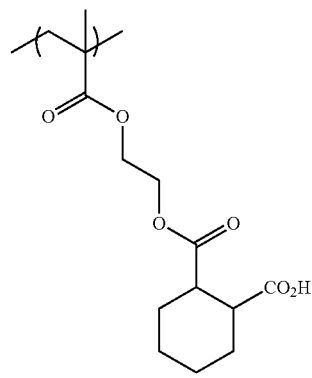

Examples of the monomer a1 include ethyl acrylate (−22° C.), n-propyl acrylate (−37° C.), isopropyl acrylate (−5° C.), n-butyl acrylate (−55° C.), n-butyl methacrylate (20° C.), n-hexyl acrylate (−57° C.), n-hexyl methacrylate (−5° C.), n-octyl methacrylate (−20° C.), 2-ethylhexyl acrylate (−70° C.), isononyl acrylate (−82° C.), lauryl methacrylate (−65° C.), 2-hydroxyethyl acrylate (−15° C.), 2-hydroxypropyl methacrylate (26° C.), 1-[2-(methacryloyloxy)ethyl]succinate (9° C.), 2-ethylhexyl methacrylate (−10° C.), sec-butyl acrylate (−26° C.), methoxypolyethylene glycol monomethacrylate (n=2) (−20° C.), and hexadecyl acrylate (35° C.). Further, the Tg (° C.) in a case where the monomer is used to form a homopolymer is in the parenthesis.

Furthermore, methoxypolyethylene glycol monomethacrylate (n=2) is a compound having the following structure.

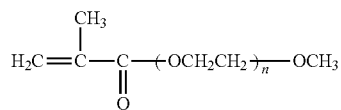

n = 2

The monomer a1 is preferably n-butyl acrylate, n-hexyl methacrylate, n-octyl methacrylate, 2-ethylhexyl methacrylate, 2-ethylhexyl acrylate, lauryl methacrylate, hexadecyl acrylate, 2-hydroxyethyl acrylate, or a compound represented by the following MA-5.

MA-5

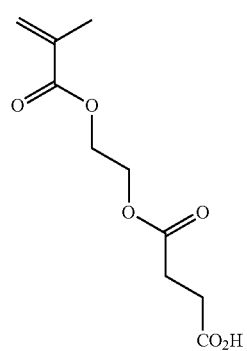

The resin (A) may include one kind or two or more kinds of the repeating units (a1).

In the resin (A), a content of the repeating units (a1) (in a case where a plurality of the repeating units (a1) are present, a total thereof) is preferably 5% by mole or more, and more preferably 10% by mole or more, and is preferably 50% by mole or less, more preferably 40% by mole or less, and still more preferably 30% by mole or less with respect to all repeating units of the resin (A). Among those, the content of the repeating unit (a1) in the resin (A) (a total content thereof in a case where a plurality of the repeating units (a1) are present) is preferably 5% to 50% by mole, more preferably 5% to 40% by mole, and still more preferably 5% to 30% by mole with respect to all repeating units of the resin (A).

[Repeating Unit (a4) Having Phenolic Hydroxyl Group]

The resin (A) may have a repeating unit (a4) having a phenolic hydroxyl group.

By incorporating the repeating unit (a4) into the resin (A), the dissolution rate during alkaline development is excellent and the etching resistance is also excellent.

The repeating unit having a phenolic hydroxyl group is not particularly limited, and examples thereof include a hydroxystyrene repeating unit or a hydroxystyrene (meth) acrylate repeating unit. As the repeating unit having a phenolic hydroxyl group, a repeating unit represented by General Formula (I) is also preferable.

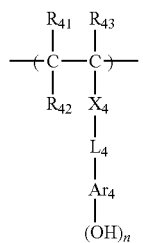
(I)

In the formula, $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or a divalent linking group.

$Ar_4$ represents an (n+1)-valent aromatic hydrocarbon group, and in a case of being bonded to $R_{42}$ to form a ring, $Ar_4$ represents an (n+2)-valent aromatic hydrocarbon group. n represents an integer of 1 to 5.

For the purpose of increasing the polarity of the repeating unit represented by General Formula (I), it is preferable that n is an integer of 2 or more, or $X_4$ is —COO— or —CONR$_{64}$—.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle. A monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group represented by each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents an (n+1)-valent aromatic hydrocarbon group. The divalent aromatic hydrocarbon group in a case where n is 1 may have a substituent, and for example, an arylene group having 6 to 18 carbon atoms, such as a phenylene group, a tolylene group, a naphthylene group, and an anthracenylene group, or an aromatic hydrocarbon group including a heterocycle such as thiophene, furan, pyrrole, benzothiophene, benzofuran, benzopyrrole, triazine, imidazole, benzimidazole, triazole, thiadiazole, and thiazole is preferable.

Specific examples of the (n+1)-valent aromatic hydrocarbon group in a case where n is an integer of 2 or more suitably include groups formed by excluding any (n−1) hydrogen atoms from the above-described specific examples of the divalent aromatic hydrocarbon group.

The (n+1)-valent aromatic hydrocarbon group may further have a substituent.

Examples of the substituent which can be contained in the alkyl group, the cycloalkyl group, the alkoxycarbonyl group, and the (n+1)-valent aromatic hydrocarbon group as mentioned above include the alkyl group; the alkoxy group such as a methoxy group, an ethoxy group, a hydroxyethoxy group, a propoxy group, a hydroxypropoxy group, and a butoxy group; an aryl group such as a phenyl group; and the like, as mentioned for each of $R_{41}$, $R_{42}$, and $R_{43}$ in General Formula (I).

Preferred examples of the alkyl group of $R_{64}$ in —CONR$_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and the alkyl group is more preferably an alkyl group having 8 or less carbon atoms.

As $X_4$, a single bond, —COO—, or —CONH— is preferable, and the single bond or —COO— is more preferable.

As the divalent linking group as $L_4$, an alkylene group is preferable, and as the alkylene group, an alkylene group having 1 to 8 carbon atoms, such as a methylene group, an ethylene group, a propylene group, a butylene group, a hexylene group, and an octylene group, each of which may have a substituent, is preferable.

As $Ar_4$, an aromatic hydrocarbon group having 6 to 18 carbon atoms, which may have a substituent, is preferable, and a benzene ring group, a naphthalene ring group, or a biphenylene ring group is more preferable. Among those, the repeating unit represented by General Formula (I) is preferably a repeating unit derived from hydroxystyrene. That is, $Ar_4$ is preferably the benzene ring group.
Specific examples of the repeating unit having a phenolic hydroxyl group are shown below, but the present invention is not limited thereto. In the formula, a represents 1 or 2.
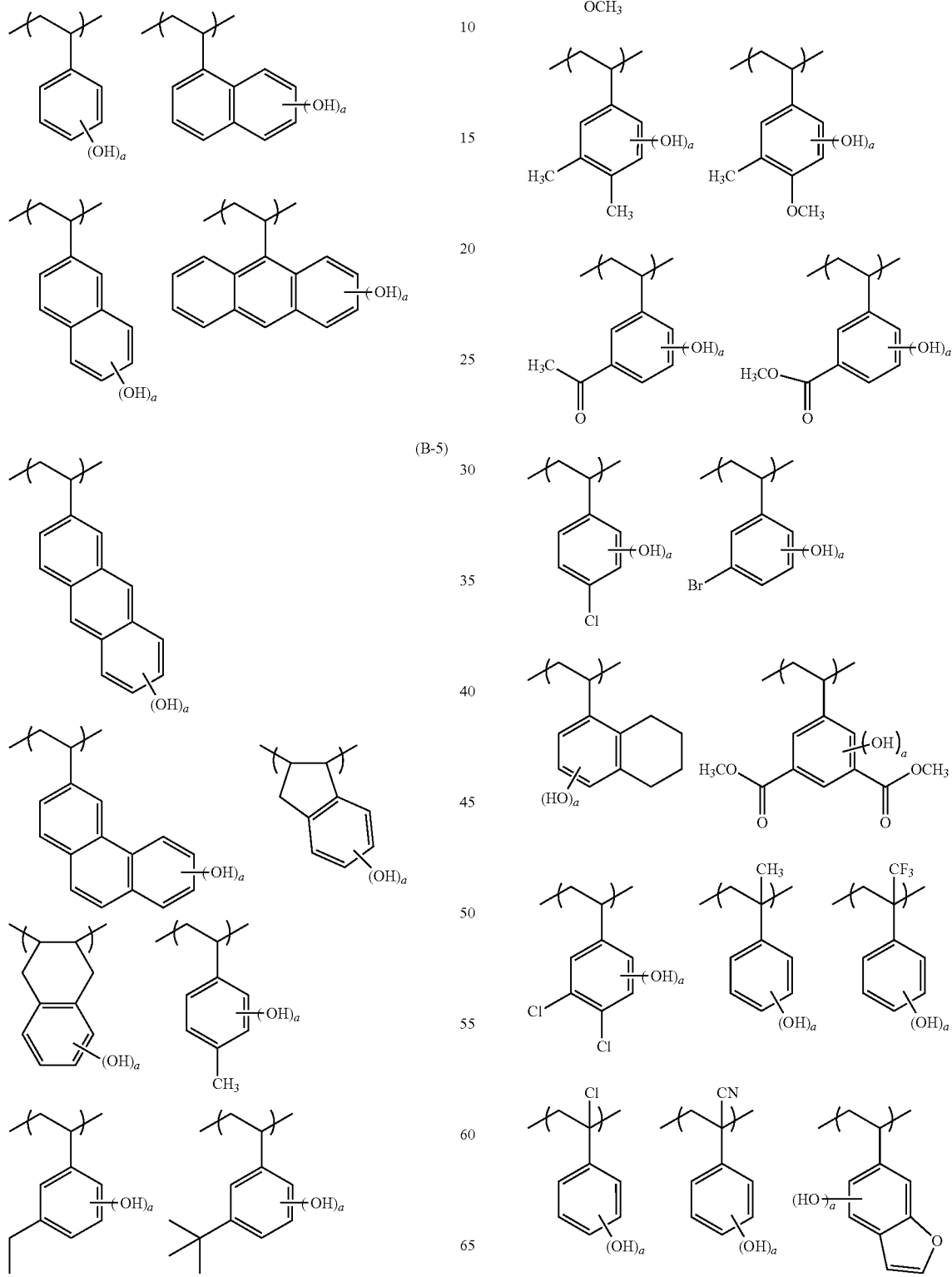

-continued

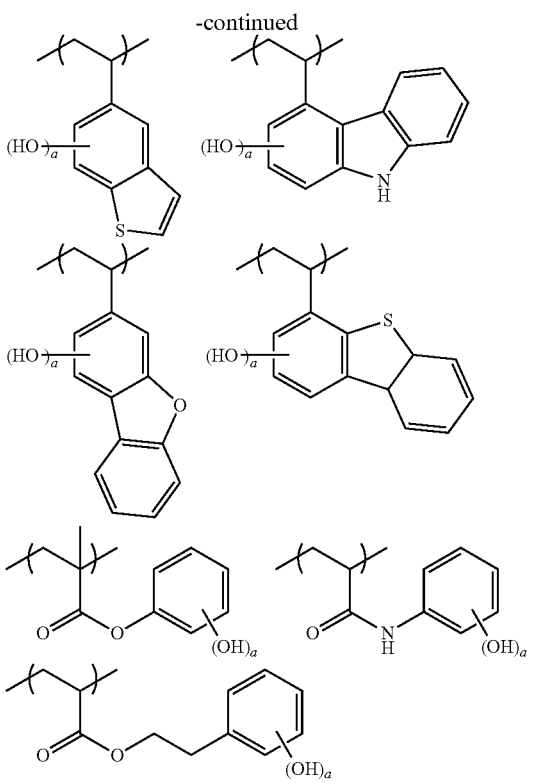

This resin (A) may have one kind of the repeating unit (a4) alone or may have a combination of two or more kinds thereof.

A content of the repeating unit (a4) in the resin (A) is preferably 40% by mole or more, more preferably 50% by mole or more, and still more preferably 60% by mole or more with respect to all repeating units in the resin (A). In addition, a content of the repeating unit (a4) is preferably 85% by mole or less, and more preferably 80% by mole or less with respect to all repeating units in the resin (A).

The resin (A) may further have various constitutional units, in addition to the constitutional units, for the purpose of adjusting dry etching resistance, suitability for a standard developer, adhesiveness to a substrate, a resist profile, or resolving power, heat resistance, sensitivity, and the like which are general characteristics required for a resist. Examples of such a constitutional unit include constitutional units corresponding to the other monomers, but are not particularly limited thereto.

Examples of such other monomers include a compound having one addition-polymerizable unsaturated bond, selected from acrylic acid esters, methacrylic acid esters, acrylamides, methacrylamides, allyl compounds, vinyl ethers, and vinyl esters.

In addition to these, an addition-polymerizable unsaturated compound that is copolymerizable with the monomers corresponding to various constitutional units as described above may be copolymerized.

In the resin (A), the molar ratio of each repeating constitutional unit contained is appropriately set in order to adjust various types of performance.

In a case where the actinic ray-sensitive or radiation-sensitive resin composition according to the embodiment of the present invention is for exposure with an argon fluoride (ArF) laser, it is preferable that the resin (A) does not substantially have an aromatic group from the viewpoint of the transmittance of ArF light. More specifically, a content of the constitutional unit having an aromatic group in all constitutional units of the resin (A) is preferably 5% by mole or less, more preferably 3% by mole or less, and still more preferably ideally 0% by mole, that is, has no constitutional unit having an aromatic group. In addition, the resin (A) preferably has a monocyclic or polycyclic alicyclic hydrocarbon structure.

It is preferable that all constitutional units in the resin (A) are constituted with (meth)acrylate-based constitutional units. In this case, any of a resin in which all of the constitutional units are methacrylate-based constitutional units, a resin in which all of the constitutional units are acrylate-based constitutional units, and a resin in which all of the constitutional units are methacrylate-based constitutional units and acrylate-based constitutional units can be used, but it is preferable that a content of the acrylate-based constitutional units is 50% by mole or less with respect to all constitutional units of the resin (A).

In a case where the actinic ray-sensitive or radiation-sensitive resin composition according to the embodiment of the present invention is for exposure with krypton fluoride (KrF), for exposure with electron beams (EB), or for exposure with extreme ultraviolet rays (EUV), it is preferable that the resin (A) includes a constitutional unit having an aromatic hydrocarbon group. It is more preferable that the resin (A) includes a constitutional unit having a phenolic hydroxyl group.

Examples of the constitutional unit having a phenolic hydroxyl group include the repeating unit (a4).

In a case where the actinic ray-sensitive or radiation-sensitive resin composition according to the embodiment of the present invention is for KrF exposure, EB exposure, or EUV exposure, it is preferable that the resin (A) has a structure in which a hydrogen atom of the phenolic hydroxyl group is protected with a group (leaving group) that leaves through decomposition by the action of an acid.

A content of the constitutional unit having an aromatic hydrocarbon group included in the resin (A) is preferably 30% by mole to 100% by mole, more preferably 40% by mole to 100% by mole, and still more preferably 50% by mole to 100% by mole with respect to all constitutional units in the resin (A).

The weight-average molecular weight of the resin (A) is preferably 1,000 to 200,000, more preferably 2,000 to 20,000, still more preferably 3,000 to 15,000, and particularly preferably 3,000 to 11,000.

The dispersity (Mw/Mn) is preferably 1.0 to 3.0, more preferably 1.0 to 2.6, still more preferably 1.0 to 2.0, and particularly preferably 1.1 to 2.0.

Specific examples of the resin (A) include resins A-1 to A-17 used in Examples, but are not limited thereto.

The resin (A) may be used alone or in combination of two or more kinds thereof.

A content of the resin (A) is preferably 20% by mass or more, more preferably 40% by mass or more, still more preferably 60% by mass or more, and particularly preferably 80% by mass or more with respect to the total solid content of the actinic ray-sensitive or radiation-sensitive resin composition according to the embodiment of the present invention. An upper limit thereof is not particularly limited, but is preferably 99.5% by mass or less, more preferably 99% by mass or less, and still more preferably 97% by mass or less.

[Alkali-Soluble Resin Having Phenolic Hydroxyl Group]

In a case where the actinic ray-sensitive or radiation-sensitive resin composition according to the embodiment of the present invention contains a crosslinking agent (G)

which will be described later, it is also preferable that the actinic ray-sensitive or radiation-sensitive resin composition according to the embodiment of the present invention is an alkali-soluble resin having a phenolic hydroxyl group (hereinafter also referred to as a "resin (C)"). It is preferable that the resin (C) has a constitutional unit having a phenolic hydroxyl group.

In this case, it is typical that a negative-tone pattern is suitably formed.

The crosslinking agent (G) may be in the state of being supported on the resin (C).

Furthermore, among the resins (C), those corresponding to a resin having a polarity that increases by the action of an acid are treated as a resin having a polarity that increases by the action of an acid. In addition, in that case, the actinic ray-sensitive or radiation-sensitive resin composition according to the embodiment of the present invention may include the resin having a polarity that increases by the action of an acid as the resin (C), and may also include at least the resin (C) other than the resin having a polarity that increases by the action of an acid, and the resin having a polarity that increases by the action of an acid.

The resin (C) may contain the above-mentioned acid-decomposable group.

The constitutional unit having the phenolic hydroxyl group contained in the resin (C) is not particularly limited, but is preferably the repeating unit (a4).

The resin (C) may be used alone or in combination of two or more kinds thereof.

A content of the resin (C) in the total solid content of the actinic ray-sensitive or radiation-sensitive resin composition according to the embodiment of the present invention is preferably 30% by mass or more, more preferably 40% by mass or more, and still more preferably 50% by mass or more. An upper limit thereof is not particularly limited, but is preferably 99% by mass or less, more preferably 90% by mass or less, and still more preferably 85% by mass or less.

As the resin (C), the resins disclosed in paragraphs 0142 to 0347 of US2016/0282720A can be suitably used.

[Hydrophobic Resin]

It is also preferable that the actinic ray-sensitive or radiation-sensitive resin composition according to the embodiment of the present invention contains a hydrophobic resin (also referred to as a "hydrophobic resin (E)").

The actinic ray-sensitive or radiation-sensitive resin composition according to the embodiment of the present invention preferably includes at least the hydrophobic resin (E) other than a resin having a polarity that increases by the action of an acid, and the resin having a polarity that increases by the action of an acid.

By incorporating the hydrophobic resin (E) into the actinic ray-sensitive or radiation-sensitive resin composition according to the embodiment of the present invention, it is possible to control the static/dynamic contact angle at a surface of an actinic ray-sensitive or radiation-sensitive film. Thus, it is possible to improve development characteristics, suppress generation of out gas, improve immersion liquid followability upon liquid immersion exposure, and reduce liquid immersion defects, for example.

Although it is preferable that the hydrophobic resin (E) is designed to be unevenly distributed on a surface of the resist film, it does not necessarily need to have a hydrophilic group in the molecule as different from the surfactant, and does not need to contribute to uniform mixing of polar/non-polar materials.

In addition, in the present invention, a resin having a fluorine atom shall be treated as a hydrophobic resin and a fluorine-containing resin which will be described later. Further, it is preferable that the resin having a constitutional unit having an acid-decomposable group has no fluorine atom.

The hydrophobic resin (E) is preferably a resin including a constitutional unit having at least one selected from the group consisting of a "fluorine atom", a "silicon atom", and a "$CH_3$ partial structure which is contained in a side chain moiety of a resin" from the viewpoint of uneven distribution on a film surface layer.

In a case where the hydrophobic resin (E) includes a fluorine atom or a silicon atom, the fluorine atom or the silicon atom described above in the hydrophobic resin (E) may be included in the main chain of a resin or may be included in a side chain.

It is preferable that the hydrophobic resin (E) has at least one group selected from the following group of (x) to (z):

(x) an acid group, and (y) a group that decomposes by the action of an alkali developer to increase a solubility in the alkali developer (hereinafter also referred to as a polarity conversion group), and (z) a group that decomposes by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

As the acid group, the fluorinated alcohol group (preferably a hexafluoroisopropanol group), the sulfonimide group, or the bis(alkylcarbonyl)methylene group is preferable.

Examples of the group (y) that decomposes by the action of an alkali developer to increase a solubility in the alkali developer include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—$OSO_2$O—), and a sulfonic acid ester group (—$SO_2$O—), and the lactone group or the carboxylic acid ester group (—COO—) is preferable.

Examples of the constitutional units including these groups include a constitutional unit in which the group is directly bonded to the main chain of a resin, such as a constitutional unit with an acrylic acid ester or a methacrylic acid ester. In this constitutional unit, the group may be bonded to the main chain of the resin through a linking group. Alternatively, the constitutional unit may also be incorporated into a terminal of the resin by using a polymerization initiator or chain transfer agent having the group during polymerization.

Examples of the constitutional unit having a lactone group include the same ones as the constitutional unit having a lactone structure as described earlier in the section of the resin (A).

A content of the constitutional unit having a group (y) that decomposes by the action of an alkali developer to increase a solubility in the alkali developer is preferably 1% to 100% by mole, more preferably 3% to 98% by mole, and still more preferably 5% to 95% by mole with respect to all constitutional units in the hydrophobic resin (E).

Examples of the constitutional unit having a group (z) that decomposes by the action of an acid in the hydrophobic resin (E) include the same ones as the constitutional units having an acid-decomposable group, mentioned in the resin (A). The constitutional unit having a group (z) that decomposes by the action of an acid may have at least one of a fluorine atom or a silicon atom. A content of the constitutional units having a group (z) that decomposes by the action of an acid is preferably 1% by mole to 80% by mole, more preferably 10% by mole to 80% by mole, and still more preferably 20% by mole to 60% by mole with respect to all constitutional units in the resin (E).

The hydrophobic resin (E) may further have a constitutional unit which is different from the above-mentioned constitutional units.

A content of the constitutional units including a fluorine atom is preferably 10% by mole to 100% by mole, and more preferably 30% by mole to 100% by mole with respect to all constitutional units included in the hydrophobic resin (E). In addition, the content of the constitutional units including a silicon atom is preferably 10% by mole to 100% by mole, and more preferably 20% by mole to 100% by mole with respect to all constitutional units included in the hydrophobic resin (E).

On the other hand, in a case where the hydrophobic resin (E) includes a $CH_3$ partial structure in the side chain moiety thereof, it is also preferable that the hydrophobic resin (E) has a form not having substantially any one of a fluorine atom and a silicon atom. Further, it is preferable that the hydrophobic resin (E) is substantially composed of only constitutional units, which are composed of only atoms selected from a carbon atom, an oxygen atom, a hydrogen atom, a nitrogen atom, and a sulfur atom.

A weight-average molecular weight of the hydrophobic resin (E) in terms of standard polystyrene is preferably 1,000 to 100,000, and more preferably 1,000 to 50,000.

A total content of residual monomers and oligomer components included in the hydrophobic resin (E) is preferably 0.01% by mass to 5% by mass, and more preferably 0.01% by mass to 3% by mass. In addition, the dispersity (Mw/Mn) is preferably in the range of 1 to 5, and more preferably in the range of 1 to 3.

As the hydrophobic resin (E), known resins can be appropriately selected and used alone or as a mixture. For example, the known resins disclosed in paragraphs 0451 to 0704 of US2015/0168830A and paragraphs 0340 to 0356 of US2016/0274458A can be suitably used as the hydrophobic resin (E). Further, the constitutional units disclosed in paragraphs 0177 to 0258 of US2016/0237190A are also preferable as a constitutional unit constituting the hydrophobic resin (E).

—Fluorine-Containing Resin—

The hydrophobic resin (E) is preferably a resin including a fluorine atom (also referred to as a "fluorine-containing resin").

In a case where the hydrophobic resin (E) includes a fluorine atom, it is preferable that the hydrophobic resin (E) is a resin having an alkyl group having a fluorine atom, a cycloalkyl group having a fluorine atom, or an aryl group having a fluorine atom as a partial structure having a fluorine atom.

The alkyl group having a fluorine atom is a linear or branched alkyl group in which at least one hydrogen atom is substituted with a fluorine atom, preferably has 1 to 10 carbon atoms, and more preferably has 1 to 4 carbon atoms.

The cycloalkyl group having a fluorine atom is a monocyclic or polycyclic cycloalkyl group in which at least one hydrogen atom is substituted with a fluorine atom.

The aryl group having a fluorine atom is an aryl group such as a phenyl group and a naphthyl group, in which at least one hydrogen atom is substituted with a fluorine atom.

As the alkyl group having a fluorine atom, the cycloalkyl group having a fluorine atom, and the aryl group having a fluorine atom, groups represented by Formulae F2 to F4 are preferable.

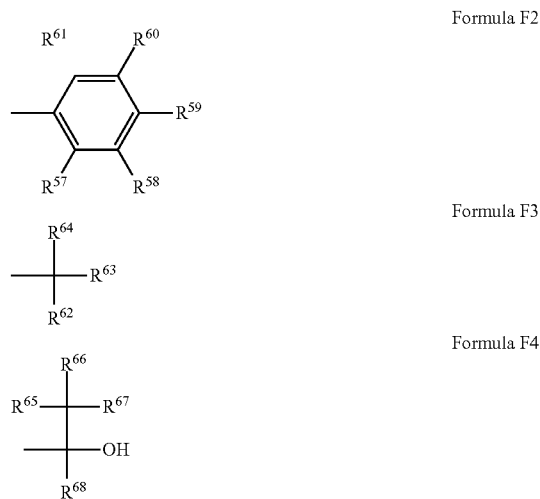

In Formulae F2 to F4, $R^7$ to $R^{68}$ each independently represent a hydrogen atom, a fluorine atom, or an (linear or branched)alkyl group. It should be noted that at least one of $R^{57}$, . . . , or $R^{61}$, at least one of $R^{62}$, $R^{63}$, or $R^{64}$, and at least one of $R^{65}$, . . . , or $R^{68}$ each independently represent a fluorine atom or an alkyl group in which at least one hydrogen atom is substituted with a fluorine atom.

It is preferable that all of $R^{57}$ to $R^{61}$ and $R^{65}$ to $R^{67}$ are fluorine atoms. $R^{62}$, $R^{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R^{62}$ and $R^{63}$ may be linked to each other to form a ring.

Among those, from the viewpoint that the effect according to the embodiment of the present invention is more excellent, it is preferable that the fluorine-containing resin has alkali decomposability.

The expression, the fluorine-containing resin having alkali decomposability, means that after 10 minutes from adding 100 mg of a fluorine-containing resin to a mixed liquid of 2 mL of a buffer solution at pH 10 and 8 mL of THF and leaving the mixture to stand at 40° C., 30% by mole or more of a total amount of the decomposable groups in the fluorine-containing resin is hydrolyzed. Further, the decomposition rate can be calculated from a ratio of the raw materials to the decomposition products by means of NMR analysis.

From the viewpoints of tolerance of a focal depth, pattern linearity, improvement of development characteristics, suppression of out gas, improvement of immersion liquid followability in liquid immersion exposure, and reduction of immersion defects, it is preferable that the fluorine-containing resin has a constitutional unit represented by Formula X.

In addition, from the viewpoints of tolerance of a focal depth, pattern linearity, improvement of development characteristics, suppression of out gas, improvement of immersion liquid followability in liquid immersion exposure, and reduction of immersion defects, it is preferable that the actinic ray-sensitive or radiation-sensitive resin composition according to the embodiment of the present invention further includes a fluorine-containing resin having a constitutional unit represented by Formula X.

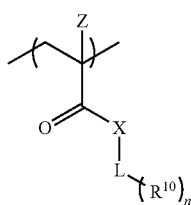

Formula X

In Formula X, Z represents a halogen atom, a group represented by $R^{11}OCH_2$—, or a group represented by $R^{12}OC(=O)CH_2$—, $R^{11}$ and $R^{12}$ each independently represent a substituent, and X represents an oxygen atom or a sulfur atom. L represents an (n+1)-valent linking group, $R^{10}$ represents a group having a group that decomposes by the action of the aqueous alkali solution to increase a solubility of the fluorine-containing resin in the aqueous alkali solution, n represents a positive integer, and in a case where n is 2 or more, a plurality of $R^{10}$'s may be the same as or different from each other.

Examples of the halogen atom of Z include a fluorine atom, a chlorine atom, a bromine atom, and an iodine atom, and the fluorine atom is preferable.

Examples of the substituent as each of the $R^{11}$ and $R^{12}$ include an alkyl group (preferably having 1 to 4 carbon atoms), a cycloalkyl group (preferably having 6 to 10 carbon atoms), and an aryl group (preferably having 6 to 10 carbon atoms). Further, the substituent as each of $R^{11}$ and $R^{12}$ may further have a substituent, and examples of such additional substituent include an alkyl group (preferably having 1 to 4 carbon atoms), a halogen atom, a hydroxyl group, an alkoxy group (preferably having 1 to 4 carbon atoms), and a carboxyl group.

The linking group as L is preferably a divalent or trivalent linking group (in other words, n is preferably 1 or 2), and more preferably the divalent linking group (in other words, n is preferably 1). The linking group as L is preferably a linking group selected from the group consisting of an aliphatic group, an aromatic group, and a combination thereof.

For example, in a case where n is 1 and the linking group as L is a divalent linking group, examples of the divalent aliphatic group include an alkylene group, an alkenylene group, an alkynylene group, and a polyalkyleneoxy group. Among those, the alkylene group or the alkenylene group is preferable, and the alkylene group is more preferable.

The divalent aliphatic group may have either a chain structure or a cyclic structure, but preferably has the chain structure rather than the cyclic structure, and preferably has a linear structure rather than the branch-chained structure. The divalent aliphatic group may have a substituent and examples of the substituent include a halogen atom (a fluorine atom, a chlorine atom, a bromine atom, or an iodine atom), a hydroxyl group, a carboxyl group, an amino group, a cyano group, an aryl group, an alkoxy group, an aryloxy group, an acyl group, an alkoxycarbonyl group, an aryloxy-carbonyl group, an acyloxy group, a monoalkylamino group, a dialkylamino group, an arylamino group, and a diarylamino group.

Examples of the divalent aromatic group include arylene groups. Among those, the phenylene group and the naphthylene group are preferable.

The divalent aromatic group may have a substituent, and examples of the substituent include an alkyl group, in addition to the examples of the substituent with regard to the divalent aliphatic group.

In addition, L may be a divalent group formed by removing two hydrogen atoms at any position from the structure represented by each of Formula LC1-1 to Formula LC1-21 or Formula SL1-1 to Formula SL-3 as described above.

In a case where n is 2 or more, specific examples of the (n+1)-valent linking group include groups formed by removing any (n−1) hydrogen atoms from the specific examples of the divalent linking group as described above.

Specific examples of L include the following linking groups.

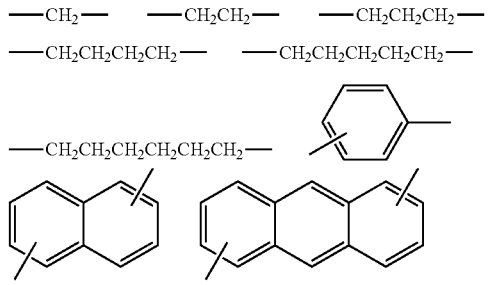

Moreover, these linking groups may further have a substituent as described above.

As $R^{10}$, a group represented by Formula W is preferable.

—Y—$R^{20}$  Formula W

In Formula W, Y represents a group that decomposes by the action of an aqueous alkali solution to increase a solubility in the aqueous alkali solution. $R^{20}$ represents an electron-withdrawing group.

Examples of Y include a carboxylic acid ester group (—COO— or OCO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—), and a sulfonic acid ester group (—SO$_2$O—), and the carboxylic acid ester group is preferable.

As the electron-withdrawing group, a partial structure represented by Formula EW is preferable. * in Formula EW represents a bonding site directly linked to a group Y in Formula W.

Formula EW

In Formula EW, $n^{ew}$ is a repetition number of the linking groups represented by —C($R^{ew1}$)($R^{ew2}$)— and represents an integer of 0 or 1. A case where $n^ew$ is 0 indicates that the bonding is formed by a single bond and $Y^{ew1}$ is directly bonded.

Examples of $Y^{ew1}$ include a halogen atom, a cyano group, a nitro group, a halo(cyclo)alkyl group or haloaryl group represented by —C($R^{f1}$)($R^f$)—$R^{f3}$ which will be described later, an oxy group, a carbonyl group, a sulfonyl group, a sulfinyl group, and a combination thereof (It should be noted that in a case where $Y^{ew1}$ is a halogen atom, a cyano group, or a nitro group, $n^{ew}$ is 1.)

$R^{ew1}$ and $R^{ew2}$ each independently represent any group, and examples of the group include a hydrogen atom, an alkyl group (preferably having 1 to 8 carbon atoms), a cycloalkyl group (preferably having 3 to 10 carbon atoms), or an aryl group (preferably having 6 to 10 carbon atoms).

At least two of $R^{ew1}$, $R^{ew2}$, or $Y^{ew1}$ may be linked to each other to form a ring. In addition, the "halo(cyclo)alkyl group" represents an alkyl group or cycloalkyl group which is at least partially halogenated, and the "haloaryl group" represents an aryl group which is at least partially halogenated.

As $Y^{ew1}$, a halogen atom, a halo(cyclo)alkyl group represented by —C($R^{f1}$)($R^f$)—$R^{f3}$, or a haloaryl group is preferable.

$R^{f1}$ represents a halogen atom, a perhaloalkyl group, a perhalocycloalkyl group, or a perhaloaryl group, and is preferably a fluorine atom, a perfluoroalkyl group, or a perfluorocycloalkyl group, and more preferably the fluorine atom or a trifluoromethyl group.

$R^{f1}$ and $R^{f3}$ each independently represent a hydrogen atom, a halogen atom, or an organic group, and $R^{f2}$ and $R^{f3}$ may be linked to each other to form a ring. Examples of the organic group include an alkyl group, a cycloalkyl group, and an alkoxy group, and these may be substituted with a halogen atom (preferably a fluorine atom). It is preferable that $R^{f2}$ and $R^{f3}$ are each a (halo)alkyl group or a (halo)cycloalkyl group. It is more preferable that $R^{f3}$ represents the same group as $R^{f1}$ or is linked to $R^{f3}$ to form a ring.

Examples of the ring formed by the linking of $R^{f2}$ and $R^{f3}$ include a (halo)cycloalkyl ring.

The (halo)alkyl group in each of $R^{f1}$ to $R^{f3}$ may be linear or branched, and the linear (halo)alkyl group preferably has 1 to 30 carbon atoms, and more preferably 1 to 20 carbon atoms.

The (halo)cycloalkyl group in each of $R^{f1}$ to $R^{f3}$, or the ring formed by the linking of $R^{f2}$ and $R^{f3}$ may be monocyclic or polycyclic. In a case where the (halo)cycloalkyl group is polycyclic, the (halo)cycloalkyl group may be bridged. That is, in this case, the (halo)cycloalkyl group may have a crosslinked structure.

Examples of these (halo)cycloalkyl groups include those represented by the following formulae, and groups formed by halogenating the groups. In addition, some of the carbon atoms in the cycloalkyl group may be substituted with heteroatoms such as an oxygen atom.

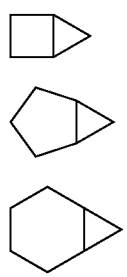

(1)

(2)

(3)

-continued

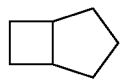

(4)

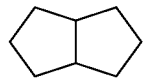

(5)

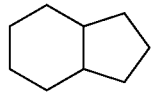

(6)

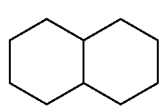

(7)

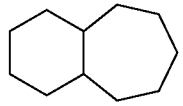

(8)

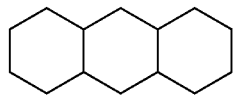

(9)

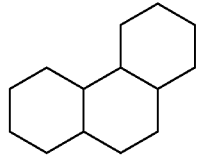

(10)

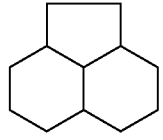

(11)

(12)

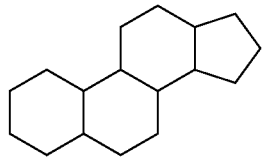

(13)

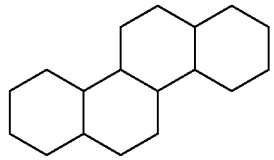

(14)

-continued
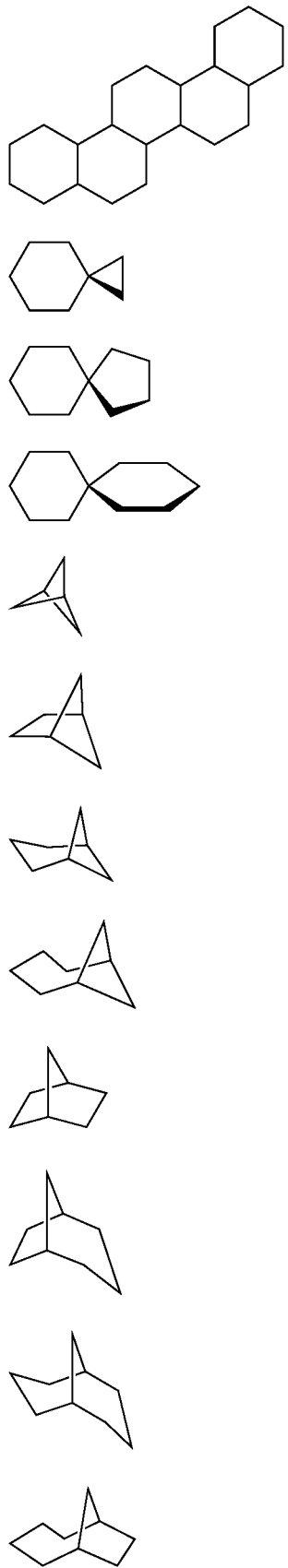
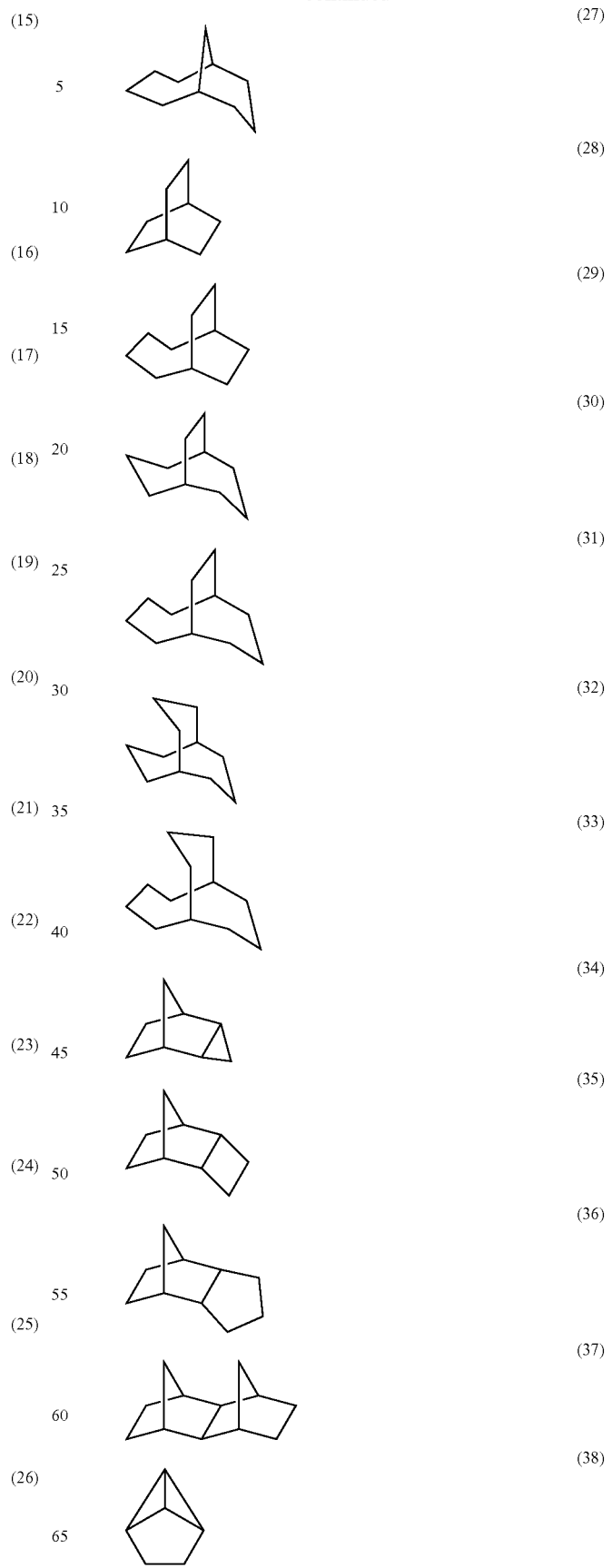

-continued

(39) 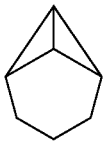

(40) 

(41) 

(42) 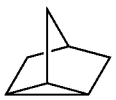

(43) 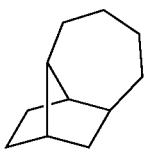

(44) 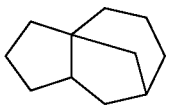

(45) 

(46) 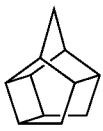

(47) 

(48) 

(49) 

(50) 

As the (halo)cycloalkyl group in each of $R^{f2}$ and $R^{f3}$, or a ring formed by the linking of $R^{f2}$ and $R^{f3}$, a fluorocycloalkyl group represented by $-C_{(n)}F_{(2n-2)}H$ is preferable. Here, the number n of carbon atoms is not particularly limited, but is preferably 5 to 13, and more preferably 6.

Examples of the (per)haloaryl group in $Y^{ew1}$ or $R^{f1}$ include a perfluoroaryl group represented by $-C_{(n)}F_{(n-1)}$. Here, the number n of carbon atoms is not particularly limited, but is preferably 5 to 13, and more preferably 6.

As a ring formed by the mutual linking of at least two of $R^{ew1}$, $R^{ew2}$, or $Y^{ew1}$, a cycloalkyl group or a heterocyclic group is preferable.

Each of the groups and the rings constituting the partial structure represented by Formula EW may further have a substituent.

In Formula W, $R^{20}$ is preferably an alkyl group substituted with one or more selected from the group consisting of a halogen atom, a cyano group, and a nitro group, more preferably an alkyl group substituted with a halogen atom (haloalkyl group), and still more preferably a fluoroalkyl group. The alkyl group substituted with one or more selected from the group consisting of a halogen atom, a cyano group, and a nitro group preferably has 1 to 10 carbon atoms, and more preferably 1 to 5 carbon atoms.

More specifically, $R^{20}$ is preferably an atomic group represented by $-C(R^{t1})(R^{t'1})(R^{t'2})$ or $-C(R^{t1})(R^{t2})(R^{t'1})$. $R^{t1}$ and $R^{t2}$ each independently represent a hydrogen atom or an alkyl group not substituted with an electron-withdrawing group (preferably an unsubstituted alkyl group). $R^{t'1}$ and $R^{t'2}$ each independently represent a halogen atom, a cyano group, a nitro group, or a perfluoroalkyl group.

The alkyl group as each of $R^{t1}$ and $R^{t2}$ may be linear or branched, and preferably has 1 to 6 carbon atoms.

The perfluoroalkyl group as each of $R^{t'1}$ and $R^{t'2}$ may be linear or branched, and preferably has 1 to 6 carbon atoms.

Specific preferred examples of $R^{20}$ include $-CF_3$, $-C_2F_5$, $-C_3F_7$, $-C_4F_9$, $-CF(CF_3)_2$, $-CF(CF_3)C_2F_5$, $-CF_2CF(CF_3)_2$, $-C(CF_3)_3$, $-C_5F_{11}$, $-C_6F_{13}$, $-C_7F_{15}$, $-C_8F_{17}$, $-CH_2CF_3$, $-CH_2C_2F_5$, $-CH_2C_3F_7$, $-CH(CF_3)_2$, $-CH(CF_3)C_2F_5$, $-CH_2CF(CF_3)_2$, and $-CH_2CN$. Among those, $-CF_3$, $-C_2F_5$, $-C_3F_7$, $-C_4F_9$, $-CH_2CF_3$, $-CH_2C_2F_5$, $-CH_2C_3F_7$, $-CH(CF_3)_2$, or $-CH_2CN$ is preferable, $-CH_2CF_3$, $-CH_2C_2F_5$, $-CH_2C_3F_7$, $-CH(CF_3)_2$, or $-CH_2CN$ is more preferable, $-CH_2C_2F_5$, $-CH(CF_3)_2$, or $-CH_2CN$ is still more preferable, and $-CH_2C_2F_5$ or $-CH(CF_3)_2$ is particularly preferable.

As the constitutional unit represented by Formula X, a constitutional unit represented by Formula X-1 or Formula X-2 is preferable, and the constitutional unit represented by Formula X-1 is more preferable.

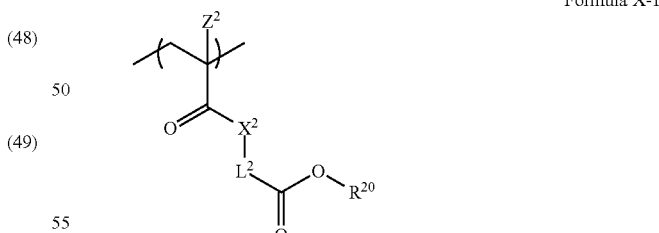

Formula X-1

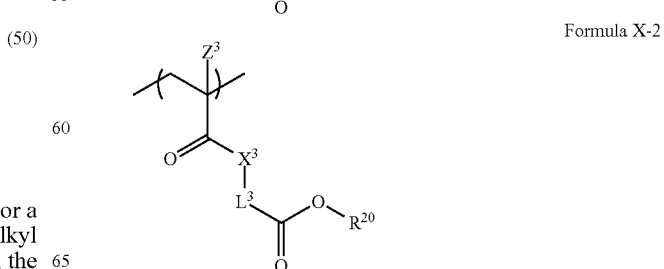

Formula X-2

In Formula X-1, $R^{20}$ represents an electron-withdrawing group, $L^2$ represents a divalent linking group, $X^2$ represents an oxygen atom or a sulfur atom, and $Z^2$ represents a halogen atom.

In Formula X-2, $R^{20}$ represents an electron-withdrawing group, $L^3$ represents a divalent linking group, $X^3$ represents an oxygen atom or a sulfur atom, and $Z^3$ represents a halogen atom.

Specific examples and preferred examples of the divalent linking group of each of $L^2$ and $L^3$ include the same ones as described in L as the divalent linking group in Formula X.

The electron-withdrawing group as each of $R^2$ and $R^3$ is preferably the partial structure represented by Formula EW, specific examples and preferred examples thereof are the same as described above, but the halo(cyclo)alkyl group is more preferable.

In Formula X-1, $L^2$ and $R^2$ are not bonded to each other to form a ring in any case, and in Formula X-2, $L^3$ and $R^3$ are not bonded to each other to form a ring in any case.

$X^2$ and $X^3$ are each preferably an oxygen atom.

As each of $Z^2$ and $Z^3$, a fluorine atom or a chlorine atom is preferable, and the fluorine atom is more preferable.

In addition, as the constitutional unit represented by Formula X, a constitutional unit represented by Formula X-3 is also preferable.

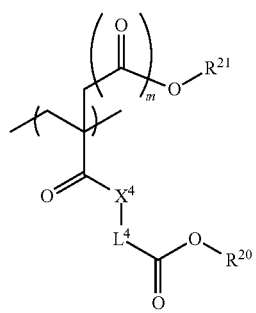

Formula X-3

In Formula X-3, $R^{20}$ represents an electron-withdrawing group, $R^{21}$ represents a hydrogen atom, an alkyl group, or an aryl group, $L^4$ represents a divalent linking group, $X^4$ represents an oxygen atom or a sulfur atom, and m represents 0 or 1.

Specific examples and preferred examples of the divalent linking group of $L^4$ include the same ones as described in L as the divalent linking group in Formula X.

The electron-withdrawing group as $R^4$ is preferably the partial structure represented by Formula EW, specific examples and preferred examples thereof are the same as described above, but the halo(cyclo)alkyl group is more preferable.

Furthermore, in Formula X-3, $L^4$ and $R^4$ are not bonded to each other to form a ring in any case.

As $X^4$, an oxygen atom is preferable.

Moreover, as the constitutional unit represented by Formula X, a constitutional unit represented by Formula Y-1 or a constitutional unit represented by Formula Y-2 is also preferable.

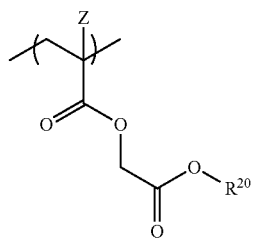

Formulae Y-1

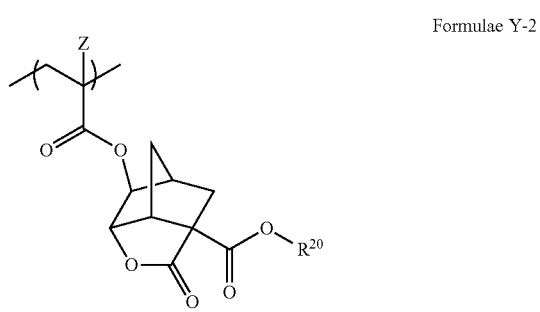

Formulae Y-2

In Formulae Y-1 and Y-2, Z represents a halogen atom, a group represented by $R^{11}OCH_2$—, or a group represented by $R^{12}OC(\!=\!O)CH_2$—, $R^{11}$ and $R^{12}$ each independently represent a substituent, and $R^{20}$ represents an electron-withdrawing group.

The electron-withdrawing group as $R^{20}$ is preferably the partial structure represented by Formula EW, specific examples and preferred examples thereof are the same as described above, but the halo(cyclo)alkyl group is more preferable.

Specific examples and preferred examples of the halogen atom, the group represented by $R^{11}OCH_2$—, or the group represented by $R^{12}OC(\!=\!O)CH_2$— as Z are the same as described in Formula 1.

A content of the constitutional unit represented by Formula X is preferably 10% by mole to 100% by mole, more preferably 20% by mole to 100% by mole, and still more preferably 30% by mole to 100% by mole with respect to all constitutional units of the fluorine-containing resin.

Preferred examples of the constitutional unit constituting the hydrophobic resin (E) are shown below.

Preferred examples of the hydrophobic resin (E) include resins formed by optionally combining these constitutional units or resins F-1 and F-2 used in Examples, but are not limited thereto.

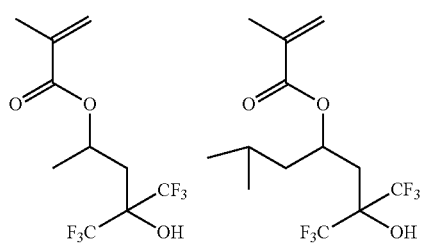

-continued
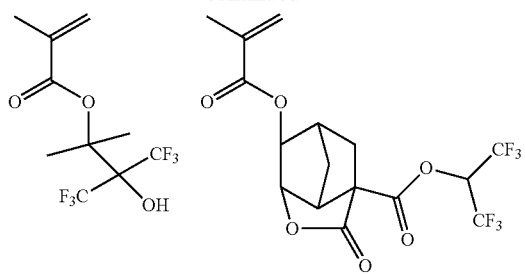
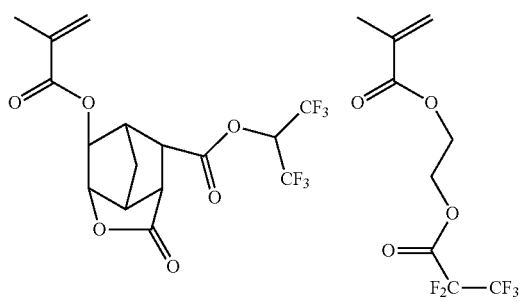
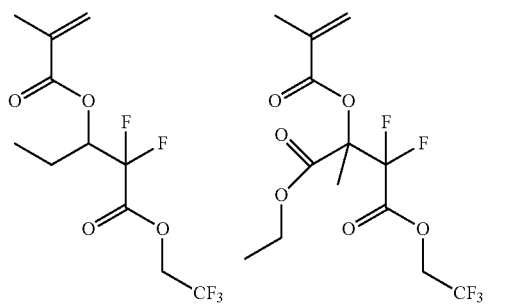
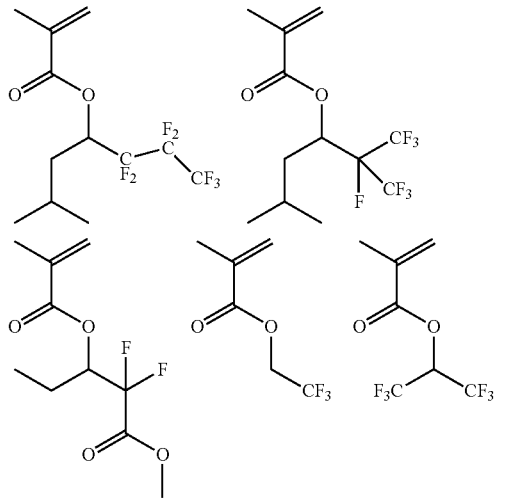
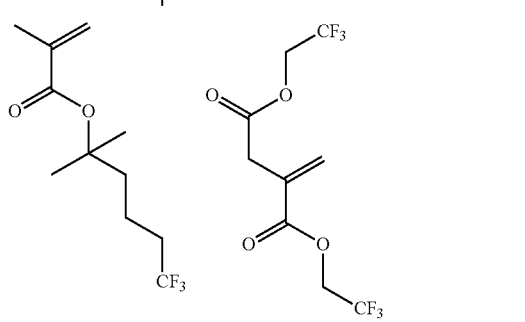
-continued
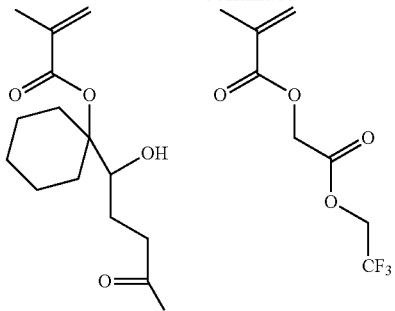
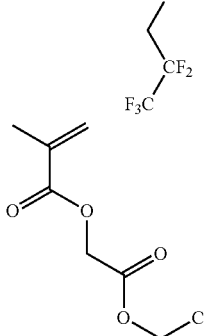
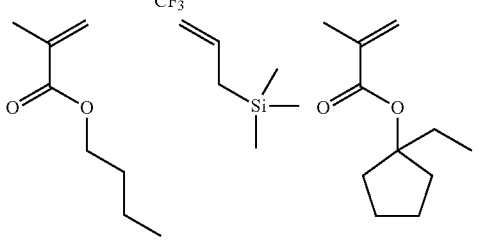
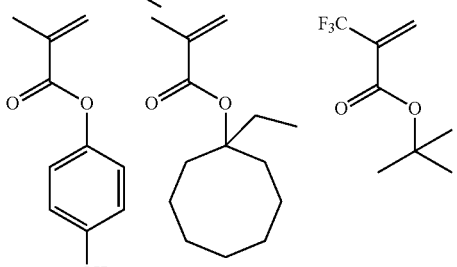
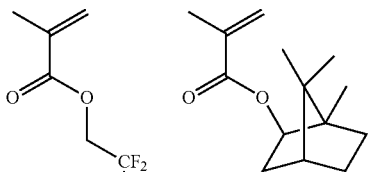
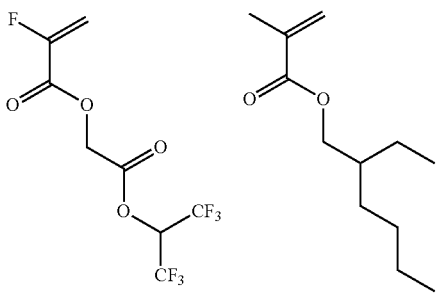

-continued

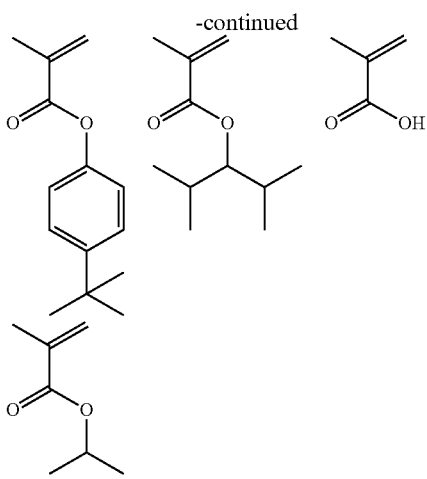

The hydrophobic resins (E) may be used alone or in combination of two or more kinds thereof.

It is preferable to use a mixture of two or more kinds of hydrophobic resins (E) having different levels of surface energy from the viewpoint of satisfying both the immersion liquid followability and the development characteristics upon liquid immersion exposure.

A content of the hydrophobic resin (E) in the composition is preferably 0.01% by mass to 10% by mass, and more preferably 0.05% by mass to 8% by mass with respect to the total solid content in the actinic ray-sensitive or radiation-sensitive resin composition according to the embodiment of the present invention.

<(B) Photoacid Generator>

The composition according to the embodiment of the present invention includes a photoacid generator (hereinafter also referred to as "photoacid generator (B)").

The photoacid generator is a compound that generates an acid upon irradiation with actinic rays or radiation.

As the photoacid generator, a compound that generates an organic acid upon irradiation with actinic rays or radiation is preferable. Examples thereof include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

As the photoacid generators, known compounds that generate an acid upon irradiation with actinic rays or radiation can be used alone or as a mixture thereof, appropriately selected and used. For example, the known compounds disclosed in paragraphs 0125 to 0319 of US2016/0070167A, paragraphs 0086 to 0094 of US2015/0004544A, and paragraphs 0323 to 0402 of US2016/0237190A can be suitably used as the photoacid generator (B).

[Compounds Represented by Formulae ZI, ZII, and ZIII]

Examples of suitable aspects of the photoacid generator (B) include compounds represented by Formulae ZI, ZII, and ZIII.

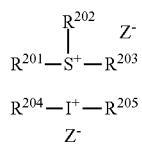

Formula ZI

Formula ZII

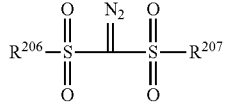

Formula ZIII

In Formula ZI, $R^{201}$, $R^{202}$, and $R^{203}$ each independently represent an organic group.

The number of carbon atoms of the organic group as each of $R^{201}$, $R^{202}$, and $R^{203}$ is preferably 1 to 30, and more preferably 1 to 20.

In addition, two of $R^{201}$ to $R^{203}$ may be bonded to each other to form a ring structure, and the ring may include an oxygen atom, a sulfur atom, an ester bond, an amide bond, or a carbonyl group. Examples of a group formed by the bonding of two of $R^{201}$ to $R^{203}$ include an alkylene group (for example, a butylene group and a pentylene group), and —$CH_2$—$CH_2$—O—$CH_2$—$CH_2$—.

$Z^-$ represents an anion.

[Cation in Compound Represented by Formula ZI]

Suitable aspects of the cation in Formula ZI include the corresponding groups in compounds (ZI-1), (ZI-2), (ZI-3), and (ZI-4) which will be described later.

In addition, the photoacid generator (B) may be a compound having a plurality of the structures represented by Formula ZI. For example, the photoacid generator may be a compound having a structure in which at least one of $R^{201}$, $R^{202}$, or $R^{203}$ of the compound represented by Formula ZI and at least one of $R^{201}$, $R^{202}$, or $R^{203}$ of another compound represented by Formula ZI are bonded via a single bond or a linking group.

—Compound ZI-1—

First, the compound (ZI-1) will be described.

The compound (ZI-1) is an arylsulfonium compound in which at least one of $R^{201}$, $R^{202}$ or $R^{203}$ in Formula ZI is an aryl group, that is, a compound having arylsulfonium as a cation. In the arylsulfonium compound, any of $R^{201}$ to $R^{203}$ may be an aryl group, or some of $R^{201}$ to $R^{203}$ may be an aryl group, and the rest may be an alkyl group or a cycloalkyl group. Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group of the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group if each of $R^{201}$ to $R^{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

—Compound ZI-2—

Next, the compound (ZI-2) will be described.

The compound (ZI-2) is a compound in which $R^{201}$ to $R^{203}$ in Formula (ZI) are each independently an organic group having no aromatic ring. Here, the aromatic ring also includes an aromatic ring containing a heteroatom.

The organic group as each of $R^{201}$ to $R^{203}$, which has no aromatic ring, preferably has 1 to 30 carbon atoms, and more preferably has 1 to 20 carbon atoms.

$R^{201}$ to $R^{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R^{201}$ to $R^{203}$ include a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group).

$R^{201}$ to $R^{203}$ may be further substituted with a halogen atom, an alkoxy group (for example, having 1 to 5 carbon atoms), a hydroxyl group, a cyano group, or a nitro group.

—Compound ZI-3—

Next, the compound (ZI-3) will be described.

The compound (ZI-3) is a compound represented by Formula ZI-3, which has a phenacylsulfonium salt structure.

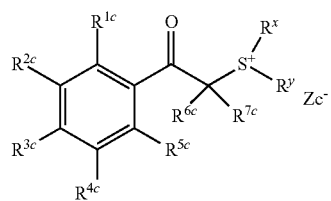

Formula ZI-3

In Formula ZI-3, $R^{1c}$ to $R^{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R^{6c}$ and $R^{7c}$ each independently represents a hydrogen atom, an alkyl group, a cycloalkyl group, a halogen atom, a cyano group, or an aryl group, and $R^x$ and $R^y$ each independently represent an alkyl group, a cycloalkyl group, a 2-oxoalkyl group, a 2-oxocycloalkyl group, an alkoxycarbonylalkyl group, an allyl group, or a vinyl group.

Each of any two or more of $R^{1c}$, . . . , or $R^{5c}$, and $R^{5c}$ and $R^{6c}$, $R^{6c}$ and $R^{7c}$, $R^{5c}$ and $R^x$, and $R^x$ and $R^y$ may be bonded to each other to form a ring structure, and this ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, and a polycyclic fused ring in which two or more of these rings are combined. Examples of the ring structure include 3- to 10-membered rings, and the ring structures are preferably 4- to 8-membered rings, and more preferably 5- or 6-membered rings.

Examples of the group formed by the bonding of any two or more of $R^{1c}$, . . . , or $R^{5c}$, $R^{6c}$ and $R^{7c}$, and $R^x$ and $R^y$ include a butylene group and a pentylene group.

As the group formed by the bonding of $R^{5'}$ and $R^{6'}$, and $R^{5'}$ and $R^x$, a single bond or an alkylene group is preferable. Examples of the alkylene group include a methylene group and an ethylene group.

$Zc^-$ represents an anion.

—Compound ZI-4—

Next, the compound (ZI-4) will be described.

The compound (ZI-4) is represented by Formula ZI-4.

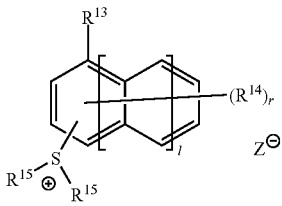

Formula ZI-4

In Formula ZI-4, 1 represents an integer of 0 to 2, r represents an integer of 0 to 8, $R^{13}$ represents a hydrogen atom, a fluorine atom, a hydroxyl group, an alkyl group, a cycloalkyl group, an alkoxy group, an alkoxycarbonyl group, or a group having a cycloalkyl group, each of which may have a substituent, $R^{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, each of which may have a substituent, $R^{15}$'s each independently represent an alkyl group, a cycloalkyl group, or a naphthyl group, each of which may have a substituent, and two $R^{15}$'s may be bonded to each other to form a ring.

In a case where two of $R^{15}$'s are bonded to each other to form a ring, the ring skeleton may include a heteroatom such as an oxygen atom and a nitrogen atom. In one aspect, it is preferable that two of $R^{15}$'s are alkylene groups and are bonded to each other to form a ring structure.

$Z^-$ represents an anion.

In Formula ZI-4, the alkyl group in each of $R^{13}$, $R^{14}$, and $R^{15}$ is linear or branched, preferably has 1 to 10 carbon atoms, and is more preferably a methyl group, an ethyl group, an n-butyl group, a t-butyl group, or the like.

[Cation in Compound Represented by Formula ZII or Formula ZIII]

Next, Formulae ZII and ZIII will be described.

In Formulae ZII and ZIII, $R^{204}$ to $R^{207}$ each independently represent an aryl group, an alkyl group, or a cycloalkyl group.

The aryl group of each of $R^{204}$ to $R^{207}$ is preferably a phenyl group or a naphthyl group, and more preferably the phenyl group. The aryl group of each of $R^{204}$ to $R^{207}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group of each of $R^{204}$ to $R^{207}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

The aryl group, the alkyl group, and the cycloalkyl group of each of $R^{204}$ to $R^{207}$ may each independently have a substituent. Examples of the substituent which may be contained in the aryl group, the alkyl group, and the cycloalkyl group of each of $R^{204}$ to $R^{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

[Anions in Compounds Represented by Formula ZI to Formula ZIII]

As $Z^-$ in Formula ZI, $Z^-$ in Formula ZII, $Zc^-$ in Formula ZI-3, and $Z^-$ in Formula ZI-4, an anion represented by Formula An-1 is preferable.

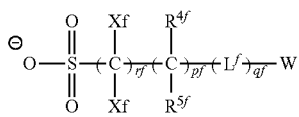

Formula An-1

In Formula An-1, pf represents an integer of 0 to 10, qf represents an integer of 0 to 10, rf represents an integer of 1 to 3, Xf's each independently represent a fluorine atom or an alkyl group substituted with at least one fluorine atom, in a case where rf is an integer of 2 or more, a plurality of —C(Xf)$_2$—'s may be the same as or different from each other, $R^4$ and $R^5$ each independently represent a hydrogen atom, a fluorine atom, an alkyl group, or an alkyl group substituted with at least one fluorine atom, in a case where pf is an integer of 2 or more, a plurality of —CR$^{4f}$R$^{5f}$—'s may be the same as or different from each other, L$^f$ represents a divalent linking group, in a case where qf is an integer of 2 or more, a plurality of L$^f$'s may be the same as or different from each other, and W represents an organic group including a cyclic structure.

Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably the fluorine atom or the perfluoroalkyl group having 1 to 4 carbon atoms. Xf is more preferably the fluorine atom or $CF_3$. In particular, it is preferable that both Xf's are the fluorine atoms.

$R^{4f}$ and $R^{5f}$ each independently represent a hydrogen atom, a fluorine atom, an alkyl group, or an alkyl group substituted with at least one fluorine atom. In a case where a plurality of each of $R^{4f}$'s and $R^{5f}$'s are present, $R^{4f}$'s and $R^{5f}$'s may be the same as or different from each other.

The alkyl group represented by each of $R^{4f}$ and $R^{5f}$ may have a substituent, and preferably has 1 to 4 carbon atoms.

$R^{4f}$ and $R^{5f}$ are each preferably the hydrogen atom. Specific examples and suitable aspects of the alkyl group substituted with at least one fluorine atom are the same ones as the specific examples and the suitable aspects of Xf in Formula An-1, respectively.

L represents a divalent linking group, and in a case where a plurality of L's are present, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among these, —COO—, —OCO—, —CONH—, —NHCO—, —CO—, —O—, —SO$_2$—, —COO— alkylene group-, —OCO-alkylene group-, —CONH-alkylene group-, or —NHCO-alkylene group- is preferable, and —COO—, —OCO—, —CONH—, —SO$_2$—, —COO-alkylene group-, or —OCO-alkylene group- is more preferable.

W represents an organic group including a cyclic structure. Among these, W is preferably a cyclic organic group.

Examples of the cyclic organic group include an alicyclic group, an aryl group, and a heterocyclic group.

The alicyclic group may be either monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be either monocyclic or polycyclic. Examples of the aryl group include a phenyl group, a naphthyl group, a phenanthryl group, and an anthryl group.

The heterocyclic group may be either monocyclic or polycyclic. The polycyclic compound can further suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. Examples of the lactone ring and the sultone ring include the lactone structure and the sultone structure exemplified in the above-mentioned resin. As the heterocycle in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, and preferably has 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

Preferred examples of the anion represented by Formula An-1 include $SO_3^-$—$CF_2$—$CH_2$—$OCO$-$(L^f)q'$-W, $SO_3^-$—$CF_2$—$CHF$—$CH_2$—$OCO$-$(L^f)q'$-W, $SO_3^-$—$CF_2$—$COO$-$(L^f)q'$-W, $SO_3^-$—$CF_2$—$CF_2$—$CH_2$—$CH_2$-$(L^f)_{qf}$-W, and $SO_3^-$—$CF_2$—$CH(CF_3)$—$OCO$-$(L^f)q'$-W. Here, $L^f$, qf, and W are each the same as in Formula An-1. q' represents an integer of 0 to 10.

In one aspect, as $Z^-$ in Formula ZI, $Z^-$ in Formula ZII, $Zc^-$ in Formula ZI-3, and $Z^-$ in Formula ZI-4, an anion represented by Formula 4 is also preferable.

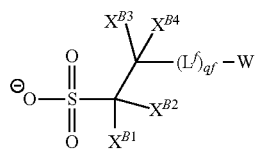

Formula 4

In Formula 4, $X^{B1}$ and $X^{B2}$ each independently represent a hydrogen atom or a monovalent organic group having no fluorine atom. $X^{B1}$ and $X^{B2}$ are each preferably the hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both $X^{B3}$ and $X^{B4}$ are fluorine atoms or monovalent organic groups having a fluorine atom. It is still more preferable that both $X^{B3}$ and $X^{B4}$ are fluorine-substituted alkyl groups.

$L^f$, qf, and W are the same as those in Formula 3.

As $Z^-$ in Formula ZI, $Z^-$ in Formula ZII, $Zc^-$ in Formula ZI-3, and $Z^-$ in Formula ZI-4, an anion represented by Formula 5 is preferable.

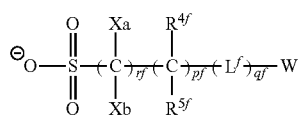

Formula 5

In Formula 5, Xa's each independently represent a fluorine atom or an alkyl group substituted with at least one fluorine atom, and Xb's each independently represent a hydrogen atom or an organic group having no fluorine atom. The definitions and preferred aspects of rf, pf, qf, $R^{4f}$, $R^{5f}$, $L^f$, and W are each the same as those in Formula 3.

Z in Formula ZI, $Z^-$ in Formula ZII, $Zc^-$ in Formula ZI-3, and $Z^-$ in Formula ZI-4 may be a benzenesulfonate anion, and are each preferably a benzenesulfonate anion substituted with a branched alkyl group or a cycloalkyl group.

As Z in Formula ZI, $Z^-$ in Formula ZII, $Zc^-$ in Formula ZI-3, and $Z^-$ in Formula ZI-4, an aromatic sulfonate anion represented by Formula SA1 is also preferable.

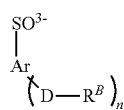

Formula SA1

In Formula SA1, Ar represents an aryl group and may further have a substituent other than a sulfonate anion and -(D-$R^B$). Examples of the substituent which may be further contained include a fluorine atom and a hydroxyl group.

n represents an integer of 0 or more. n is preferably 1 to 4, more preferably 2 or 3, and particularly preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group consisting of a combination of two or more of these.

$R^B$ represents a hydrocarbon group.

It is preferable that D is a single bond and $R^B$ is an aliphatic hydrocarbon structure. It is more preferable that $R^B$ is an isopropyl group or a cyclohexyl group.

Preferred examples of the sulfonium cation in Formula ZI and the sulfonium cation or iodonium cation in Formula ZII are shown below.

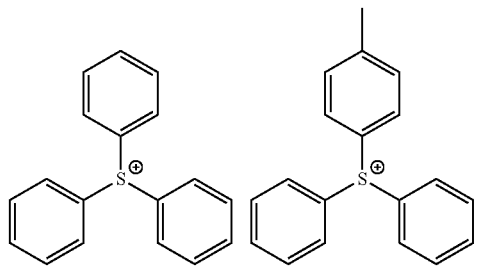

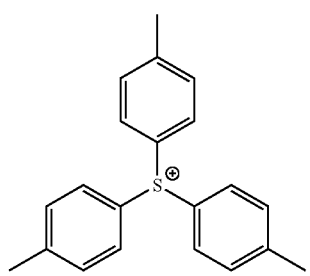

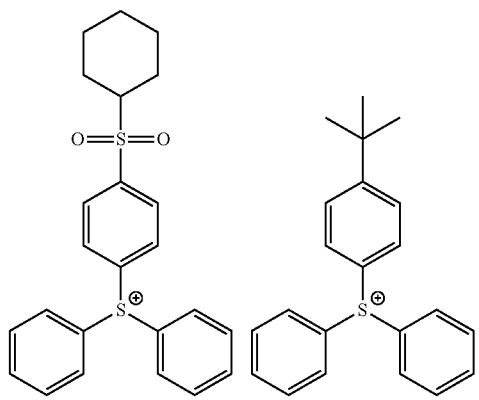

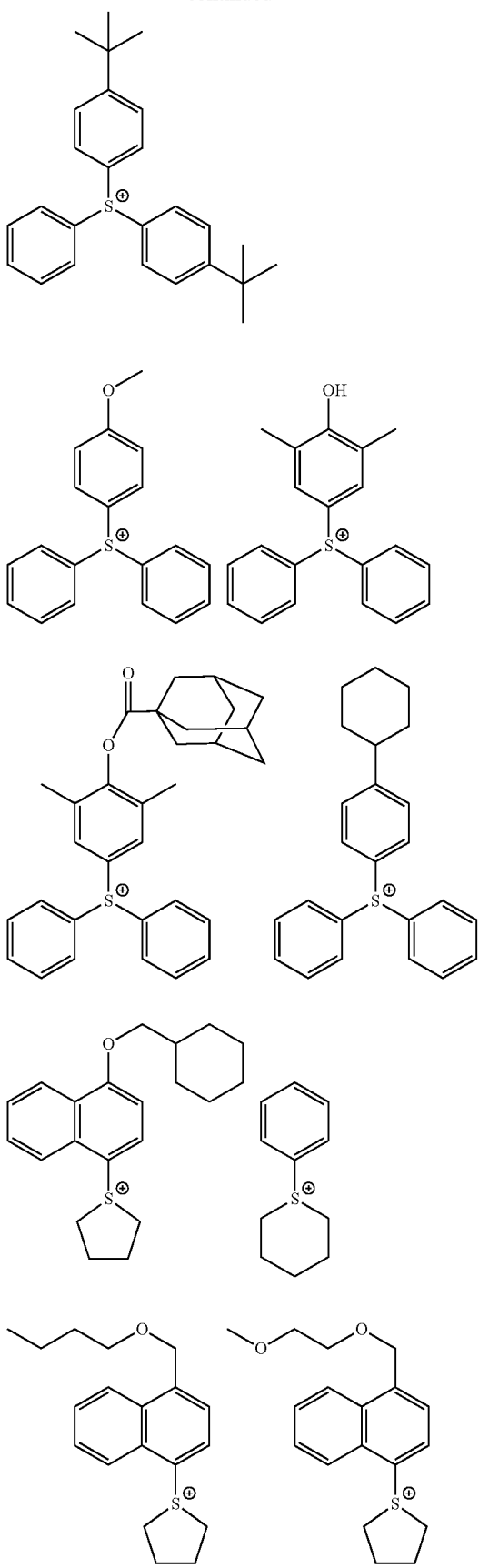
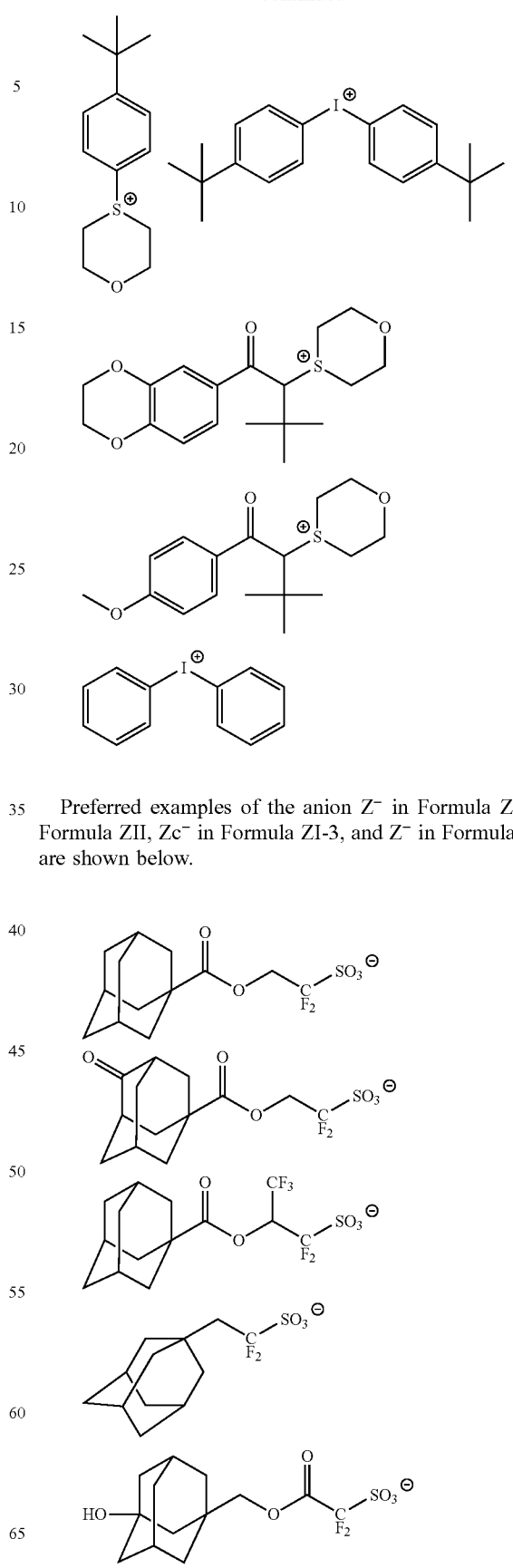
Preferred examples of the anion $Z^-$ in Formula ZI and Formula ZII, $Zc^-$ in Formula ZI-3, and $Z^-$ in Formula ZI-4 are shown below.

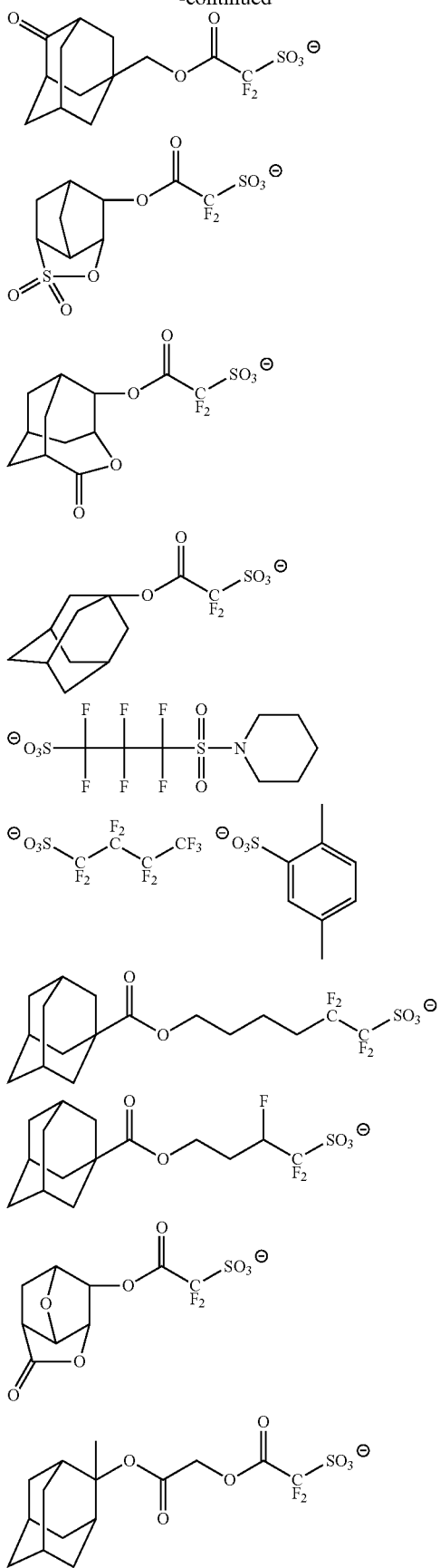
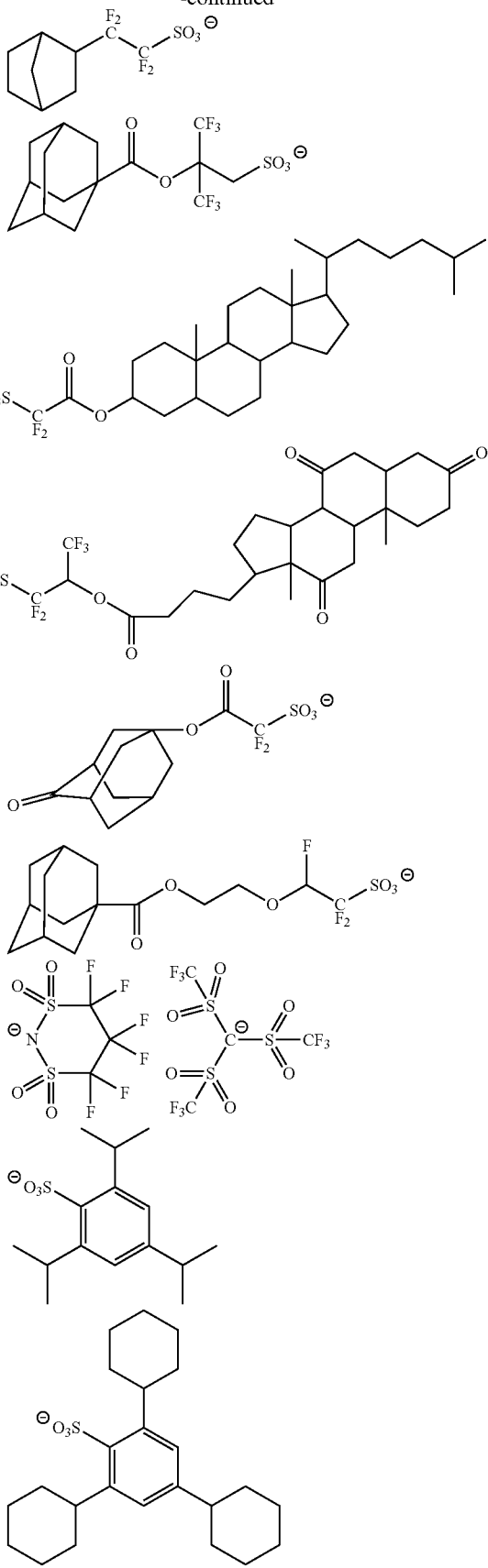

Any combination of the cations and the anions can be used as the photoacid generator.

Among those, it is preferable that the photoacid generator is an ionic compound including a cation and an anion, and the anion includes an ion represented by any one of Formula An-1, Formula An-2, and Formula An-3.

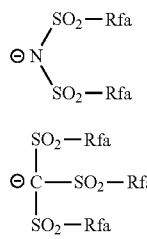

In Formula An-2 and Formula An-3, Rfa's each independently represent a monovalent organic group having a fluorine atom, and a plurality of Rfa's may be bonded to each other to form a ring.

Rfa is preferably an alkyl group substituted with at least one fluorine atom. The alkyl group preferably has 1 to 10 carbon atoms, and more preferably has 1 to 4 carbon atoms. Further, the alkyl group substituted with at least one fluorine atom is preferably a perfluoroalkyl group.

In addition, it is preferable that a plurality of Rfa's are bonded to each other to form a ring.

Moreover, preferred examples of the photoacid generator also include compounds C-1 to C-15 used in Examples, but the present invention is not limited thereto.

The photoacid generator may be in a form of a low-molecular-weight compound or a form incorporated into a part of a polymer. Further, a combination of the form of a low-molecular-weight compound and the form incorporated into a part of a polymer may also be used.

The photoacid generator is preferably in the form of a low-molecular-weight compound.

In a case where the photoacid generator is in the form of a low-molecular-weight compound, the molecular weight is preferably 3,000 or less, more preferably 2,000 or less, and still more preferably 1,000 or less.

In a case where the photoacid generator is incorporated into a part of a polymer, it may be incorporated into a part of the resin (A) described above or in a resin other than the above-mentioned resin (A).

The photoacid generators may be used alone or in combination of two or more kinds thereof.

A content of the photoacid generator (a total content thereof in a case where a plurality of the photoacid generators are present) in the composition is preferably 0.1% by mass to 35% by mass, more preferably 0.5% by mass to 25% by mass, still more preferably 2% by mass to 20% by mass, and particularly preferably 2.5% by mass to 20% by mass with respect to the total solid content of the composition.

In a case where the compound represented by Formula ZI-3 or Formula ZI-4 is included as the photoacid generator, the content of the photoacid generator included in the composition (in a case where the photoacid generators are present in a plurality of kinds, a total content thereof) is preferably 5% by mass to 35% by mass, and more preferably 7% by mass to 30% by mass with respect to the total solid content of the composition.

<(D) Acid Diffusion Control Agent Provided That Those Corresponding to Amine Oxide Are Excluded>

The actinic ray-sensitive or radiation-sensitive resin composition according to the embodiment of the present invention contains an acid diffusion control agent provided that acid diffusion control agents corresponding to the amine oxide are excluded (also referred to as an "acid diffusion control agent (D)").

The acid diffusion control agent (D) is a compound different from the amine oxide (P).

In a preferred aspect, the acid diffusion control agent (D) is preferably an amine compound.

The acid diffusion control agent (D) acts as a quencher that suppresses a reaction of the acid-decomposable resin in the unexposed area by excessive generated acids by trapping the acids generated from an acid generator and the like upon exposure. For example, a basic compound (DA), a basic compound (DB) having basicity reduced or lost upon irradiation with actinic rays or radiation, an onium salt (DC) which is a weak acid relative to an acid generator, a low-molecular-weight compound (DD) having a nitrogen atom and a group that leaves by the action of an acid, an onium salt compound (DE) having a nitrogen atom in the cationic moiety, can be used as the acid diffusion control agent (D).

Among those, from the viewpoint of the linearity of a pattern thus obtained after the lapse of time, the actinic ray-sensitive or radiation-sensitive resin composition according to the embodiment of the present invention preferably includes a nitrogen-containing compound, and more preferably includes a nitrogen-containing basic compound, as the acid diffusion control agent (D).

In the actinic ray-sensitive or radiation-sensitive resin composition according to the embodiment of the present invention, a known acid diffusion control agent can be appropriately used. For example, the known compounds disclosed in paragraphs 0627 to 0664 of US2016/0070167A1, paragraphs 0095 to 0187 of US2015/0004544A1, paragraphs 0403 to 0423 of US2016/0237190A1, and paragraphs 0259 to 0328 of US2016/0274458A1 can be suitably used as the acid diffusion control agent (D).

[Basic Compound (DA)]

Preferred examples of the basic compound (DA) include compounds having structures represented by Formula A to Formula E.

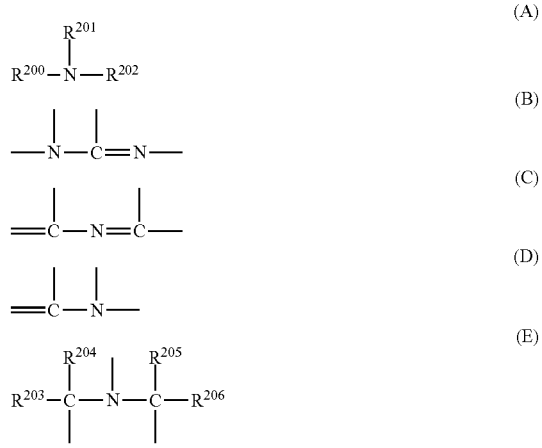

In Formula A and Formula E,
$R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring. $R^{203}$, $R^{204}$, $R^{205}$, and $R^{206}$ may be the same as or different from each other and each independently represent an alkyl group having 1 to 20 carbon atoms.

The alkyl group in each of Formula A and Formula E may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of Formula A and Formula E are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

[Basic Compound (DB) Having Basicity that is Reduced or Lost Upon Irradiation with Actinic Rays or Radiation]

The basic compound (DB) having basicity reduced or lost upon irradiation with actinic rays or radiation (hereinafter also referred to as a "compound (DB)") is a compound which has a proton-accepting functional group, and decomposes under irradiation with actinic rays or radiation to exhibit reduced proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to R-conjugation. The nitrogen atom having an unshared electron pair not contributing to π-conjugation is, for example, a nitrogen atom having a partial structure represented by the following formula.

⦂ ⦂ ⊖ Unshared Electron Pair

Preferred examples of the partial structure of the proton-accepting functional group include crown ether, azacrown ether, primary to tertiary amine, pyridine, imidazole, and pyrazine structures.

The compound (DB) decomposes upon irradiation with actinic rays or radiation to generate a compound exhibiting reduced proton-accepting properties, no proton-accepting properties, or a change from the proton-accepting properties to acidic properties. Here, exhibiting reduced proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The acid dissociation constant pKa of the compound generated by decomposition of the compound (DB) upon irradiation with actinic rays or radiation preferably satisfies pKa<−1, more preferably satisfies −13<pKa<−1, and still more preferably satisfies 13<pKa<−3.

The acid dissociation constant pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pKa indicates higher acid strength. Specifically, the acid dissociation constant pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett's substituent constant and the database of publicly known literature values. Any of the values of pKa described in the present specification indicate values determined by calculation using the software package.

Software Package 1: Advanced Chemistry Development (ACD/Labs) Software V 8.14 for Solaris (1994-2007 ACD/Labs).

[Onium Salt (DC) which Becomes Relatively Weak Acid with Respect to Photoacid Generator]

In the actinic ray-sensitive or radiation-sensitive resin composition according to the embodiment of the present invention, an onium salt (DC), which is a weak acid relative to the photoacid generator, can be used as the acid diffusion control agent (D).

In a case where the photoacid generator and the onium salt that generates an acid which is a weak acid relative to an acid generated from the photoacid generator are mixed and used, an acid generated from the photoacid generator upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

From the viewpoint of tolerance of a focal depth and pattern linearity, it is preferable that the actinic ray-sensitive or radiation-sensitive resin composition according to the embodiment of the present invention further includes at least one compound selected from the group consisting of compounds represented by Formula d1-1 to Formula d1-3.

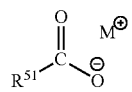

Formula d1-1

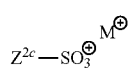

Formula d1-2

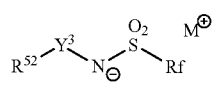

Formula d1-3

In Formula d1-1 to Formula d1-3, $R^{51}$ represents a hydrocarbon group which may have a substituent, $Z^{2c}$ represents a hydrocarbon group having 1 to 30 carbon atoms, which may have a substituent, in which a fluorine atom is not bonded to the carbon atom adjacent to the S atom, $R^{52}$ represents an organic group, $Y^3$ represents a linear, branched, or cyclic alkylene group or an arylene group, Rf represents a hydrocarbon group including a fluorine atom, and $M^+$'s each independently represent an ammonium cation, a sulfonium cation, or an iodonium cation.

Preferred examples of the sulfonium cation or iodonium cation represented by $M^+$ include the sulfonium cations exemplified for Formula ZI and the iodonium cations exemplified for Formula ZII.

The onium salt (DC) which is a weak acid relative to a photoacid generator may be a compound having a cationic moiety and an anionic moiety in the same molecule, in which the cationic moiety and the anionic moiety are linked by a covalent bond (hereinafter also referred to as a "compound (DCA)").

As the compound (DCA), a compound represented by any one of Formulae (C-1), . . . , or (C-3) is preferable.

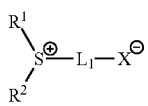

Formula C-1

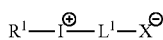

Formula C-2

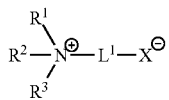

Formula C-3

In Formulae C-1 to C-3, $R^1$, $R^2$, and $R^3$ each independently represent a substituent having 1 or more carbon atoms.

$L^1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$^4$. $R^4$ represents a monovalent substituent having at least one of a carbonyl group: —C(=O)—, a sulfonyl group: —S(=O)$_2$—, or a sulfinyl group: —S(=O)— at a linking moiety to an adjacent N atom.

$R^1$, $R^2$, $R^3$, $R^4$, and $L^1$ may be bonded to each other to form a ring structure. In addition, in Formula C-3, two of $R^1$ to $R^3$ may be combined to represent a divalent substituent or may be bonded to an N atom through a double bond.

Examples of the substituent having 1 or more carbon atoms in each of $R^1$ to $R^3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The alkyl group, a cycloalkyl group, or the aryl group is preferable.

Examples of $L^1$ as a divalent linking group include a linear or branched alkylene group, a cycloalkylene group, an arylene group, a carbonyl group, an ether bond, an ester bond, an amide bond, an urethane bond, an urea bond, and a group formed by a combination of two or more of these groups. $L^1$ is preferably the alkylene group, the arylene group, the ether bond, the ester bond, and the group formed by a combination of two or more of these groups.

[Low-Molecular-Weight Compound (DD) Having Nitrogen Atom and Group that Leaves by Action of Acid]

The low-molecular-weight compound (DD) having a nitrogen atom and having a group that leaves by the action of an acid (hereinafter also referred to as a "compound (DD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (DD) is preferably 100 to 1,000, more preferably 100 to 700, and still more preferably 100 to 500.

The compound (DD) may have a carbamate group having a protective group on the nitrogen atom. The protective group constituting the carbamate group is represented by Formula d-1.

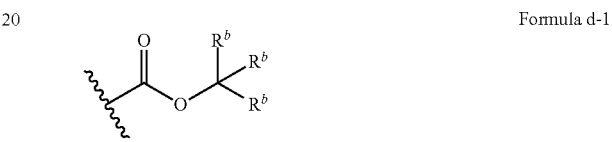

Formula d-1

In Formula d-1, $R^b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R^b$'s may be linked to each other to form a ring.

The alkyl group, the cycloalkyl group, the aryl group, or the aralkyl group represented by $R^b$ may be each independently substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R^b$.

As $R^b$, a linear or branched alkyl group, a cycloalkyl group, or an aryl group is preferable, and the linear or branched alkyl group, or the cycloalkyl group is more preferable.

Examples of the ring formed by the mutual linking of two of $R^b$'s include an alicyclic hydrocarbon, an aromatic hydrocarbon, a heterocyclic hydrocarbon, and derivatives thereof.

Examples of the specific structure of the group represented by Formula d-1 include the structures disclosed in paragraph 0466 in US2012/0135348A, but are not particularly limited thereto.

It is preferable that the compound (DD) has a structure represented by Formula 6.

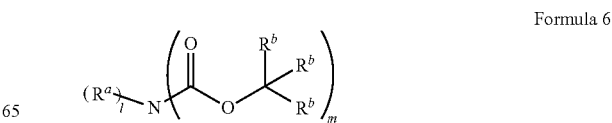

Formula 6

In Formula 6, l represents an integer of 0 to 2, m represents an integer of 1 to 3, and these satisfy l+m=3.

$R^a$ represents a hydrogen atom, an alkyl group, a cycloalkyl group, an aryl group, or an aralkyl group. In a case where l is 2, two of $R^a$'s may be the same as or different from each other, and the two of $R^a$'s may be linked to each other to form a heterocycle with the nitrogen atom in the formula. This heterocycle may include a heteroatom other than the nitrogen atom in the formula.

$R^b$ has the same definition as $R^b$ in Formula d-1, and preferred examples are also the same.

In Formula 6, the alkyl group, the cycloalkyl group, the aryl group, and the aralkyl group as $R^a$ may be each independently substituted with the same groups as the above-mentioned group mentioned above as a group which may be substituted in the alkyl group, the cycloalkyl group, the aryl group, and the aralkyl group as $R^b$.

Specific examples of the alkyl group, the cycloalkyl group, the aryl group, and the aralkyl group (such the alkyl group, the cycloalkyl group, the aryl group, and the aralkyl group may be substituted with the groups as described above) of $R^a$ include the same groups as the specific examples as described above with respect to $R^b$.

Specific structures of the particularly preferred compound (DD) in the present invention include, but are not limited to, the compounds disclosed in paragraph 0475 of the specification of US2012/0135348A.

The onium salt compound (DE) having a nitrogen atom in the cationic moiety (hereinafter also referred to as a "compound (DE)") is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Preferred specific structures of the compound (DE) include, but are not limited to, the compounds disclosed in paragraph 0203 of US2015/0309408A.

Preferred examples of the other acid diffusion control agent (D) are shown below.

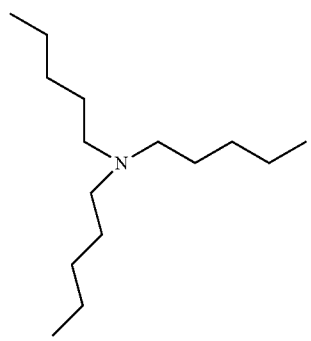

-continued

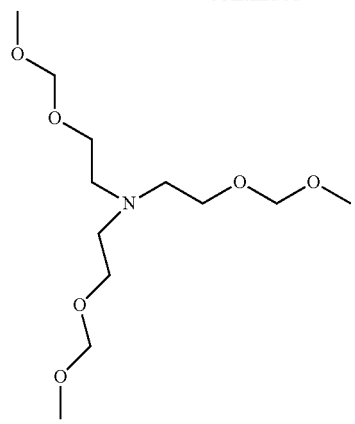

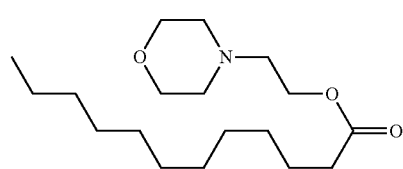

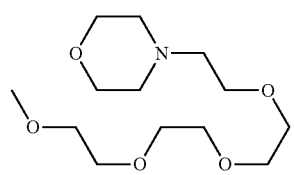

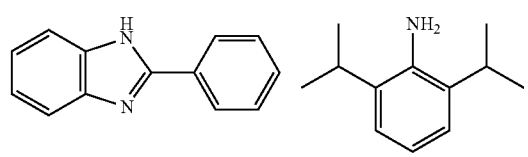

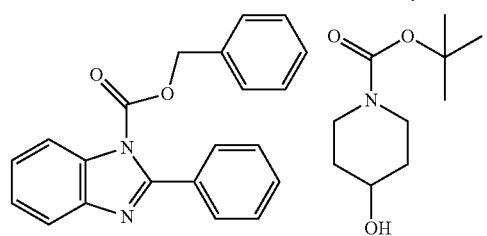

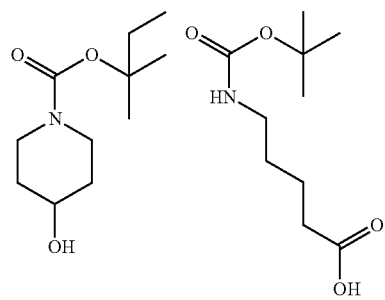

101
-continued
102
-continued
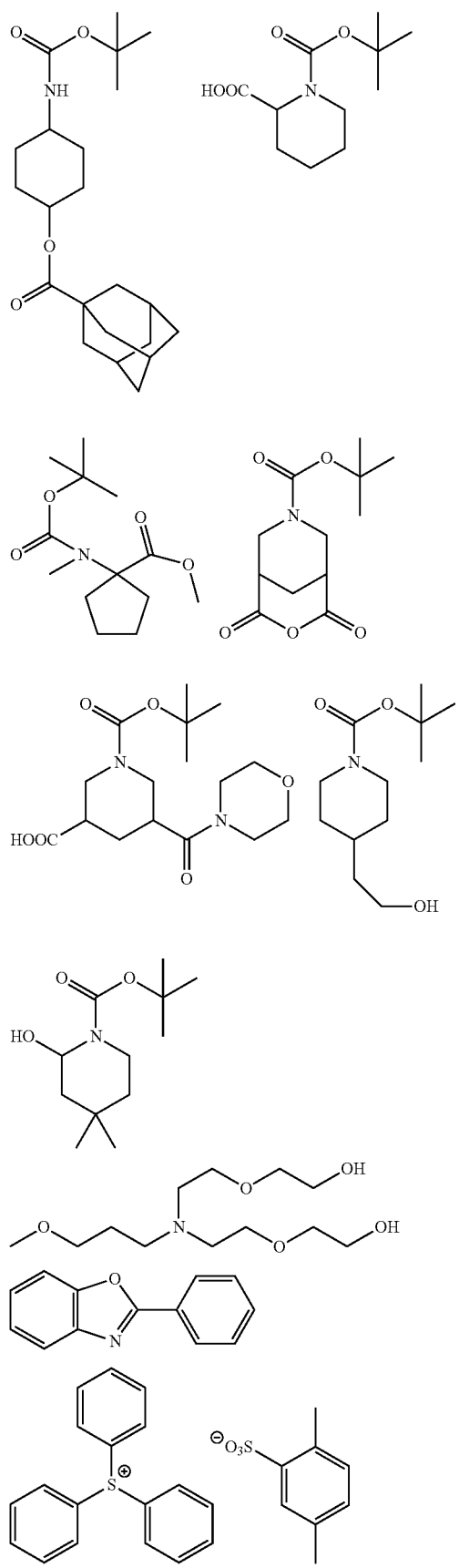
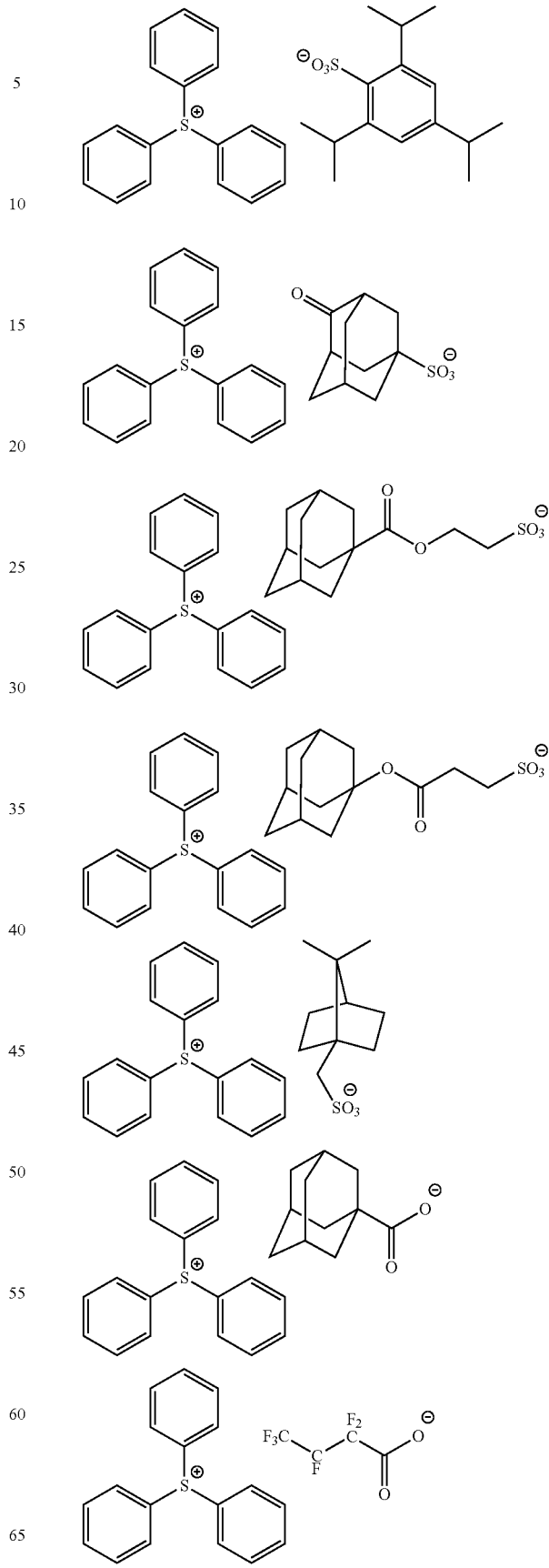

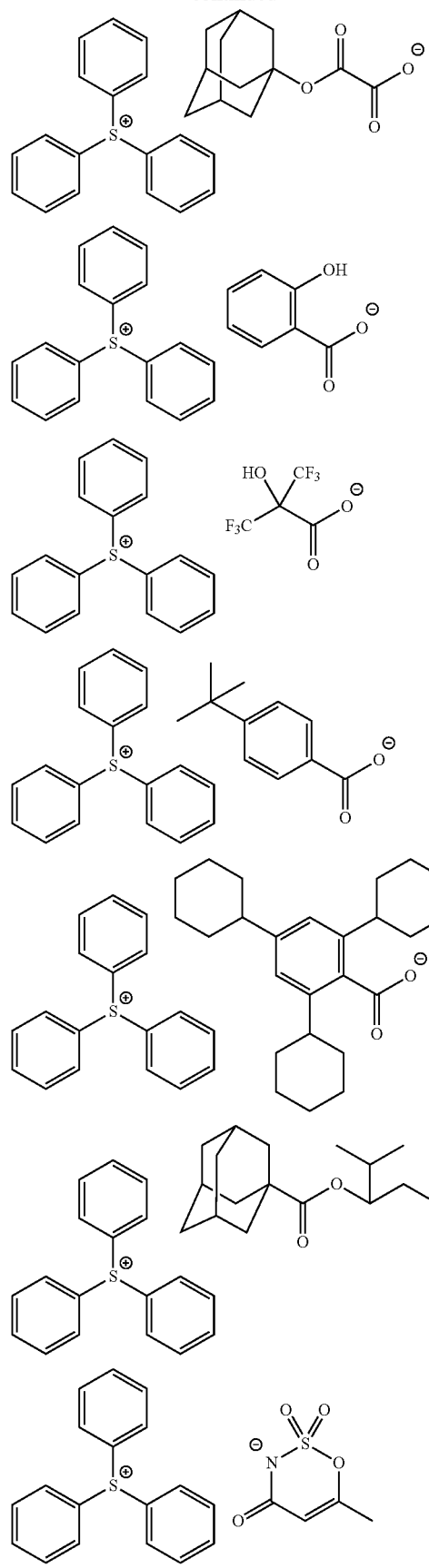
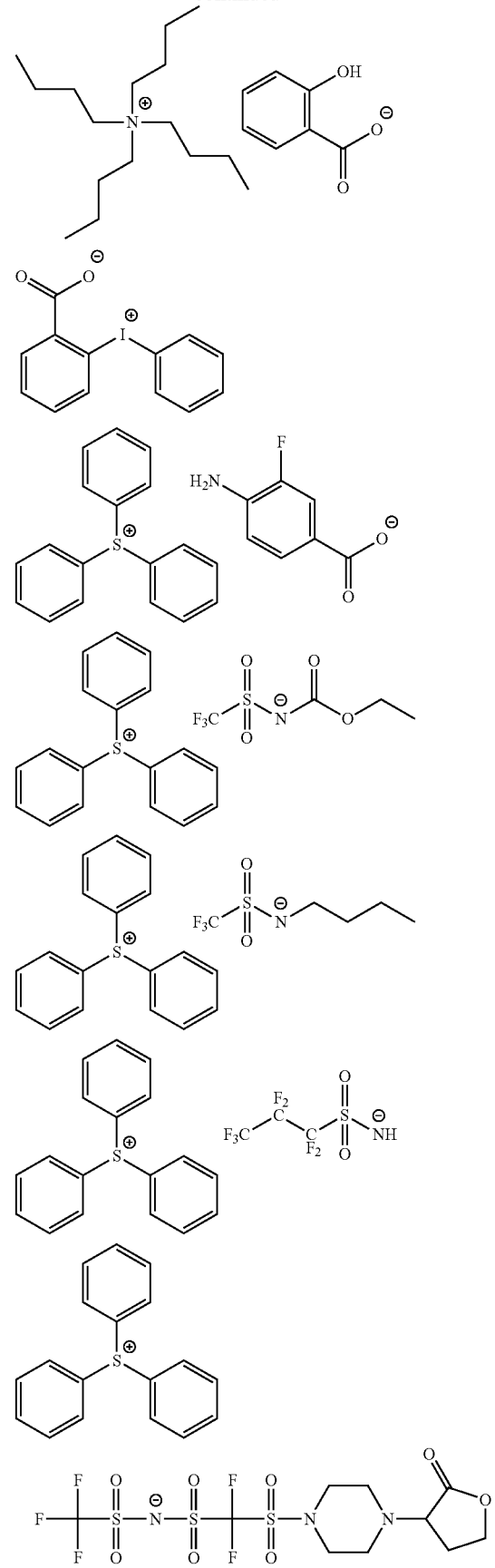

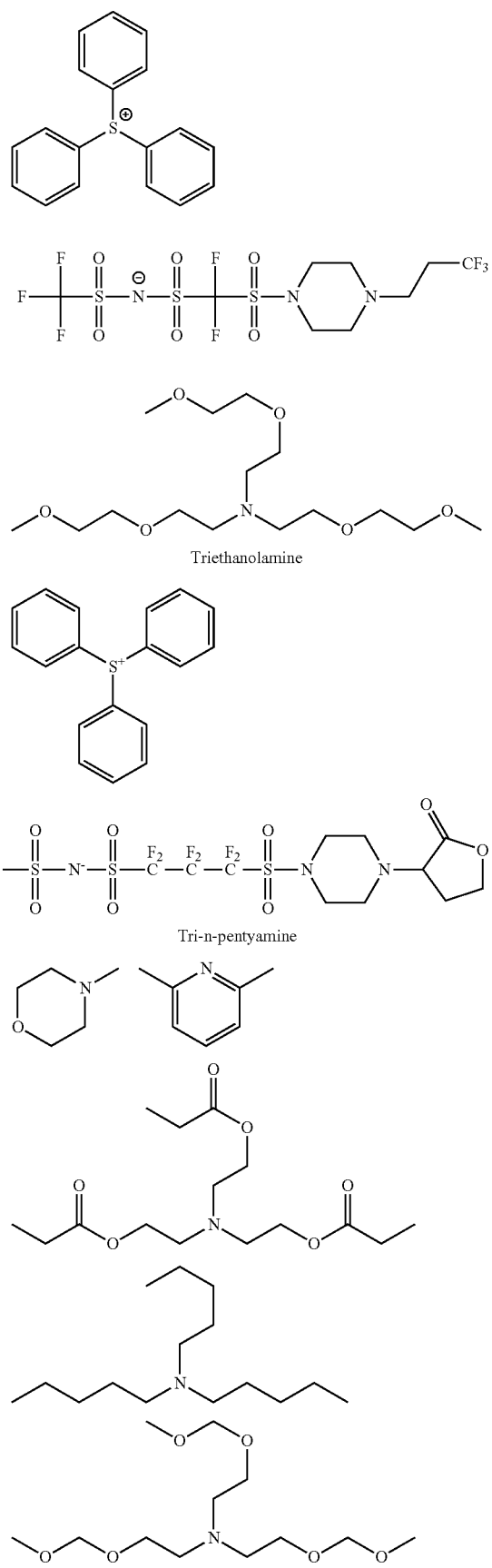

In the actinic ray-sensitive or radiation-sensitive resin composition according to the embodiment of the present invention, the acid diffusion control agent (D) may be used alone or in combination of two or more.

A content of the acid diffusion control agent (D) (a total content thereof in a case where a plurality of kinds of the acid diffusion control agents are present) in the composition is preferably 0.1% by mass to 10% by mass, and more preferably 0.1% by mass to 5% by mass with respect to the total solid content of the composition.

<Solvent>

The actinic ray-sensitive or radiation-sensitive resin composition according to the embodiment of the present invention preferably includes a solvent (also referred to as "solvent (F)"), and more preferably includes an organic solvent.

In the actinic ray-sensitive or radiation-sensitive resin composition according to the embodiment of the present invention, a known resist solvent can be appropriately used. For example, the known solvents disclosed in paragraphs 0665 to 0670 of US2016/0070167A, paragraphs 0210 to 0235 of US2015/0004544A, paragraphs 0424 to 0426 of US2016/0237190A, and paragraphs 0357 to 0366 of US2016/0274458A can be suitably used.

Examples of the solvent which can be used in preparation of the composition include organic solvents such as alkylene glycol monoalkyl ether carboxylate, alkylene glycol monoalkyl ether, alkyl lactic acid ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent containing a hydroxyl group in the structure and a solvent containing no hydroxyl group may be used.

As the solvent containing a hydroxyl group and the solvent containing no hydroxyl group, the above-mentioned exemplary compounds can be appropriately selected, but as the solvent containing a hydroxyl group, alkylene glycol monoalkyl ether or alkyl lactate is preferable, and propylene glycol monomethyl ether (PGME: 1-methoxy-2-propanol), propylene glycol monoethyl ether (PGEE), methyl 2-hydroxyisobutyrate, or ethyl lactate is more preferable. In addition, as the solvent containing no hydroxyl group, alkylene glycol monoalkyl ether acetate, alkyl alkoxypropionate, a monoketone compound which may contain a ring, a cyclic lactone, alkyl acetate, or the like is preferable, and among these, propylene glycol monomethyl ether acetate (PGMEA; 1-methoxy-2-acetoxypropane), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone are still more preferable. As a solvent containing no hydroxyl group, propylene carbonate is also preferable. Among these, it is particularly preferable that the solvent includes γ-butyrolactone from the viewpoint of uniformity of a layer to be formed.

A mixing ratio (mass ratio) of the solvent containing a hydroxyl group to the solvent containing no hydroxyl group is 1/99 to 99/1, preferably 10/90 to 90/10, and more preferably 20/80 to 60/40. A mixed solvent containing 50% by mass or more of the solvent containing no hydroxyl group is preferable from the viewpoint of coating evenness.

The solvent preferably includes propylene glycol monomethyl ether acetate, and may be a single solvent of propylene glycol monomethyl ether acetate or a mixed solvent of two or more kinds containing propylene glycol monomethyl ether acetate.

The concentration of solid contents of the actinic ray-sensitive or radiation-sensitive resin composition according to the embodiment of the present invention is not particularly limited, but is preferably 0.5% by mass to 50% by mass, more preferably 1.0% by mass to 45% by mass, and still more preferably 1.0% by mass to 40% by mass.

In a case where a film formed from the actinic ray-sensitive or radiation-sensitive resin composition according to the embodiment of the present invention is exposed by a KrF excimer laser, a concentration of solid contents of the actinic ray-sensitive or radiation-sensitive resin composition is preferably 10% by mass or more, more preferably 15% by mass or more, and still more preferably 20% by mass or more.

The concentration of solid contents is a mass percentage of other resist components excluding the solvent and the amine oxide (P) with respect to the total mass of the composition.

<Crosslinking Agent>

The actinic ray-sensitive or radiation-sensitive resin composition according to the embodiment of the present invention may contain a compound (hereinafter also referred to as a crosslinking agent (G)) which crosslinks a resin by the action of an acid.

As the crosslinking agent (G), a known compound can be appropriately used. For example, the known compounds disclosed in paragraphs 0379 to 0431 of US2016/0147154A and paragraphs 0064 to 0141 of US2016/0282720A can be suitably used as the crosslinking agent (G).

The crosslinking agent (G) is a compound having a crosslinkable group capable of crosslinking a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (G) is preferably a compound (also including a resin) having two or more crosslinkable groups.

The crosslinking agent (G) is more preferably a phenol derivative having a hydroxymethyl group or an alkoxymethyl group, a urea-based compound (a compound having a urea structure) or a melamine compound (a compound having a melamine structure).

The crosslinking agents may be used alone or in combination of two or more kinds thereof.

A content of the crosslinking agent (G) is preferably 1% by mass to 50% by mass, more preferably 3% by mass to 40% by mass, and still more preferably 5% by mass to 30% by mass with respect to the total solid content of the composition.

<(H) Surfactant>

The actinic ray-sensitive or radiation-sensitive resin composition according to the embodiment of the present invention may or may not contain a surfactant (also referred to as a "surfactant (H)").

In a preferred aspect, the actinic ray-sensitive or radiation-sensitive resin composition according to the embodiment of the present invention further contains the surfactant (H). In a case where the composition contains the surfactant, it is preferable that at least one of a fluorine-based surfactant or a silicone-based surfactant (specifically a fluorine-based surfactant, a silicone-based surfactant, or a surfactant having both of a fluorine atom and a silicon atom) is contained.

By incorporating a surfactant into the actinic ray-sensitive or radiation-sensitive resin composition according to the embodiment of the present invention, it is possible to obtain a resist pattern with good sensitivity and resolution, adhesiveness, and less development defects in a case where an exposure light source at a wavelength of 250 nm or less, in particular, a wavelength of 220 nm or less is used.

Examples of the fluorine-based or silicone-based surfactant include the surfactants described in paragraph 0276 of US2008/0248425A.

In addition, other surfactants other than the fluorine-based or silicone-based surfactant, described in paragraph 0280 of US2008/0248425A, can also be used.

These surfactants may be used alone or in combination of two or more kinds thereof. In a case where the actinic ray-sensitive or radiation-sensitive resin composition according to the embodiment of the present invention contains a surfactant, a content of the surfactant is preferably 0.0001% by mass to 2% by mass, and more preferably 0.0005% by mass to 1% by mass with respect to the total solid content of the composition.

On the other hand, by setting the content of the surfactant to 0.00010% by mass or more with respect to the total solid content of the composition, the hydrophobic resin is further unevenly distributed on the surface. As a result, the surface of the actinic ray-sensitive or radiation-sensitive film can be made more hydrophobic, and the water followability during liquid immersion exposure is improved.

<Other Additives>

The actinic ray-sensitive or radiation-sensitive resin composition according to the embodiment of the present invention may further include other known additives.

Examples of such other additives include an acid proliferation agent, a dye, a plasticizer, a light sensitizer, a light absorber, an alkali-soluble resin, a dissolution inhibitor, and a dissolution accelerator.

The actinic ray-sensitive or radiation-sensitive resin composition according to the embodiment of the present invention is preferably used by dissolving the components in a predetermined organic solvent, and preferably the mixed solvent, filtering the solution through a filter, and then applying the resultant onto, for example, a predetermined support (substrate).

The pore size of a filter for use in filtration through the filter is preferably pore size (pore diameter) of 0.2 μm or less, more preferably 0.05 μm or less, and still more preferably 0.03 μm or less.

In addition, in a case where the concentration of solid contents of the actinic ray-sensitive or radiation-sensitive resin composition is high (for example, 25% by mass or more), the pore size of the filter used for filtration using a filter is preferably 3 µm or less, more preferably 0.5 µm or less, and still more preferably 0.3 µm or less.

The filter is preferably a polytetrafluoroethylene-made, polyethylene-made, or nylon-made filter. In the filtration using a filter, circulating filtration may be performed or the filtration may be performed by connecting plural kinds of filters in series or in parallel, as disclosed in JP2002-62667A, for example. In addition, the composition may be filtered in plural times. Furthermore, the composition may be subjected to a deaeration treatment or the like before or after filtration through a filter.

The film thickness of a resist film formed from the actinic ray-sensitive or radiation-sensitive resin composition according to the embodiment of the present invention is not particularly limited, but is preferably 90 nm or less, and more preferably 85 nm or less, from the viewpoint of improving resolving power. Such a film thickness can be obtained by setting the concentration of solid contents in the composition to an appropriate range to provide the composition with a suitable viscosity and improve the coating property or the film forming property.

<Uses>

The actinic ray-sensitive or radiation-sensitive resin composition according to the embodiment of the present invention relates to an actinic ray-sensitive or radiation-sensitive resin composition having properties that change by undergoing a reaction upon irradiation with light. More specifically, the actinic ray-sensitive or radiation-sensitive resin composition according to the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A resist pattern formed from the actinic ray-sensitive or radiation-sensitive resin composition according to the embodiment of the present invention can be used in an etching step, an ion implantation step, a bump electrode forming step, a rewiring forming step, a micro-electromechanical system (MEMS), or the like.

(Actinic Ray-Sensitive or Radiation-Sensitive Film)

The actinic ray-sensitive or radiation-sensitive film (preferably a resist film) according to an embodiment of the present invention is a film formed from the actinic ray-sensitive or radiation-sensitive resin composition according to the embodiment of the present invention. The actinic ray-sensitive or radiation-sensitive film according to the embodiment of the present invention is a solidified product of the actinic ray-sensitive or radiation-sensitive resin composition according to the embodiment of the present invention.

The solidified product in the present invention may be a product obtained by removing at least a part of a solvent from the actinic ray-sensitive or radiation-sensitive resin composition according to the embodiment of the present invention.

Specifically, the actinic ray-sensitive or radiation-sensitive film according to the embodiment of the present invention can be obtained by applying the actinic ray-sensitive or radiation-sensitive resin composition according to the embodiment of the present invention on a support such as a substrate, for example, and then drying the resultant.

The drying refers to removing at least a part of the solvent included in the actinic ray-sensitive or radiation-sensitive resin composition according to the embodiment of the present invention.

The drying method is not particularly limited, known methods can be used, but examples thereof include drying by heating (for example, 70° C. to 130° C., 30 seconds to 300 seconds).

The heating method is not particularly limited, a known heating means is used, but examples thereof include a heater, an oven, a hot plate, an infrared lamp, and an infrared laser.

The components included in the actinic ray-sensitive or radiation-sensitive film according to the embodiment of the present invention are the same as the components included in the actinic ray-sensitive or radiation-sensitive resin composition according to the embodiment of the present invention, excluding the solvent, and the same applies to the preferred aspects.

A content of each component included in the actinic ray-sensitive or radiation-sensitive film according to the embodiment of the present invention is equivalent to one obtained by changing the description of the "total solid content" in the description of the content of each component other than the solvent of the actinic ray-sensitive or radiation-sensitive resin composition according to the embodiment of the present invention to the "total mass of the actinic ray-sensitive or radiation-sensitive film".

A thickness of the actinic ray-sensitive or radiation-sensitive film according to the embodiment of the present invention is not particularly limited, but is preferably 50 nm to 150 nm, and more preferably 80 nm to 130 nm.

In addition, in a case where it is intended to form a thick actinic ray-sensitive or radiation-sensitive film along with a three-dimensional memory device, the thickness is, for example, preferably 2 µm or more, more preferably from 2 µm to 50 µm, and still more preferably from 2 µm to 20 µm.

(Pattern Forming Method)

The pattern forming method according to an embodiment of the present invention includes:

a step of exposing the actinic ray-sensitive or radiation-sensitive film (preferably the resist film) according to the embodiment of the present invention with actinic rays or radiation (exposing step), and a step of developing the actinic ray-sensitive or radiation-sensitive film after the exposing step, using a developer (developing step).

In addition, the pattern forming method according to the embodiment of the present invention may also be a method including:

a step of forming an actinic ray-sensitive or radiation-sensitive film with the actinic ray-sensitive or radiation-sensitive resin composition according to the embodiment of the present invention on a support (film forming step), a step of exposing the actinic ray-sensitive or radiation-sensitive film by irradiation with actinic rays or radiation (exposing step), and a step of developing the actinic ray-sensitive or radiation-sensitive film after the exposing step, using a developer (developing step).

<Film Forming Step>

The pattern forming method according to the embodiment of the present invention may include a film forming step. Examples of a method for forming the actinic ray-sensitive or radiation-sensitive film in the film forming step include a method for forming an actinic ray-sensitive or radiation-sensitive film by the drying described in the above-mentioned section of the actinic ray-sensitive or radiation-sensitive film.
[Support]
The support is not particularly limited, and a substrate which is generally used in a step of manufacturing a semiconductor such as an IC, and a step of manufacturing a circuit board for a liquid crystal, a thermal head, or the like, and other lithographic steps of photofabrication can be used. Specific examples of the support include an inorganic substrate such as silicon, $SiO_2$, and SiN.
<Exposing Step>
The exposing step is a step of exposing an actinic ray-sensitive or radiation-sensitive film with light.
The exposing method may be liquid immersion exposure.
The pattern forming method according to the embodiment of the present invention may include the exposing step a plurality of times.
A type of the light (actinic rays or radiation) used for exposure may be selected in consideration of characteristics of a photoacid generator, a pattern shape to be obtained, and the like, but examples of the light include infrared rays, visible light, ultraviolet rays, far ultraviolet rays, extreme ultraviolet rays (EUV), X-rays, and electron beams, and the far ultraviolet rays are preferable.
For example, actinic rays at a wavelength of 250 nm or less are preferable, actinic rays at a wavelength of 220 nm or less are more preferable, and actinic rays at a wavelength of 1 to 200 nm are still more preferable.
Specific examples of light used include a KrF excimer laser (248 nm), an ArF excimer laser (193 nm), an $F_2$ excimer laser (157 nm), X-rays, EUV (13 nm), and electron beams, and the ArF excimer laser, EUV, or the electron beams are preferable.
Among those, the exposure in the exposing step is preferably performed by liquid immersion exposure with an argon fluoride laser.
The exposure dose is preferably 5 mJ/cm² to 200 mJ/cm², and more preferably 10 mJ/cm² to 100 mJ/cm².
<Developing Step>
The developer used in the developing step may be an alkali developer or a developer containing an organic solvent (hereinafter also referred to as an organic developer), or is preferably an aqueous alkali solution.
[Alkali Developer]
As the alkali developer, a quaternary ammonium salt typified by tetramethylammonium hydroxide is preferably used, but in addition to the quaternary ammonium salt, an aqueous alkali solution such as an inorganic alkali, primary to tertiary amines, alkanolamine, and cyclic amine can also be used.
In addition, the alkali developer may contain an appropriate amount of at least one of alcohols or a surfactant. The alkali concentration of the alkali developer is preferably 0.1% by mass to 20% by mass. The pH of the alkali developer is preferably 10 to 15.
A period for performing development using the alkali developer is preferably 10 seconds to 300 seconds.
The alkali concentration, the pH, and the development time using the alkali developer can be appropriately adjusted depending on a pattern formed.
[Organic Developer]
The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

—Ketone-Based Solvent—
Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.
—Ester-Based Solvent—
Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.
—Other Solvents—
As the alcohol-based solvent, the amide-based solvent, the ether-based solvent, and the hydrocarbon-based solvent, the solvents disclosed in paragraphs 0715 to 0718 of the specification of US2016/0070167A can be used.
A plurality of the solvents may be mixed or the solvent may be used in admixture with a solvent other than those described above or water. The water content in the entire developer is preferably less than 50% by mass, more preferably less than 20% by mass, and still more preferably less than 10% by mass, and particularly preferably, water is not substantially contained.
A content of the organic solvent in the organic developer is preferably from 50% by mass to 100% by mass, more preferably from 80% by mass to 100% by mass, still more preferably from 90% by mass to 100% by mass, and particularly preferably from 95% by mass to 100% by mass with respect to the total amount of the developer.
—Surfactant—
The organic developer can contain an appropriate amount of a known surfactant, as desired.
A content of the surfactant is preferably 0.001% by mass to 5% by mass, more preferably 0.005% by mass to 2% by mass, and still more preferably 0.01% by mass to 0.5% by mass with respect to the total mass of the developer.
—Acid Diffusion Control Agent—
The organic developer may include the above-described acid diffusion control agent.
[Developing Method]
As the developing method, for example, a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), a method in which a developer is continuously jetted onto a substrate rotating at a constant rate while scanning a developer jetting nozzle at a constant rate (a dynamic dispense method), or the like can be applied.
A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

<Prebaking Step and Post-Exposure Baking Step>

The pattern forming method according to the embodiment of the present invention preferably includes a prebaking (PB) step before the exposing step.

The pattern forming method according to the embodiment of the present invention may include the prebaking step a plurality of times.

The pattern forming method according to the embodiment of the present invention preferably includes a post-exposure baking (PEB) step after the exposing step and before the developing step.

The pattern forming method according to the embodiment of the present invention may include the post-exposure baking step a plurality of times.

The heating temperature is preferably 70° C. to 130° C., and more preferably 80° C. to 120° C. in any of the prebaking step and the post-exposure baking step.

The heating time is preferably 30 seconds to 300 seconds, more preferably 30 seconds to 180 seconds, and still more preferably 30 seconds to 90 seconds in any of the prebaking step and the post-exposure baking step.

The baking may be performed using a unit included in an exposure device and a development device, or may also be performed using a hot plate or the like.

<Resist Underlayer Film Forming Step>

The pattern forming method according to the embodiment of the present invention may further include a step of forming a resist underlayer film (resist underlayer film forming step) before the film forming step.

The resist underlayer film forming step is a step of forming a resist underlayer film (for example, spin on glass (SOG), spin on carbon (SOC), and an antireflection film) between the resist film and the support. As the resist underlayer film, known organic or inorganic materials can be appropriately used.

<Protective Film Forming Step>

The pattern forming method according to the embodiment of the present invention may further include a step of forming a protective film (protective film forming step) before the developing step.

The protective film forming step is a step of forming a protective film (topcoat) on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-mentioned acid diffusion control agent.

The protective film may also be formed on the upper layer of the resist film containing the above-mentioned hydrophobic resin.

<Rinsing Step>

The pattern forming method according to the embodiment of the present invention preferably includes a step of performing washing with a rinsing liquid (rinsing step) after the developing step.

[Case of Developing Step Using Alkali Developer]

As the rinsing liquid used in the rinsing step after the developing step with an alkali developer, for example, pure water can be used. The pure water may contain an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

[Case of Developing Step Using Organic Developer]

The rinsing liquid used in the rinsing step after the developing step with a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used. Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

As the rinsing liquid used in the rinsing step in this case, a rinsing liquid containing a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

The moisture content in the rinsing liquid is preferably 10% by mass or less, more preferably 5% by mass or less, and still more preferably 3% by mass or less. By setting the moisture content to 10% by mass or less, good development characteristics are obtained.

The rinsing liquid may contain an appropriate amount of a surfactant.

In the rinsing step, the substrate that has been subjected to development using an organic developer is subjected to a washing treatment using a rinsing liquid including an organic solvent. A method for the washing treatment method is not particularly limited, but for example, a method in which a rinsing liquid is continuously jetted on a substrate rotated at a constant rate (a rotation application method), a method in which a substrate is immersed in a tank filled with a rinsing liquid for a certain period of time (a dip method), a method in which a rinsing liquid is sprayed on a substrate surface (a spray method), and the like can be applied. Among those, it is preferable that a washing treatment is performed using the rotation application method, and a substrate is rotated at a rotation speed of 2,000 rpm to 4,000 rpm (rotations/min) after washing, thereby removing the rinsing liquid from the substrate. Furthermore, it is also preferable that the method includes a baking step after the rinsing step (postbaking). The developer and the rinsing liquid remaining between and inside the patterns are removed by the baking step. In the baking step after the rinsing step, the heating temperature is preferably 40° C. to 160° C., and more preferably 70° C. to 95° C. The heating time is preferably 10 seconds to 3 minutes, and more preferably 30 seconds to 90 seconds.

<Improvement of Surface Roughness>

A method for enhancing the surface roughness of a pattern may be applied to a pattern formed by the pattern forming method according to the embodiment of the present invention. Examples of the method for enhancing the surface roughness of a pattern include the method of treating a resist pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 8328 83280N-1 "EUV Resist Curing Technique for LWR Reduction and Etch Selectivity Enhancement" may be applied.

In addition, a resist pattern formed by the method can be used as a core material (core) of the spacer process disclosed in, for example, the specification of JP1991-270227A (JP-H03-270227A) and the specification of US2013/0209941A.

(Method for Manufacturing Electronic Device)

A method for manufacturing an electronic device according to an embodiment of the present invention includes the pattern forming method according to the embodiment of the present invention. The electronic device manufactured by the method for manufacturing an electronic device according to an embodiment of the present invention is suitably mounted on electric or electronic equipment (for example, home electronics, office automation (OA)-related equipment, media-related equipment, optical equipment, and telecommunication equipment).

EXAMPLES

Hereinafter, embodiments of the present invention will be described in more detail with reference to Examples. The materials, the amounts of materials used, the proportions, the treatment details, the treatment procedure, and the like shown in the Examples below may be modified as appropriate as long as the modifications do not depart from the spirit of the embodiments of the present invention. Therefore, the scope of the embodiments of the present invention should not be construed as being limited to specific examples shown below. In addition, "part" and "%" are based on mass unless otherwise specified.

<Resin (A)>

The structures of the resins (A-1 to A-17) used are shown below.

Furthermore, the weight-average molecular weights (Mw), the number-average molecular weights (Mn), and the dispersities (Mw/Mn) of the resins were measured by means of GPC (carrier: tetrahydrofuran (THF)) (an amount expressed in terms of polystyrene) described above. In addition, the compositional ratios (ratios in % by mole) of the resins were measured by means of $^{13}$C-Nuclear Magnetic Resonance (NMR).

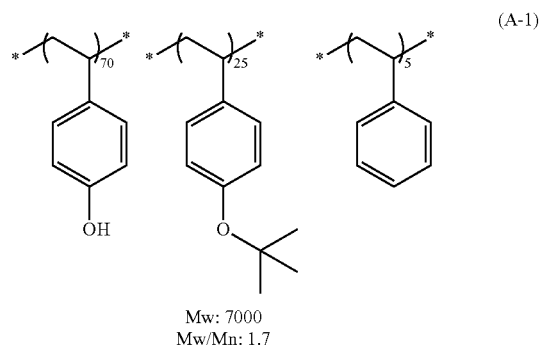

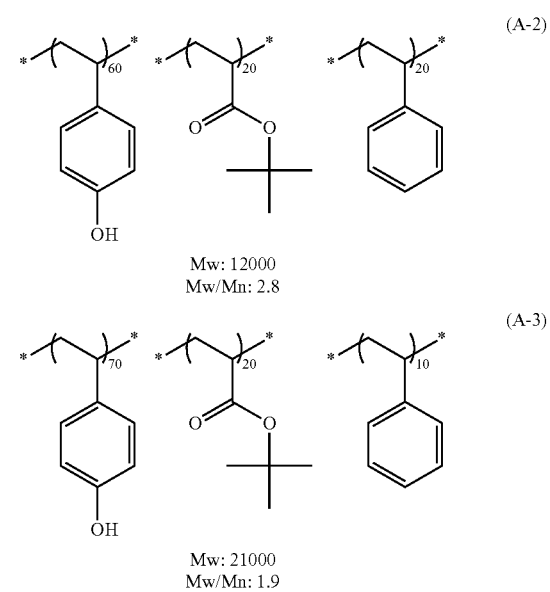

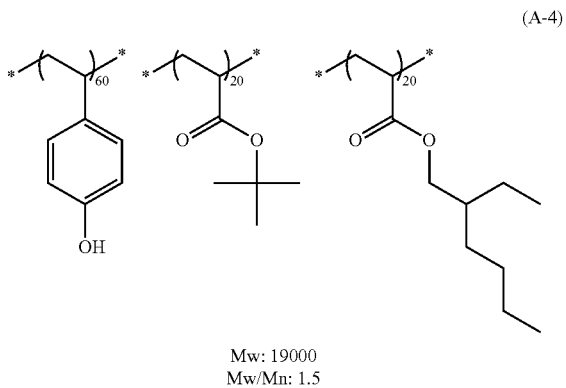

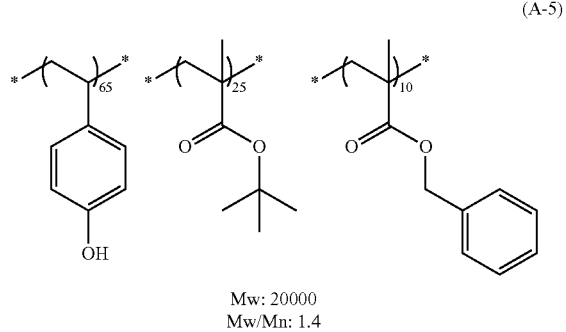

(A-6)
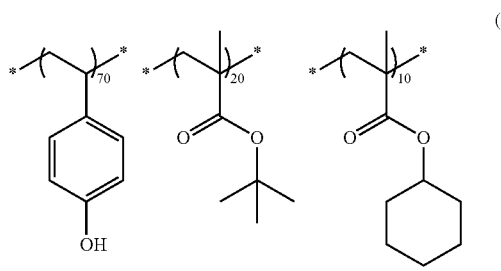
Mw: 20000
Mw/Mn: 1.6
(A-10)
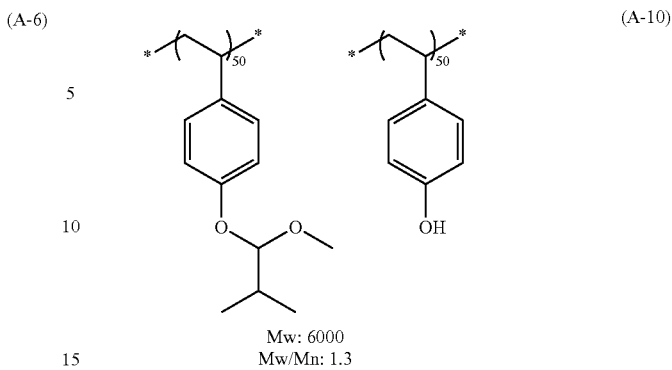
Mw: 6000
Mw/Mn: 1.3
(A-7)
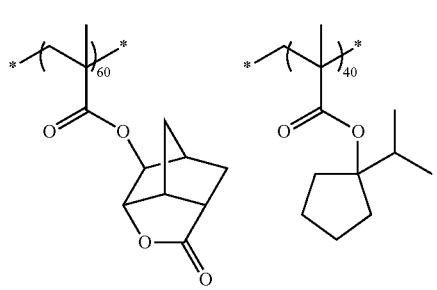
Mw: 8000
Mw/Mn: 1.4
(A-11)
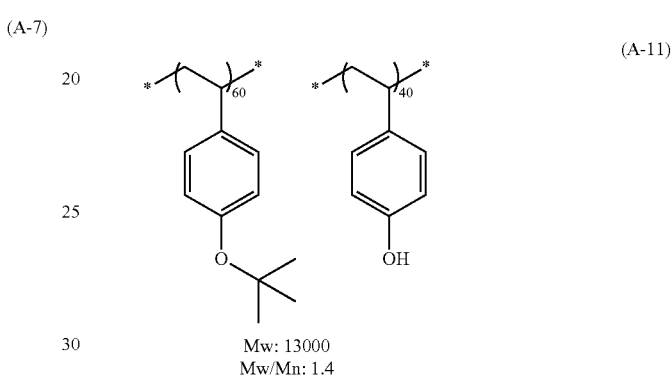
Mw: 13000
Mw/Mn: 1.4
(A-8)
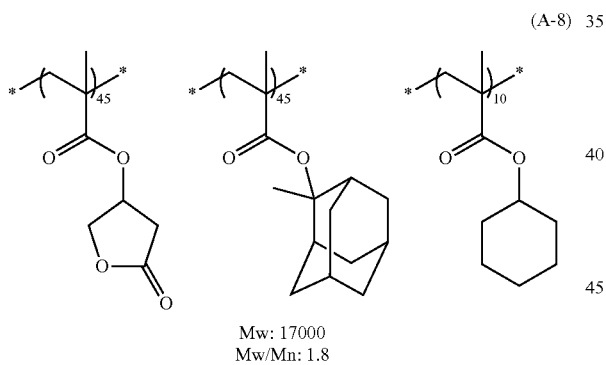
Mw: 17000
Mw/Mn: 1.8
(A-12)
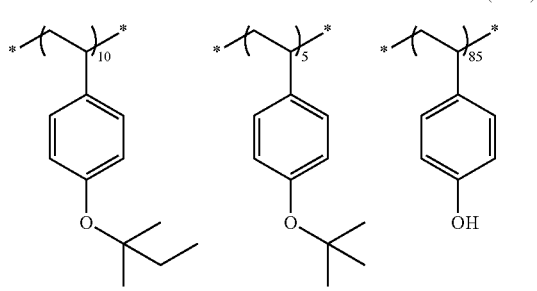
Mw: 3500
Mw/Mn: 1.1
(A-9)
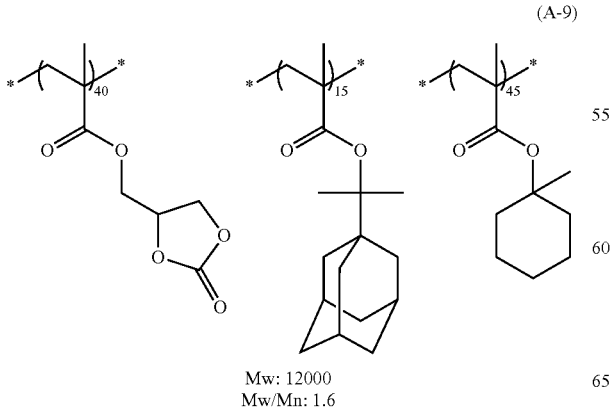
Mw: 12000
Mw/Mn: 1.6
(A-13)
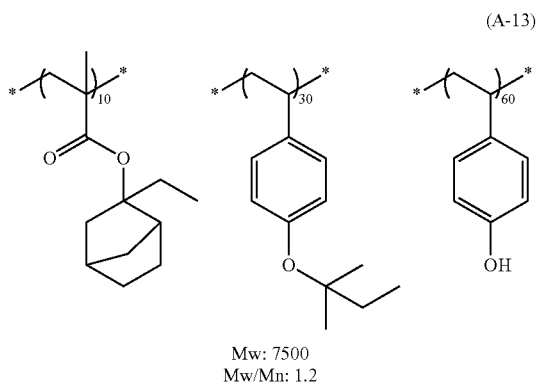
Mw: 7500
Mw/Mn: 1.2

-continued

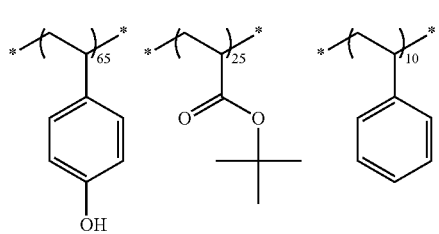

(A-14)

Mw: 10000
Mw/Mn: 2.5

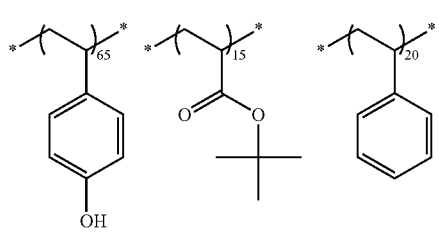

(A-15)

Mw: 10000
Mw/Mn: 2.5

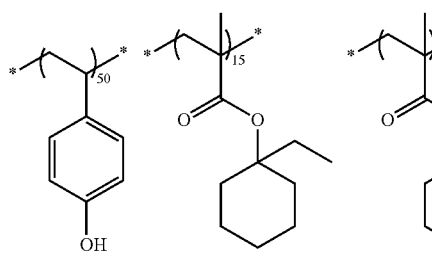

(A-16)

Mw: 10000
Mw/Mn: 2.5

(A-17)

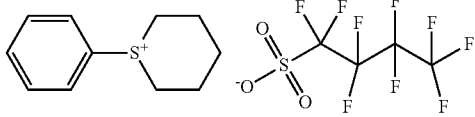

Mw: 10000
Mw/Mn: 2.5

Furthermore, the unit of the content ratio of each repeating unit of the resin is % by mole.

With regard to a value of the glass transition temperature (Tg) in a case of forming a homopolymer of a monomer a1 corresponding to a repeating unit (a1) derived from a monomer (monomer a1) having a glass transition temperature (Tg) in a case of forming the homopolymers in the present specification and Examples of 50° C. or lower, reference can be made to the description of PCT/JP2018/018239.

<Photoacid Generator>

The structures of the photoacid generators (C-1 to C-15) used are shown below. $^n$Bu represents an n-butyl group and tBu represents a t-butyl group.

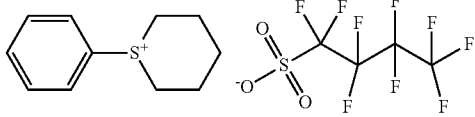
(C-1)

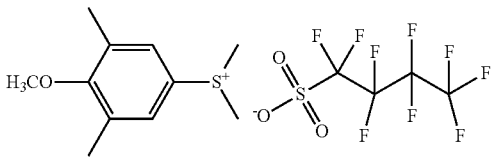
(C-2)

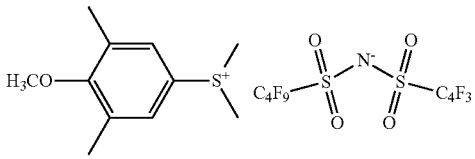
(C-3)

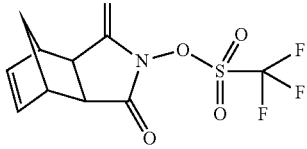
(C-4)

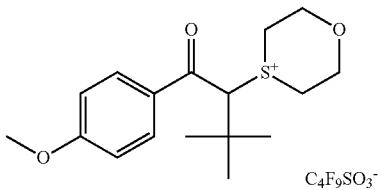
(C-5)

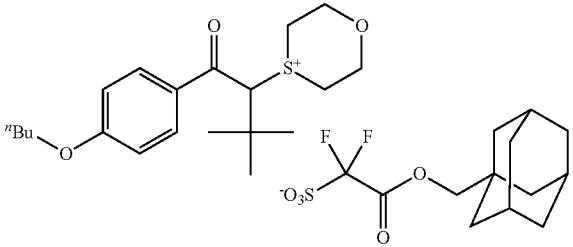
(C-6)

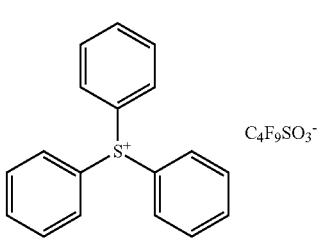
(C-7)

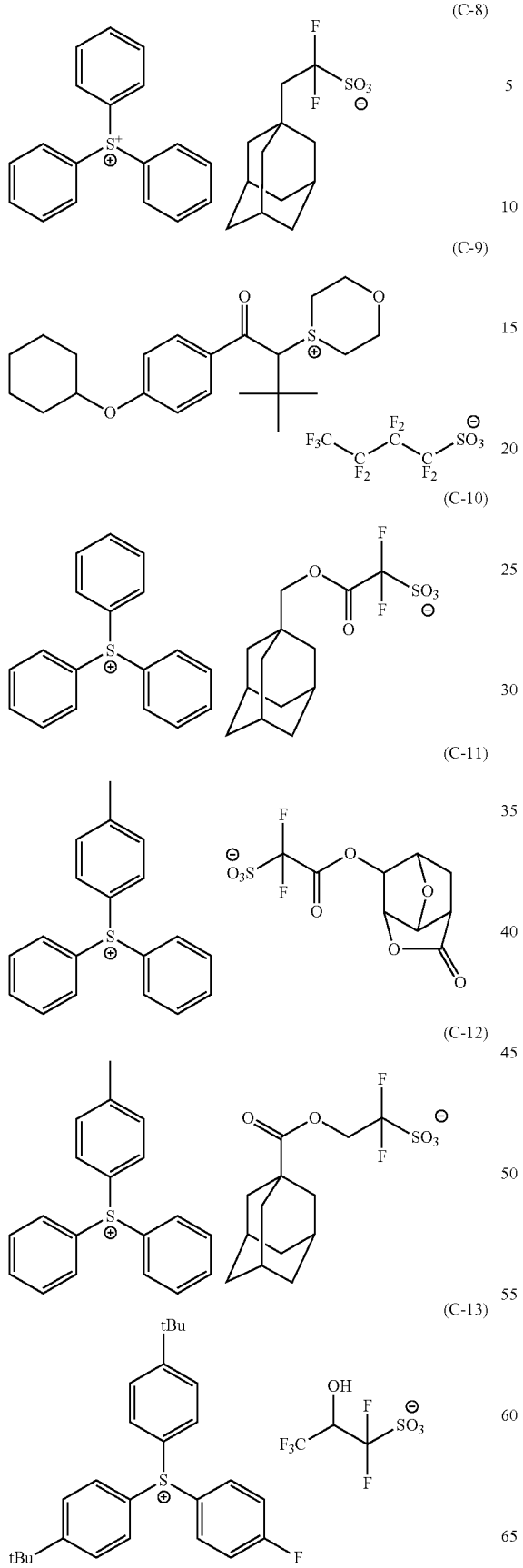
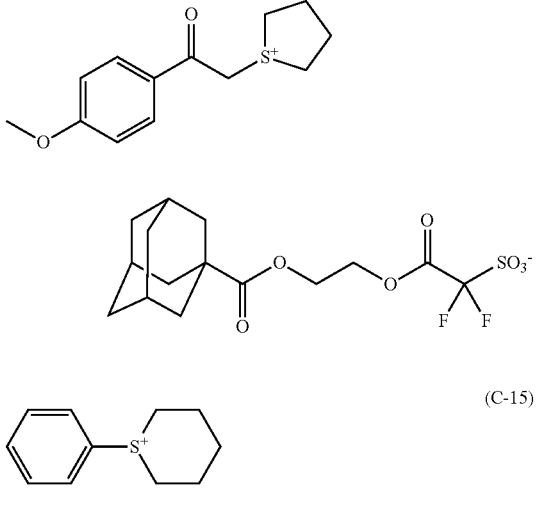
<Acid Diffusion Control Agent (D)>
The structures of the acid diffusion control agents (D) used are shown below.
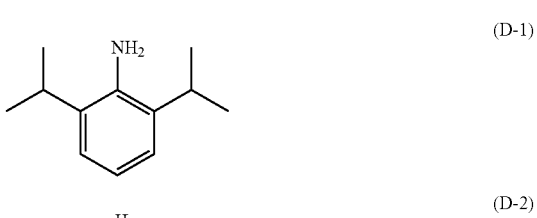
Triethanolamine
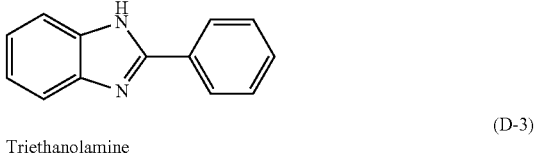
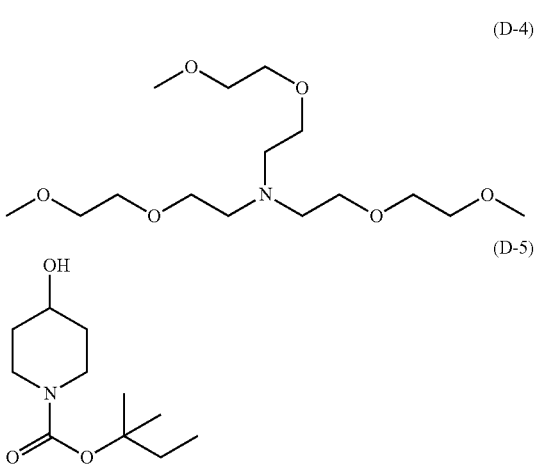

-continued

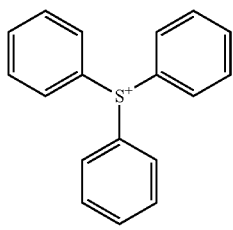
(D-6)

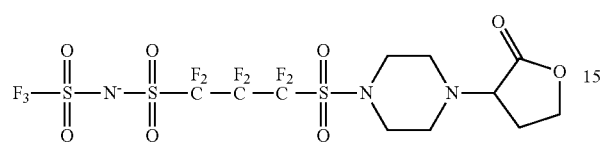
(D-7)

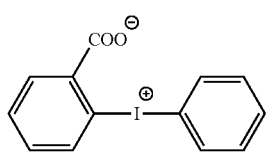
(D-8)

Tri-n-pentyamine (D-9)

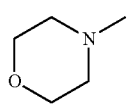
(D-10)

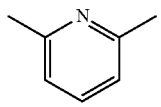
(D-11)

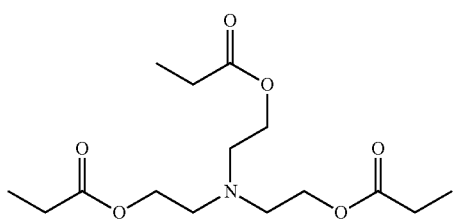
(D-12)

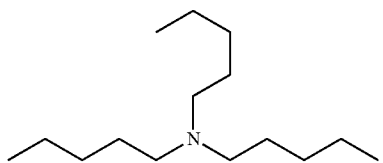
(D-13)

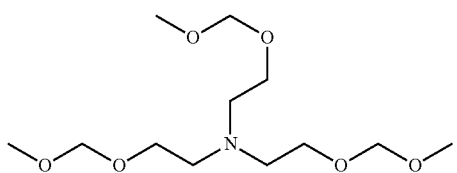
(D-14)

-continued

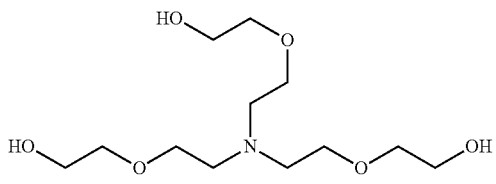
(D-15)

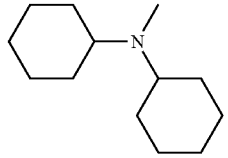
(D-16)

The structures of the crosslinking agents used are shown below.

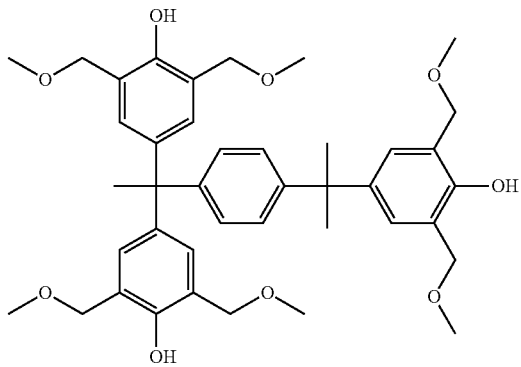
(G-1)

The structures of the hydrophobic resins used are shown below. Furthermore, the weight-average molecular weights (Mw), the number-average molecular weights (Mn), and the dispersities (Mw/Mn) of the hydrophobic resins were measured by means of GPC (carrier: tetrahydrofuran (THF)) (an amount expressed in terms of polystyrene) described above. In addition, the compositional ratios (ratios in % by mole) of the resins were measured by means of $^{13}$C-Nuclear Magnetic Resonance (NMR).

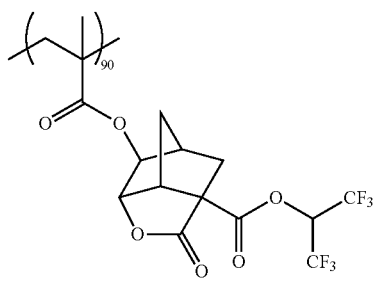
(F-1)

-continued
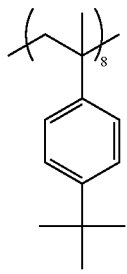
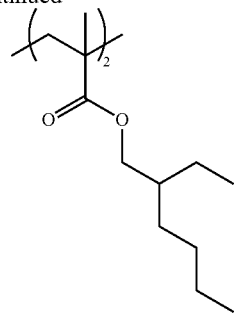
Mw: 12000
Mw/Mn: 1.7
(F-2)
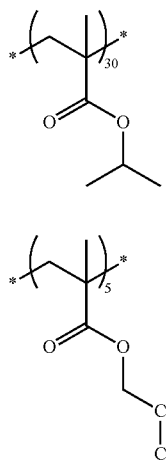
Mw: 15000
Mw/Mn: 1.5
The structures of the amine oxides (P) are shown in Table 1 below.
TABLE 1-1
| No. | Structural formula |
| --- | --- |
| AE-1 | 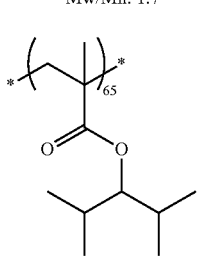 |
| AE-2 | |
| AE-3 | |
| AE-4 | 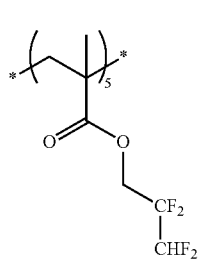 |
TABLE 1-1-continued
| No. | Structural formula |
| --- | --- |
| AE-5 | |
| AE-6 | |
| AE-7 | |
| AE-8 | |
| AE-9 | |
| AE-10 | |
| AE-11 | |
| AE-12 | |

TABLE 1-2

| No. | Structural formula |
|---|---|
| AE-13 | (structure: N-oxide with three CH$_2$CH$_2$CN groups) |
| AE-14 | (structure: N-oxide with CH$_2$CH$_2$OH, CH$_2$CH$_2$OH, and CH$_2$CH(OH)CH$_3$ groups) |
| AE-15 | (structure: N-oxide with three CH$_2$CH$_2$OCH$_2$OCH$_3$ groups) |
| AE-16 | (structure: N-oxide with three CH$_2$CH$_2$OCH$_2$CH$_2$OH groups) |
| AE-17 | (structure: N-oxide with three CH$_2$CH$_2$OCH$_3$ groups) |
| AE-18 | (structure: N-oxide with three CH$_2$CH$_2$O-n-butyl groups) |
| AE-19 | (structure: N-oxide with two methyl groups and one allyl group) |

TABLE 1-2-continued

| No. | Structural formula |
|---|---|
| AE-20 | (structure: N-oxide with benzyl, CH$_2$CH$_2$OH, and CH$_2$CH$_2$OH groups) |
| AE-21 | (structure: N-oxide with methyl and two cyclohexyl groups) |

The surfactants used are shown below.

(E-1)

$$H{\left(O\underset{\underset{CH_2OH}{|}}{\overset{\overset{CH_2OCH_2CF_3}{|}}{C}}\right)}_{20}OH$$

E-2: MEGAFACE R-41 (manufactured by DIC Corporation)
E-3: KF-53 (manufactured by Shin-Etsu Chemical Co., Ltd.)
E-4: MEGAFACE F176 (manufactured by DIC Corporation)
E-5: MEGAFACE R08 (manufactured by DIC Corporation)

The solvents used are shown below.
S-1: Propylene glycol monomethyl ether acetate (PG-MEA)
S-2: Propylene glycol monomethyl ether (PGME)
S-3: Ethyl lactate
S-4: Ethyl 3-ethoxypropionate
S-5: 2-Heptanone
S-6: Methyl 3-methoxypropionate
S-7: 3-Methoxybutyl acetate
S-8: Butyl acetate Examples 1 to 60 and Comparative Examples 1 to 6

<Preparation of Actinic Ray-Sensitive or Radiation-Sensitive Resin Composition> (KrF Exposure)

Examples 1 to 7, 15 to 18, 23 to 29, and 36 to 60, and Comparative Examples 1 to 6

The respective components shown in Table 2 were mixed such that they reached a concentration (% by mass) of solid contents described in Table 2, thereby obtaining a solution. Then, an actinic ray-sensitive or radiation-sensitive resin composition (resist composition) was prepared by filtering the obtained solution through a polyethylene filter having a pore size of 3 μm.

Moreover, in the resist composition, the solid contents in Examples and Comparative Examples mean all components other than the solvent and the amine oxide (P). The obtained resist compositions were used in Examples and Comparative Examples.

Furthermore, in the tables, the content (% by mass) of each component other than the solvent means a content ratio with respect to the total solid content. In addition, the content ratio (% by mass) of the solvent used with respect to all solvents is described in the tables.

<Measurement of Content of Amine Oxide (P) of Actinic Ray-Sensitive or Radiation-Sensitive Resin Composition>

The amine oxide (P) in the actinic ray-sensitive or radiation-sensitive resin composition shown in Table 2 was added at a content shown in Table 2.

Furthermore, the content of the amine oxide (P) was measured as follows.

(Method for Quantifying Amine Oxide (P))

A resist composition including the amine oxide (P) was prepared and irradiated with ultrasonic waves for 3 minutes, using an ultrasonic device (Desktop ultrasonic cleaner (#5510), manufactured by Branson Ultrasonics Corporation). The obtained solution was analyzed with a liquid chromatograph device (Agilent 1100 HPLC G1311A, manufactured by Agilent Technologies, Inc.) of a UV detector (Agilent 1100 HPLC G1315B, manufactured by Agilent Technologies, Inc.) using a reverse phase column (Shim-pack CLC-ODS (M), manufactured by Shimadzu GLC Ltd.).

The content of the amine oxide (P) was quantified by an absolute calibration curve method using a standard reagent of the amine oxide (P).

Furthermore, the standard reagent is an amine oxide (P) whose concentration is known and which is to be quantified.

<Pattern Forming Method (1): KrF Exposure, Aqueous Alkali Solution Development>

The resist composition described in Table 2, which had been prepared above, was added dropwise to an 8-inch Si substrate (manufactured by Advanced Materials Technology (hereinafter also referred to as a "substrate")) in the state where the substrate was stationary, which had been subjected to a hexamethyldisilazane treatment, using a spin coater "ACT-8" manufactured by Tokyo Electron Limited, while not being provided with an antireflection layer. After the dropwise addition, the substrate was rotated while maintaining the rotation speed at 500 rpm for 3 seconds, at 100 rpm for 2 seconds, at 500 rpm for 3 seconds, and at 100 rpm for 2 seconds again, and thereafter, the rotation speed was raised to a film thickness-setting rotation speed (1,200 rpm), which was maintained for 60 seconds. Thereafter, drying under heating was performed on a hot plate at 130° C. for 60 seconds to form a positive-tone resist film having a film thickness of 12 μm.

This resist film was subjected to pattern exposure under an exposure condition of NA=0.60 and σ=0.75 through a mask with a line-and-space pattern having a space width of 4.5 μm and a pitch width of 25 μm of a pattern formed after the reduction projection exposure and the development, using a KrF excimer laser scanner (manufactured by ASML, PAS5500/850C wavelength 248 nm). After the irradiation, the resist film was baked at 120° C. for 60 seconds, immersed in an aqueous 2.38%-by-mass tetramethylammonium hydroxide (TMAH) solution for 60 seconds, then rinsed with pure water for 30 seconds, dried, and then baked at 110° C. for 60 seconds to form an isolated space pattern having a space width of 4.5 μm and a pitch width of 25 μm.

Furthermore, the pattern exposure was an exposure through a mask having a line-and-space pattern such that the space width and the pitch width after the reduction projection exposure and the development became 4.5 μm and 25 μm, respectively, and the exposure dose was an optimum exposure dose (sensitivity) (mJ/cm$^2$) for forming an isolated space pattern having a space width of 4.5 μm and a pitch width of 25 μm. In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Performance Evaluation>

[Adhesiveness to Substrate]

In a chamber in a critical dimension-scanning electron microscope (CD-SEM) (S-9380II, manufactured by Hitachi, Ltd.), a pattern wafer for evaluation was subjected to a vacuum treatment (evacuation) for 60 seconds. In addition, a pressure in the chamber was set to 0.002 Pa.

After the vacuum treatment, the pattern wafer for evaluation was observed with an optical microscope to evaluate the adhesiveness. Specifically, the number of the peeled films (/8-inch wafer) in a pattern formed on the substrate surface was counted and evaluated based on the following standard.

"A": No film is peeled
"B": 1 or more and less than 5 films are peeled
"C": 5 or more and less than 50 films are peeled
"D": 50 or more films are peeled

[Sensitivity]

The same resist composition as each resist composition, except that the resist composition included no amine oxide (P), was separately prepared, and an isolated space pattern was formed in the same manner as described above. For the obtained isolated space pattern, the sensitivity was determined in the same manner as above. Using the sensitivity of the isolated space pattern formed of the resist composition including no amine oxide (P) as a standard, how much the sensitivity of the isolated space pattern formed of a resist composition including the amine oxide (P) was reduced was evaluated according to the following determination standard.

It should be noted that the resist composition according to Comparative Example 1 did not contain amine oxide (P) and the sensitivity was evaluated as A.

(Determination Standard)

A: The observed sensitivity reduction is less than 1 mJ/cm$^2$

B: The observed sensitivity reduction is 1 mJ/cm$^2$ or more and less than 2 mJ/cm$^2$ C: The observed sensitivity reduction is 2 mJ/cm$^2$ or more and less than 3 mJ/cm$^2$ D: The observed sensitivity reduction is 3 mJ/cm$^2$ or more <Preparation of Actinic Ray-Sensitive or Radiation-Sensitive Resin Composition> (ArF Exposure)

Examples 8 to 10, 19, 20, 30, and 31

Various components shown in Table 2 were mixed, and the mixture was mixed such that it reached a concentration (% by mass) of solid contents described in Table 2, thereby obtaining a solution. The obtained solution was first filtered through a polyethylene-made filter having a pore diameter of 50 nm, then through a nylon-made filter having a pore diameter of 10 nm, and finally through a polyethylene-made filter having a pore diameter of 5 nm in this order. The obtained actinic ray-sensitive or radiation-sensitive resin composition (resist composition) was used in Examples.

Moreover, in the resist composition, the solid contents in the present Examples mean all components other than the solvent and the amine oxide (P).

Furthermore, in the tables, the content (% by mass) of each component other than the solvent means a content ratio with respect to the total solid content. In addition, the content ratio (% by mass) of the solvent used with respect to all solvents is described in the tables. The content of the amine oxide (P) was measured in the same manner as above.

<Pattern Forming Method (2): ArF Liquid Immersion Exposure, Aqueous Alkali Solution Development (Positive)>

A composition for forming an organic antireflection film, SOC9110D, and a composition for forming an Si-containing antireflection film, HM9825, were applied onto a silicon wafer to form an antireflection film. A resist composition was applied onto the obtained antireflection film and baked (PB: prebaking) at 100° C. for 60 seconds to form a resist film having a film thickness of 100 nm.

The obtained wafer was exposed through a 6% halftone mask having a 1:1 line-and-space pattern with a line width of 100 nm by using an ArF excimer laser liquid immersion scanner (manufactured by ASML; XT1700i, NA0.85, Annular, outer sigma 0.9, inner sigma 0.6). Ultrapure water was used as the immersion liquid. Thereafter, the wafer was post-exposure baked (PEB) at 90° C. for 60 seconds. Thereafter, the wafer was puddle-developed with an aqueous tetramethylammonium hydroxide solution (2.38% by mass) as a developer for 30 seconds and rinsed with pure water to obtain a 1:1 line-and-space (LS) pattern having a line width of 100 nm.

Furthermore, an optimum exposure dose (sensitivity) (mJ/cm$^2$) for forming a 1:1 line-and-space (LS) pattern with a line width of 100 nm was used. In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Pattern Forming Method (3): ArF Liquid Immersion Exposure, Organic Solvent Development (Negative)>

A composition for forming an organic antireflection film, SOC9110D, and a composition for forming an Si-containing antireflection film, HM9825, were applied onto a silicon wafer to form an antireflection film. A resist composition was applied onto the obtained antireflection film and baked (PB: prebaking) at 100° C. for 60 seconds to form a resist film having a film thickness of 100 nm.

The obtained wafer was exposed through a 6% halftone mask having a 1:1 line-and-space pattern with a line width of 100 nm by using an ArF excimer laser liquid immersion scanner (manufactured by ASML; XT1700i, NA0.85, Annular, outer sigma 0.9, inner sigma 0.6). Ultrapure water was used as the immersion liquid. Thereafter, the wafer was post-exposure baked (PEB) at 90° C. for 60 seconds. Thereafter, the wafer was puddle-developed with butyl acetate as a developer for 30 seconds and rinsed with methyl isobutyl carbinol (MIBC) to obtain a 1:1 line-and-space (LS) pattern having a line width of 100 nm.

Furthermore, an optimum exposure dose (sensitivity) (mJ/cm$^2$) for forming a 1:1 line-and-space (LS) pattern with a line width of 100 nm was used. In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Performance Evaluation>

The adhesiveness to a substrate was evaluated by the same evaluation method and evaluation standard as those for KrF exposure.

[Sensitivity]

The same resist composition as each resist composition, except that the resist composition included no amine oxide (P), was separately prepared, and a line-and-space pattern was formed in the same manner as described above. For the obtained isolated space pattern, the sensitivity was determined in the same manner as above. Using the sensitivity of the line-and-space pattern formed of the resist composition including no amine oxide (P) as a standard, how much the sensitivity of the line-and-space pattern formed of a resist composition including the amine oxide (P) was reduced was evaluated according to the following determination standard.

(Determination Standard)

A: The observed sensitivity reduction is less than 1 mJ/cm$^2$

B: The observed sensitivity reduction is 1 mJ/cm$^2$ or more and less than 2 mJ/cm$^2$ C: The observed sensitivity reduction is 2 mJ/cm$^2$ or more and less than 3 mJ/cm$^2$ D: The observed sensitivity reduction is 3 mJ/cm$^2$ or more <Preparation of Actinic Ray-Sensitive or Radiation-Sensitive Resin Composition> (EUV Exposure)

Examples 11, 12, 21, 32, and 33

Various components shown in Table 2 were mixed, and the mixture was mixed such that it reached a concentration (% by mass) of solid contents described in Table 2, thereby obtaining a solution. The obtained solution was first filtered through a polyethylene-made filter having a pore diameter of 50 nm, then through a nylon-made filter having a pore diameter of 10 nm, and finally through a polyethylene-made filter having a pore diameter of 5 nm in this order. The obtained actinic ray-sensitive or radiation-sensitive resin composition (resist composition) was used in Examples.

Moreover, in the resist composition, the solid contents in the present Examples mean all components other than the solvent and the amine oxide (P).

Furthermore, in the tables, the content (% by mass) of each component other than the solvent means a content ratio with respect to the total solid content. In addition, the content ratio (% by mass) of the solvent used with respect to all solvents is described in the tables.

The content of the amine oxide (P) was measured in the same manner as above.

<Pattern Forming Method (4): EUV Exposure, Alkali Development (Positive)>

AL412 (manufactured by Brewer Science, inc.) was applied onto a silicon wafer and baked at 205° C. for 60 seconds to form an underlayer film having a film thickness of 30 nm. The resist composition was applied thereon and pre-baked (PB) at 120° C. for 60 seconds to form a resist film having a film thickness of 30 nm.

The resist film was subjected to patternwise irradiation using an EUV exposure device (manufactured by Exitech Ltd., Micro Exposure Tool, NA 0.3, Quadrupole, outer sigma 0.68, inner sigma 0.36). Further, as a reticle, a mask having a line size=40 nm and a line:space=1:1 was used.

The resist film after the exposure was post-exposure baked (PEB) at 120° C. for 60 seconds, developed with an aqueous tetramethylammonium hydroxide solution (TMAH, 2.38%-by-mass) for 30 seconds, and then rinsed with pure water for 30 seconds. A line-and-space pattern having a pitch of 80 nm and a line width of 40 nm (space width: 40 nm) was obtained by rotating the silicon wafer at a rotation speed of 4,000 rpm for 30 seconds and baking at 90° C. for 60 seconds.

Furthermore, an optimum exposure dose (sensitivity) (mJ/cm$^2$) for forming a line-and-space (LS) pattern with a line width of 40 nm was used. In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Pattern Forming Method (5): EUV Exposure, Organic Solvent Development (Negative)>

AL412 (manufactured by Brewer Science, inc.) was applied onto a silicon wafer and baked at 205° C. for 60 seconds to form an underlayer film having a film thickness of 30 nm. The resist composition shown in Table 2 was applied thereon and pre-baked (PB) at 120° C. for 60 seconds to form a resist film having a film thickness of 30 nm.

The resist film was subjected to patternwise irradiation using an EUV exposure device (manufactured by Exitech Ltd., Micro Exposure Tool, NA 0.3, Quadrupole, outer sigma 0.68, inner sigma 0.36). Further, as a reticle, a mask having a line size=40 nm and a line:space=1:1 was used.

The exposed resist film was post-exposure baked (PEB) at 120° C. for 60 seconds and then developed with butyl acetate for 30 seconds. A line-and-space pattern having a pitch of 80 nm and a line width of 40 nm (space width: 40 nm) was obtained by rotating the silicon wafer at a rotation speed of 4,000 rpm for 30 seconds and baking at 90° C. for 60 seconds.

Furthermore, an optimum exposure dose for forming a line-and-space (LS) pattern with a line width of 40 nm was used as a sensitivity (mJ/cm$^2$). In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Performance Evaluation>

The adhesiveness to a substrate was evaluated by the same evaluation method and evaluation standard as those for KrF exposure.

[Sensitivity]

The same resist composition as each resist composition, except that the resist composition included no amine oxide (P), was separately prepared, and a line-and-space pattern was formed in the same manner as described above. For the obtained isolated space pattern, the sensitivity was determined in the same manner as above. Using the sensitivity of the line-and-space pattern formed of the resist composition including no amine oxide (P) as a standard, how much the sensitivity of the line-and-space pattern formed of a resist composition including the amine oxide (P) was reduced was evaluated according to the following determination standard.

(Determination Standard)

A: The observed sensitivity reduction is less than 1 mJ/cm$^2$

B: The observed sensitivity reduction is 1 mJ/cm$^2$ or more and less than 2 mJ/cm$^2$ C: The observed sensitivity reduction is 2 mJ/cm$^2$ or more and less than 3 mJ/cm$^2$ D: The observed sensitivity reduction is 3 mJ/cm$^2$ or more <Preparation of Actinic Ray-Sensitive or Radiation-Sensitive Resin Composition> (EB Exposure)

Examples 13, 14, 22, 34, and 35

Various components shown in Table 2 were mixed, and the mixture was mixed such that it reached a concentration (% by mass) of solid contents described in Table 2, thereby obtaining a solution. The obtained liquid was filtered through a polytetrafluoroethylene filter having a pore size of 0.03 μm to obtain an actinic ray-sensitive or radiation-sensitive resin composition (resist composition).

Moreover, in the resist composition, the solid contents in the present Examples mean all components other than the solvent and the amine oxide (P).

Furthermore, in the tables, the content (% by mass) of each component other than the solvent means a content ratio with respect to the total solid content. In addition, the content ratio (% by mass) of the solvent used with respect to all solvents is described in the tables.

The content of the amine oxide (P) as a specific additive was measured in the same manner as above.

<Pattern Forming Method (6): EB Exposure, Alkali Development (Positive)>

The resist composition shown in Table 2 was applied onto a 6-inch wafer using a spin coater Mark8 manufactured by Tokyo Electron Limited, and pre-baked (PB) on a hot plate at 110° C. for 90 seconds to obtain a resist film having a film thickness of 80 nm.

This resist film was subjected to patternwise irradiation using an electron beam lithography device (ELS-7500 manufactured by Elionix Co., Ltd., acceleration voltage of 50 KeV). Further, as a reticle, a mask having a line size=100 nm and a line:space=1:1 was used. After irradiation, the film was post-exposure baked (PEB) on a hot plate at 110° C. for 90 seconds, immersed in a 2.38-% by-mass aqueous tetramethylammonium hydroxide solution as a developer for 60 seconds, then rinsed with pure water for 30 seconds, and dried to obtain a line-and-space pattern having a pitch of 200 nm and a line width of 100 nm (space width of 100 nm).

Furthermore, an optimum exposure dose for forming a line-and-space (LS) pattern with a line width of 100 nm was used as a sensitivity (μC/cm$^2$). In determination of the sensitivity, a scanning electron microscope (SEM) (9380II manufactured by Hitachi High-Technologies Corporation) was used to measure a space width of the pattern.

According to the procedure, a pattern wafer for evaluation, having a substrate and a pattern formed on a surface of the substrate, was obtained.

<Performance Evaluation>

The adhesiveness to a substrate was evaluated by the same evaluation method and evaluation standard as those for KrF exposure.

[Sensitivity]

The same resist composition as each resist composition, except that the resist composition included no amine oxide (P), was separately prepared, and a line-and-space pattern was formed in the same manner as described above. For the obtained isolated space pattern, the sensitivity was determined in the same manner as above. Using the sensitivity of the line-and-space pattern formed of the resist composition including no amine oxide (P) as a standard, how much the sensitivity of the line-and-space pattern formed of a resist composition including the amine oxide (P) was reduced was evaluated according to the following determination standard.

(Determination Standard)

A: The observed sensitivity reduction is less than 1 μC/cm²

B: The observed sensitivity reduction is 1 μC/cm² or more and less than 2 μC/cm²

C: The observed sensitivity reduction is 2 μC/cm² or more and less than 3 μC/cm²

D: The observed sensitivity reduction is 3 μC/cm² or more

The obtained evaluation results are shown in Table 3.

TABLE 2

| Example | Amine oxide (P) Type | Amine oxide (P) Content (ppm) | Mass ratio of acid diffusion control agent (D) to amine oxide (P) | Resin (A) Type | Resin (A) Content (% by mass) | Acid generator Type | Acid generator Content (% by mass) | Acid diffusion control agent (D) Type | Acid diffusion control agent (D) Content (% by mass) | Surfactant Type | Surfactant Content (% by mass) |
|---|---|---|---|---|---|---|---|---|---|---|---|
| Example 1 | AE-1 | 500 | 1.6 | A-1 | 96.85 | C-1 | 2.90 | D-1 | 0.20 | E-1 | 0.05 |
| Example 2 | AE-2 | 20 | 16.5 | A-2 | 97.35 | C-2 | 2.50 | D-2 | 0.10 | E-2 | 0.05 |
| Example 3 | AE-3 | 300 | 1.0 | A-3 | 96.75 | C-3 | 3.10 | D-3 | 0.10 | E-3 | 0.05 |
| Example 4 | AE-4 | 200 | 1.4 | A-4 | 97.40 | C-4 | 2.50 | D-4 | 0.10 | — | — |
| Example 5 | AE-5 | 3 | 110.0 | A-5 | 97.15 | C-5 | 2.70 | D-5 | 0.10 | E-1 | 0.05 |
| Example 6 | AE-6 | 50 | 12.4 | A-6 | 96.65 | C-6 | 3.10 | D-6 | 0.20 | E-3 | 0.05 |
| Example 7 | AE-7 | 250 | 1.1 | A-1 | 97.00 | C-7 | 2.90 | D-7 | 0.10 | — | — |
| Example 8 | AE-8 | 300 | 1.8 | A-7 | 85.35 | C-8 | 9.10 | D-8 | 1.40 | E-3 | 0.05 |
| Example 9 | AE-9 | 400 | 2.1 | A-8 | 86.45 | C-9 | 8.40 | D-9 | 1.90 | E-5 | 0.05 |
| Example 10 | AE-1 | 80 | 10.8 | A-9 | 82.25 | C-8 | 10.10 | D-7 | 2.10 | E-4 | 0.05 |
| Example 11 | AE-2 | 7 | 130.3 | A-10 | 84.15 | C-10 | 13.40 | D-2 | 2.40 | E-4 | 0.05 |
| Example 12 | AE-3 | 90 | 5.7 | A-11 | 82.25 | C-11 | 16.20 | D-7 | 1.50 | E-4 | 0.05 |
| Example 13 | AE-4 | 60 | 9.8 | A-12 | 88.45 | C-12 | 10.10 | D-2 | 1.40 | E-1 | 0.05 |
| Example 14 | AE-5 | 500 | 1.4 | A-13 | 66.25 | C-13 | 13.40 | D-5 | 1.90 | E-2 | 0.05 |
| Example 15 | AE-6 | 200 | 1.7 | A-2 | 97.35 | C-2 | 2.50 | D-2 | 0.10 | E-2 | 0.05 |
| Example 16 | AE-7 | 30 | 9.3 | A-4 | 97.40 | C-4 | 2.50 | D-4 | 0.10 | — | — |
| Example 17 | AE-8 | 0.5 | 1560.0 | A-1 | 96.85 | C-1 | 2.90 | D-1 | 0.20 | E-1 | 0.05 |
| Example 18 | AE-9 | 70 | 4.7 | A-5 | 97.15 | C-5 | 2.70 | D-5 | 0.10 | E-1 | 0.05 |
| Example 19 | AE-1 | 0.09 | 9500.0 | A-8 | 86.45 | C-9 | 8.40 | D-8 | 1.90 | E-5 | 0.05 |
| Example 20 | AE-2 | 70 | 12.3 | A-9 | 82.25 | C-8 | 10.10 | D-7 | 2.10 | E-4 | 0.05 |
| Example 21 | AE-3 | 0.06 | 8500.0 | A-11 | 82.25 | C-11 | 16.20 | D-7 | 1.50 | E-4 | 0.05 |
| Example 22 | AE-4 | 400 | 1.5 | A-12 | 88.45 | C-12 | 10.10 | D-2 | 1.40 | E-1 | 0.05 |
| Example 23 | AE-5 | 600 | 1.3 | A-1 | 96.85 | C-1 | 2.90 | D-1 | 0.20 | E-1 | 0.05 |
| Example 24 | AE-6 | 50 | 6.6 | A-2 | 97.35 | C-2 | 2.50 | D-2 | 0.10 | E-2 | 0.05 |
| Example 25 | AE-7 | 0.3 | 1033.3 | A-3 | 96.75 | C-3 | 3.10 | D-3 | 0.10 | E-3 | 0.05 |
| Example 26 | AE-8 | 1 | 280.0 | A-4 | 97.40 | C-4 | 2.50 | D-4 | 0.10 | — | — |
| Example 27 | AE-9 | 200 | 1.7 | A-5 | 97.15 | C-5 | 2.70 | D-5 | 0.10 | E-1 | 0.05 |
| Example 28 | AE-1 | 3 | 206.7 | A-6 | 96.65 | C-6 | 3.10 | D-6 | 0.20 | E-3 | 0.05 |
| Example 29 | AE-2 | 200 | 1.4 | A-1 | 97.00 | C-7 | 2.90 | D-1 | 0.10 | — | — |
| Example 30 | AE-3 | 500 | 1.1 | A-7 | 85.35 | C-8 | 9.10 | D-7 | 1.40 | E-3 | 0.05 |
| Example 31 | AE-4 | 800 | 1.1 | A-8 | 86.45 | C-9 | 8.40 | D-8 | 1.90 | E-5 | 0.05 |
| Example 32 | AE-5 | 30 | 30.4 | A-10 | 84.15 | C-10 | 13.40 | D-2 | 2.40 | E-4 | 0.05 |
| Example 33 | AE-6 | 7 | 72.9 | A-11 | 82.25 | C-11 | 16.20 | D-7 | 1.50 | E-4 | 0.05 |
| Example 34 | AE-1/AE-3 | 4/3 | 84.0 | A-12 | 88.45 | C-12 | 10.10 | D-2 | 1.40 | E-1 | 0.05 |
| Example 35 | AE-2/AE-4 | 220/50 | 2.5 | A-13 | 66.25 | C-13 | 13.40 | D-5 | 1.90 | E-2 | 0.05 |
| Example 36 | AE-6/AE-7 | 10/230 | 1.4 | A-2 | 97.35 | C-2 | 2.50 | D-2 | 0.10 | E-2 | 0.05 |
| Example 37 | AE-10 | 70 | 4.7 | A-4 | 97.15 | C-5 | 2.70 | D-5 | 0.10 | E-1 | 0.05 |
| Example 38 | AE-11 | 3 | 40.0 | A-14 | 98.12 | C-14 | 1.80 | D-9 | 0.03 | E-1 | 0.05 |
| Example 39 | AE-11 | 5 | 24.0 | A-15 | 98.12 | C-15 | 1.80 | D-9 | 0.03 | E-1 | 0.05 |
| Example 40 | AE-11 | 4 | 30.0 | A-16 | 98.12 | C-15 | 1.80 | D-9 | 0.03 | E-1 | 0.05 |
| Example 41 | AE-11 | 3 | 40.0 | A-17 | 98.12 | C-15 | 1.80 | D-9 | 0.03 | E-1 | 0.05 |
| Example 42 | AE-3 | 8 | 38.8 | A-3 | 98.05 | C-1 | 1.80 | D-3 | 0.10 | E-3 | 0.05 |
| Example 43 | AE-4 | 4 | 100.0 | A-2 | 98.05 | C-2 | 1.80 | D-4 | 0.10 | E-2 | 0.05 |
| Example 44 | AE-12 | 2 | 390.0 | A-1 | 96.85 | C-4 | 2.90 | D-2 | 0.20 | E-1 | 0.05 |
| Comparative Example 1 | | | | A-1 | 96.85 | C-1 | 2.90 | D-1 | 0.20 | E-1 | 0.05 |
| Comparative Example 2 | AE-1 | 80 | | A-5 | 97.25 | C-5 | 2.70 | | | E-1 | 0.05 |
| Comparative Example 3 | AE-4 | 0.005 | 156,000.0 | A-1 | 96.85 | C-1 | 2.90 | D-1 | 0.20 | E-1 | 0.05 |
| Comparative Example 4 | AE-5 | 1100 | 0.3 | A-2 | 97.35 | C-2 | 2.50 | D-2 | 0.10 | E-2 | 0.05 |
| Comparative Example 5 | AE-3 | 330 | 0.9 | A-3 | 96.75 | C-3 | 3.10 | D-3 | 0.10 | E-3 | 0.05 |
| Comparative Example 6 | AE-7 | 0.03 | 10,333.3 | A-3 | 96.75 | C-3 | 3.10 | D-3 | 0.10 | E-3 | 0.05 |

TABLE 2-continued

| Example | | | | | | | | | | | | |
|---|---|---|---|---|---|---|---|---|---|---|---|---|
| Example 45 | AE-13 | 20 | 16.5 | A-2 | 97.35 | C-2 | 2.50 | D-2 | 0.10 | E-2 | 0.05 |
| Example 46 | AE-14 | 3 | 110.0 | A-5 | 97.15 | C-5 | 2.70 | D-5 | 0.10 | E-1 | 0.05 |
| Example 47 | AE-15 | 50 | 12.4 | A-6 | 96.65 | C-6 | 3.10 | D-6 | 0.20 | E-3 | 0.05 |
| Example 48 | AE-16 | 0.3 | 1,033.3 | A-3 | 96.75 | C-3 | 3.10 | D-3 | 0.10 | E-3 | 0.05 |
| Example 49 | AE-17 | 1 | 280.0 | A-4 | 97.40 | C-4 | 2.50 | D-4 | 0.10 | — | — |
| Example 50 | AE-18 | 3 | 206.7 | A-6 | 96.65 | C-6 | 3.10 | D-6 | 0.20 | E-3 | 0.05 |
| Example 51 | AE-19 | 30 | 9.3 | A-4 | 97.40 | C-4 | 2.50 | D-4 | 0.10 | — | — |
| Example 52 | AE-20 | 70 | 4.7 | A-5 | 97.15 | C-5 | 2.70 | D-5 | 0.10 | E-1 | 0.05 |
| Example 53 | AE-21 | 50 | 6.6 | A-2 | 97.35 | C-2 | 2.50 | D-2 | 0.10 | E-2 | 0.05 |
| Example 54 | AE-7 | 20 | 16.5 | A-2 | 97.35 | C-2 | 2.50 | D-10 | 0.10 | E-2 | 0.05 |
| Example 55 | AE-9 | 3 | 110.0 | A-5 | 97.15 | C-5 | 2.70 | D-11 | 0.10 | E-1 | 0.05 |
| Example 56 | AE-10 | 50 | 12.4 | A-6 | 96.65 | C-6 | 3.10 | D-12 | 0.20 | E-3 | 0.05 |
| Example 57 | AE-11 | 0.5 | 1,560.0 | A-1 | 96.85 | C-1 | 2.90 | D-13 | 0.20 | E-1 | 0.05 |
| Example 58 | AE-15 | 0.3 | 1,033.3 | A-3 | 96.75 | C-3 | 3.10 | D-14 | 0.10 | E-3 | 0.05 |
| Example 59 | AE-16 | 1 | 280.0 | A-4 | 97.40 | C-4 | 2.50 | D-15 | 0.10 | — | — |
| Example 60 | AE-21 | 3 | 40.0 | A-14 | 98.12 | C-14 | 1.80 | D-16 | 0.03 | E-1 | 0.05 |

| | Hydrophobic resin | | Crosslinking agent | | Solvent | | Concentration of |
|---|---|---|---|---|---|---|---|
| Example | Type | Content (% by mass) | Type | Content (% by mass) | Solvent | Mass ratio | solid contents (% by mass) |
| Example 1 | — | — | — | — | S-1/S-2 | 60/40 | 39.0 |
| Example 2 | — | — | — | — | S-1 | 100 | 33.0 |
| Example 3 | — | — | — | — | S-1/S-2 | 80/20 | 31.0 |
| Example 4 | — | — | — | — | S-1/S-5 | 50/50 | 28.0 |
| Example 5 | — | — | — | — | S-1/S-2 | 70/30 | 33.0 |
| Example 6 | — | — | — | — | S-1/S-3 | 80/20 | 31.0 |
| Example 7 | — | — | — | — | S-5/S-6 | 60/40 | 28.0 |
| Example 8 | F-1 | 4.10 | — | — | S-1/S-4 | 60/40 | 3.9 |
| Example 9 | F-2 | 3.20 | — | — | S-1 | 100 | 4.5 |
| Example 10 | F-1 | 5.50 | — | — | S-1/S-2 | 80/20 | 4.1 |
| Example 11 | — | — | — | — | S-1/S-2 | 80/20 | 3.8 |
| Example 12 | — | — | — | — | S-1/S-2 | 80/20 | 3.4 |
| Example 13 | — | — | — | — | S-1/S-2 | 80/20 | 4.2 |
| Example 14 | — | — | G-1 | 18.40 | S-5/S-6 | 60/40 | 3.6 |
| Example 15 | — | — | — | — | S-1 | 100 | 33.0 |
| Example 16 | — | — | — | — | S-1/S-5 | 50/50 | 28.0 |
| Example 17 | — | — | — | — | S-1/S-2 | 60/40 | 39.0 |
| Example 18 | — | — | — | — | S-1/S-2 | 70/30 | 33.0 |
| Example 19 | F-2 | 3.20 | — | — | S-1 | 100 | 4.5 |
| Example 20 | F-1 | 5.50 | — | — | S-1/S-2 | 80/20 | 4.1 |
| Example 21 | — | — | — | — | S-1/S-2 | 80/20 | 3.4 |
| Example 22 | — | — | — | — | S-1/S-2 | 80/20 | 4.2 |
| Example 23 | — | — | — | — | S-1/S-2 | 60/40 | 39.0 |
| Example 24 | — | — | — | — | S-1 | 100 | 33.0 |
| Example 25 | — | — | — | — | S-1/S-2 | 80/20 | 31.0 |
| Example 26 | — | — | — | — | S-1/S-5 | 50/50 | 28.0 |
| Example 27 | — | — | — | — | S-1/S-2 | 70/30 | 33.0 |
| Example 28 | — | — | — | — | S-1/S-3 | 80/20 | 31.0 |
| Example 29 | — | — | — | — | S-5/S-6 | 60/40 | 28.0 |
| Example 30 | F-1 | 4.10 | — | — | S-1/S-2 | 60/40 | 3.9 |
| Example 31 | F-2 | 3.20 | — | — | S-1 | 100 | 4.5 |
| Example 32 | — | — | — | — | S-1/S-2 | 80/20 | 3.8 |
| Example 33 | — | — | — | — | S-1/S-8 | 80/20 | 3.4 |
| Example 34 | — | — | — | — | S-1/S-2 | 80/20 | 4.2 |
| Example 35 | — | — | G-1 | 18.40 | S-5/S-6 | 60/40 | 3.6 |
| Example 36 | — | — | — | — | S-1 | 100 | 33.0 |
| Example 37 | — | — | — | — | S-1/S-7 | 70/30 | 33.0 |
| Example 38 | — | — | — | — | S-1/S-2 | 50/50 | 40.0 |
| Example 39 | — | — | — | — | S-1/S-2 | 50/50 | 40.0 |
| Example 40 | — | — | — | — | S-1/S-2 | 50/50 | 40.0 |
| Example 41 | — | — | — | — | S-1/S-2 | 50/50 | 40.0 |
| Example 42 | — | — | — | — | S-1/S-2 | 50/50 | 31.0 |
| Example 43 | — | — | — | — | S-1/S-2 | 50/50 | 40.0 |
| Example 44 | — | — | — | — | S-1/S-5 | 50/50 | 39.0 |
| Comparative Example 1 | — | — | — | — | S-1/S-2 | 60/40 | 39.0 |
| Comparative Example 2 | — | — | — | — | S-1/S-2 | 70/30 | 33.0 |
| Comparative Example 3 | — | — | — | — | S-1/S-2 | 60/40 | 39.0 |
| Comparative Example 4 | — | — | — | — | S-1 | 100 | 33.0 |
| Comparative Example 5 | — | — | — | — | S-1/S-2 | 80/20 | 31.0 |
| Comparative Example 6 | — | — | — | — | S-1/S-2 | 80/20 | 31.0 |

TABLE 2-continued

| Example | | | | | | | |
|---|---|---|---|---|---|---|---|
| Example 45 | — | — | — | — | S-1 | 100 | 33.0 |
| Example 46 | — | — | — | — | S-1/S-2 | 70/30 | 33.0 |
| Example 47 | — | — | — | — | S-1/S-3 | 80/20 | 31.0 |
| Example 48 | — | — | — | — | S-1/S-2 | 80/20 | 31.0 |
| Example 49 | — | — | — | — | S-1/S-5 | 50/50 | 28.0 |
| Example 50 | — | — | — | — | S-1/S-3 | 80/20 | 31.0 |
| Example 51 | — | — | — | — | S-1/S-5 | 50/50 | 28.0 |
| Example 52 | — | — | — | — | S-1/S-2 | 70/30 | 33.0 |
| Example 53 | — | — | — | — | S-1 | 100 | 33.0 |
| Example 54 | — | — | — | — | S-1 | 100 | 33.0 |
| Example 55 | — | — | — | — | S-1/S-2 | 70/30 | 33.0 |
| Example 56 | — | — | — | — | S-1/S-3 | 80/20 | 31.0 |
| Example 57 | — | — | — | — | S-1/S-2 | 60/40 | 39.0 |
| Example 58 | — | — | — | — | S-1/S-2 | 80/20 | 31.0 |
| Example 59 | — | — | — | — | S-1/S-5 | 50/50 | 28.0 |
| Example 60 | — | — | — | — | S-1/S-2 | 50/50 | 40.0 |

TABLE 3

| | | Evaluation | |
|---|---|---|---|
| Example | Evaluation method | Adhesiveness to substrate | Sensitivity |
| Example 1 | KrF | C | C |
| Example 2 | KrF | A | A |
| Example 3 | KrF | C | C |
| Example 4 | KrF | C | C |
| Example 5 | KrF | A | A |
| Example 6 | KrF | A | A |
| Example 7 | KrF | C | C |
| Example 8 | ArF-Positive | C | C |
| Example 9 | ArF-Positive | C | C |
| Example 10 | ArF-Negative | B | B |
| Example 11 | EUV-Positive | A | A |
| Example 12 | EUV-Negative | B | B |
| Example 13 | EB | B | B |
| Example 14 | EB | C | C |
| Example 15 | KrF | C | C |
| Example 16 | KrF | B | B |
| Example 17 | KrF | A | A |
| Example 18 | KrF | B | B |
| Example 19 | ArF-Positive | B | B |
| Example 20 | ArF-Negative | C | C |
| Example 21 | EUV-Negative | B | B |
| Example 22 | EB | C | C |
| Example 23 | KrF | C | C |
| Example 24 | KrF | B | B |
| Example 25 | KrF | A | A |
| Example 26 | KrF | A | A |
| Example 27 | KrF | C | C |
| Example 28 | KrF | A | A |
| Example 29 | KrF | C | C |
| Example 30 | ArF-Positive | C | C |
| Example 31 | ArF-Positive | C | C |
| Example 32 | EUV-Positive | B | B |
| Example 33 | EUV-Negative | A | A |
| Example 34 | EB | A | A |
| Example 35 | EB | C | C |
| Example 36 | KrF | C | C |
| Example 37 | KrF | B | B |
| Example 38 | KrF | A | A |
| Example 39 | KrF | A | A |
| Example 40 | KrF | A | A |
| Example 41 | KrF | A | A |
| Example 42 | KrF | A | A |
| Example 43 | KrF | A | A |
| Example 44 | KrF | A | A |
| Comparative Example 1 | KrF | D | A |
| Comparative Example 2 | KrF | A | * Poor resolution due to occurrence of abnormality in cross-sectional shapes |
| Comparative Example 3 | KrF | D | A |
| Comparative Example 4 | KrF | A | D |
| Comparative Example 5 | KrF | D | D |
| Comparative Example 6 | KrF | D | D |
| Example 45 | KrF | A | A |
| Example 46 | KrF | A | A |
| Example 47 | KrF | A | A |
| Example 48 | KrF | A | A |
| Example 49 | KrF | A | A |
| Example 50 | KrF | A | A |
| Example 51 | KrF | B | B |
| Example 52 | KrF | B | B |
| Example 53 | KrF | B | B |
| Example 54 | KrF | A | A |
| Example 55 | KrF | A | A |
| Example 56 | KrF | A | A |
| Example 57 | KrF | A | A |
| Example 58 | KrF | A | A |
| Example 59 | KrF | A | A |
| Example 60 | KrF | A | A |

From the results in Table 3, it can be seen that the composition of the embodiment of the present invention makes it possible to achieve an excellent adhesiveness between a resist film and a substrate while suppressing a sensitivity reduction.

What is claimed is:

1. An actinic ray-sensitive or radiation-sensitive resin composition comprising:
   (A) a resin having a polarity that increases by an action of an acid;
   (B) a photoacid generator;
   (P) an amine oxide; and
   (D) an acid diffusion control agent provided that acid diffusion control agents corresponding to the amine oxide are excluded,
   wherein a content of the amine oxide (P) is from 0.01 ppm to 10 ppm with respect to a total mass of the actinic ray-sensitive or radiation-sensitive resin composition,
   a mass ratio of the acid diffusion control agent (D) to the amine oxide (P), represented by the following expression, is more than 1 and 10,000 or less, Mass ratio=(Content of acid diffusion control agent (D))/(Content of amine oxide (P)), and the amine oxide (P) is selected from the group consisting of a compound represented by General Formula (1), a compound represented by General Formula (2), a compound represented by General Formula (3), a compound represented by General Formula (4), a compound represented by General Formula (5), and a compound represented by General Formula (6),

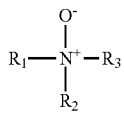
(1)

wherein in Formula (1), $R_1$, $R_2$, and $R_3$ are each independently a hydrogen atom, an alkyl group, a cycloalkyl group, an aryl group, an alkenyl group, or an aralkyl group, and any two of $R_1$, $R_2$, or $R_3$ may be bonded to each other to form a ring structure,

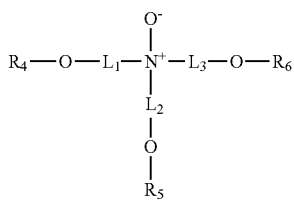
(2)

wherein in Formula (2), $R_4$, $R_5$, and $R_6$ are each independently a hydrogen atom, an unsubstituted alkyl group, a cycloalkyl group, an aryl group, an alkenyl group, or an aralkyl group, and $L_1$, $L_2$, and $L_3$ each independently represent an unsubstituted alkylene group,

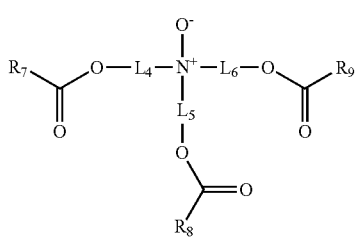
(3)

wherein in Formula (3), $R_7$, $R_8$, and $R_9$ are each independently a hydrogen atom, an alkyl group, a cycloalkyl group, an aryl group, an alkenyl group, or an aralkyl group, and $L_4$, $L_5$, and $L_6$ each independently represent a divalent linking group,

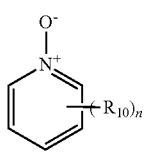
(4)

wherein in Formula (4), $R_{10}$ is an alkyl group, a cycloalkyl group, an aryl group, or an alkenyl group, n represents an integer of 0 to 5, and in a case where n represents an integer of 2 or more, a plurality of $R_{10}$'s may be the same as or different from each other,

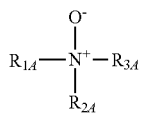
(5)

wherein in the formula, $R_{1A}$, $R_{2A}$, and $R_{3A}$ are each independently an organic group having a heteroatom at a terminal or chain and having 6 or less carbon atoms, and any two of $R_{1A}$, $R_{2A}$, or $R_{3A}$ are bonded to each other to form a ring structure, and

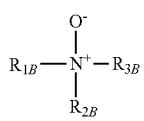
(6)

wherein in Formula (6), $R_{1B}$, $R_{2B}$, and $R_{3B}$ are each independently an unsubstituted alkyl group, a cycloalkyl group, an aryl group, an alkenyl group, or an aralkyl group, provided that the unsubstituted alkyl group is not an unsubstituted alkyl group having 6 or more carbon atoms, and any two of $R_{1B}$, $R_{2B}$, or $R_{3B}$ may be bonded to each other to form a ring structure.

2. The actinic ray-sensitive or radiation-sensitive resin composition according to claim 1,
wherein a content of the amine oxide (P) is from 0.01 ppm to 5 ppm with respect to a total mass of the actinic ray-sensitive or radiation-sensitive resin composition.

3. The actinic ray-sensitive or radiation-sensitive resin composition according to claim 1,
wherein a concentration of solid contents of the composition is 10% by mass or more.

4. The actinic ray-sensitive or radiation-sensitive resin composition according to claim 1,
wherein the acid diffusion control agent (D) is an amine compound, and the amine oxide (P) is an amine oxide obtained by oxidization of a nitrogen atom in an amine moiety of the acid diffusion control agent (D).

5. The actinic ray-sensitive or radiation-sensitive resin composition according to claim 1, further comprising (H) a surfactant.

6. An actinic ray-sensitive or radiation-sensitive film formed of the actinic ray-sensitive or radiation-sensitive resin composition according to claim 1.

7. A pattern forming method comprising:
exposing the actinic ray-sensitive or radiation-sensitive film according to claim 6; and
developing the exposed actinic ray-sensitive or radiation-sensitive film, using a developer.

8. The actinic ray-sensitive or radiation-sensitive resin composition according to claim 1,
wherein a mass ratio of the acid diffusion control agent (D) to the amine oxide (P) defined in the following expression is 5 to 10,000:

Mass ratio=(Content of acid diffusion control agent (D))/(Content of amine oxide (P)).

9. The actinic ray-sensitive or radiation-sensitive resin composition according to claim 1,
wherein the mass ratio of the acid diffusion control agent (D) to the amine oxide (P) defined in the following expression is more than 1 and 5,000 or less:

Mass ratio=(Content of acid diffusion control agent $(D)$)/(Content of amine oxide $(P)$).

\* \* \* \* \*